US012698302B2

(12) United States Patent
Lee et al.

(10) Patent No.: US 12,698,302 B2
(45) Date of Patent: Aug. 4, 2026

(54) LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

(71) Applicant: Samsung Display Co., Ltd., Yongin-si (KR)

(72) Inventors: Jaesung Lee, Yongin-si (KR); Soobyung Ko, Yongin-si (KR); Sungbum Kim, Yongin-si (KR); Sujin Shin, Yongin-si (KR); Eunyoung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 926 days.

(21) Appl. No.: 18/058,217

(22) Filed: Nov. 22, 2022

(65) Prior Publication Data

US 2023/0159577 A1 May 25, 2023

(30) Foreign Application Priority Data

Nov. 22, 2021 (KR) ........................ 10-2021-0161488

(51) Int. Cl.
*C07F 15/00* (2006.01)
*C07F 1/08* (2006.01)
(Continued)

(52) U.S. Cl.
CPC ............ *C07F 15/0086* (2013.01); *C07F 1/08* (2013.01); *C07F 15/0033* (2013.01); *C07F 15/006* (2013.01); *C07F 15/0073* (2013.01); *H10K 50/11* (2023.02); *H10K 85/341* (2023.02); *H10K 85/342* (2023.02); *H10K 85/346* (2023.02);
(Continued)

(58) Field of Classification Search
None
See application file for complete search history.

(56) References Cited

U.S. PATENT DOCUMENTS

| | | | |
|---|---|---|---|
| 7,285,341 | B2 | 10/2007 | Zheng et al. |
| 9,108,998 | B2 | 8/2015 | Molt et al. |

(Continued)

FOREIGN PATENT DOCUMENTS

| | | | |
|---|---|---|---|
| CN | 107892704 | A | 4/2018 |
| JP | 2001-172232 | A | 6/2001 |

(Continued)

OTHER PUBLICATIONS

Wu et al., "An Overview Of Phosphorescent Metallomesogens Based On Platinum And Iridium", Journal of Materials Chemistry C (2018) vol. 6, Royal Society of Chemistry, pp. 9848-9860; DOI: 10.1039/C8TC02996B (12 pages).

*Primary Examiner* — Chanceity N Robinson
(74) *Attorney, Agent, or Firm* — Womble Bond Dickinson (US) LLP

(57) ABSTRACT

An organometallic compound represented by Formula I is provided. A light-emitting device including the organometallic compound of Formula I is also provided. An electronic apparatus including the light-emitting device is further provided. In embodiments, the organometallic compound is included in at least one layer of the device, and the device may be an organic light-emitting device.

20 Claims, 3 Drawing Sheets

10

(51) Int. Cl.
*H10K 50/11* (2023.01)
*H10K 85/30* (2023.01)

(52) U.S. Cl.
CPC ......... *H10K 85/361* (2023.02); *H10K 85/371* (2023.02); *C07B 2200/05* (2013.01)

(56) References Cited

U.S. PATENT DOCUMENTS

| | | | |
|---|---|---|---|
| 10,323,053 | B2 | 6/2019 | Li et al. |
| 2007/0106103 | A1 | 5/2007 | Ikeda et al. |
| 2014/0058099 | A1 | 2/2014 | Wakamiya et al. |
| 2019/0153308 | A1 | 5/2019 | Li et al. |
| 2020/0144513 | A1 | 5/2020 | Hatakeyama et al. |
| 2020/0283463 | A1 | 9/2020 | Lee et al. |
| 2022/0332741 | A1* | 10/2022 | Lee ...................... H10K 85/361 |

FOREIGN PATENT DOCUMENTS

| | | | |
|---|---|---|---|
| JP | 2005-170911 | A | 6/2005 |
| JP | 2017-212093 | A | 11/2017 |
| KR | 10-2020-0108147 | A | 9/2020 |
| WO | WO 2004-061047 | A2 | 7/2004 |
| WO | WO 2011-107186 | A2 | 9/2011 |
| WO | WO 2012-118164 | A1 | 7/2012 |
| WO | WO 2015-102118 | A1 | 7/2015 |

* cited by examiner

LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

CROSS-REFERENCE TO RELATED APPLICATION

This application claims priority-to and the benefit of Korean Patent Application No. 10-2021-0161488, filed on Nov. 22, 2021, in the Korean Intellectual Property Office, the content of which is hereby incorporated by reference.

BACKGROUND

1. Field

One or more embodiments of the present disclosure relate to a light-emitting device including an organometallic compound, an electronic apparatus including the light-emitting device, and the organometallic compound.

2. Description of the Related Art

Self-emissive devices among light-emitting devices have wide viewing angles, high contrast ratios, short response times, and/or excellent and/or suitable characteristics in terms of luminance, driving voltage, and/or response speed.

In a light-emitting device, a first electrode is arranged on a substrate, and a hole transport region, an emission layer, an electron transport region, and a second electrode are sequentially arranged on the first electrode. Holes provided from the first electrode may move toward the emission layer through the hole transport region, and electrons provided from the second electrode may move toward the emission layer through the electron transport region. Carriers, such as holes and electrons, recombine in such an emission layer region to produce excitons. These excitons transition from an excited state to a ground state to thereby generate light.

SUMMARY

Aspects of embodiments of the present invention are directed toward a light-emitting device including an organometallic compound, an electronic apparatus including the light-emitting device, and the organometallic compound.

Additional aspects of embodiments of the present disclosure will be set forth in part in the description which follows and, in part, will be apparent from the disclosure, or may be learned by practice of the presented embodiments of the disclosure.

According to one or more embodiments, provided is a light-emitting device including a first electrode, a second electrode facing the first electrode, an interlayer arranged between the first electrode and the second electrode and including an emission layer, and an organometallic compound represented by Formula 1

Formula 1

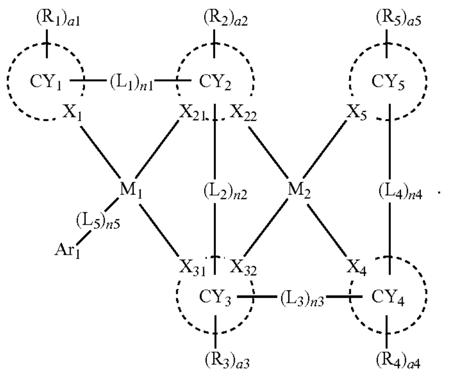

$M_1$ and $M_2$ may each independently be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$ to ring $CY_5$ may each independently be a $C_5$-$C_{30}$ carbocyclic group or a $C_1$-$C_{30}$ heterocyclic group, $X_1$, $X_{21}$, $X_{22}$, $X_{31}$, $X_{32}$, $X_4$, and $X_5$ may each independently be C or N, $L_1$ to $L_5$ may each independently be a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' may each indicate a binding site to a neighboring atom, n1 to n5 may each independently be an integer from 1 to 5, $Ar_1$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$ to $R_5$, $R_{1a}$, and $R_{1b}$ may each independently be hydrogen, deuterium, —F, —Cl, —Br, —I, a hydroxyl group, a cyano group, a nitro group, —SCN, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a5 may each independently be an integer from 0 to 10, $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, a $C_7$-$C_{60}$ aryl alkyl group, a $C_2$-$C_{60}$ heteroaryl alkyl group, or one or more combinations thereof.

According to one or more embodiments, provided is an electronic apparatus including the light-emitting device.

According to one or more embodiments, provided is the organometallic compound represented by Formula 1.

BRIEF DESCRIPTION OF THE DRAWINGS

The above and other aspects; and features of certain embodiments of the disclosure will be more apparent from the following description taken in conjunction with the accompanying drawings, in which.

DETAILED DESCRIPTION

Figure 1:
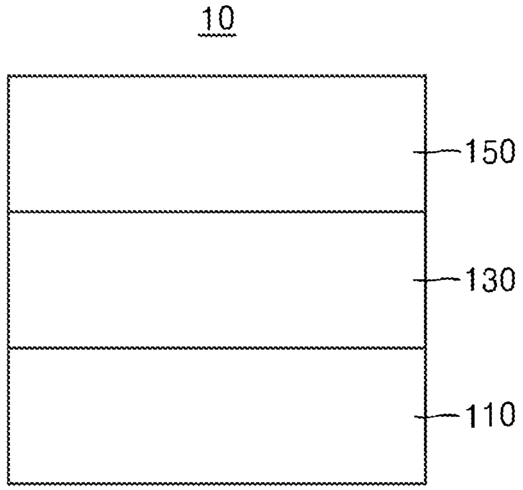
FIG. 1 shows a schematic view of a structure of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described by referring to the drawings, to explain aspects of embodiments of the present disclosure. As used herein, the term "and/or" includes any and all combinations of one or more of the associated listed items. Throughout the disclosure, the expression "one of a, b, or c", "at least one of a, b or c", "one of a to c", or the like indicates only a, only b, only c, both a and b, both a and c, both b and c, all of a, b, and c, or variations thereof.

A light-emitting device may include: a first electrode; a second electrode facing the first electrode; an interlayer arranged between the first electrode and the second electrode and including an emission layer; and an organometallic compound represented by Formula 1:

Formula 1

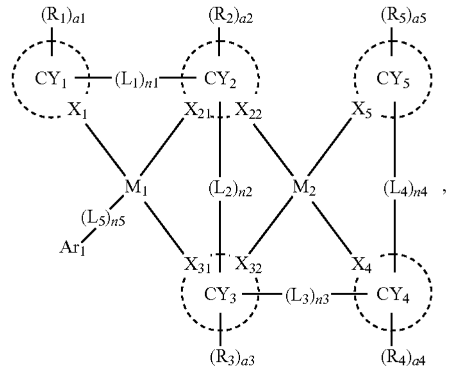

wherein $M_1$ and $M_2$ may each independently be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$ to ring $CY_5$ may each independently be a $C_5$-$C_{30}$ carbocyclic group or a $C_1$-$C_{30}$ heterocyclic group, $X_1$, $X_{21}$, $X_{22}$, $X_{31}$, $X_{32}$, $X_4$, and $X_5$ may each independently be C or N, $L_1$ to $L_5$ may each independently be a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' may each indicate a binding site to a neighboring atom, n1 to n5 may each independently be an integer from 1 to 5, $Ar_1$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$ to $R_5$, $R_{1a}$, and $R_{1b}$ may each independently be hydrogen, deuterium, —F, —Cl, —Br, —I, a hydroxyl group, a cyano group, a nitro group, —SCN, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a5 may each independently be an integer from 0 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof; or Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, a $C_7$-$C_{60}$ aryl alkyl group, a $C_2$-$C_{60}$ heteroaryl alkyl group, or one or more combinations thereof.

In an embodiment, the first electrode may be an anode, the second electrode may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or one or more combinations thereof, and the electron transport region may include a hole blocking layer, an electron transport layer, an electron injection layer, an electron control layer, or one or more combinations thereof.

In an embodiment, the interlayer may include the organometallic compound represented by Formula 1.

In an embodiment, the interlayer may include a first compound represented by Formula 1 and a second compound including a group represented by Formula 2:

Formula 2

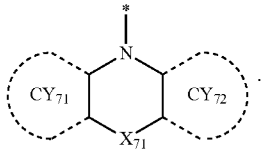

In Formula 2, ring $CY_{71}$ and ring $CY_{72}$ may each independently be a π electron-rich $C_3$-$C_{60}$ cyclic group or a pyridine group, $X_{71}$ may be a single bond, or a linking group including O, S, N, B, C, Si, or one or more combinations thereof, and

* may indicate a binding site to a neighboring atom in the second compound.

In an embodiment, the emission layer may include the organometallic compound represented by Formula 1.

In an embodiment, the emission layer may include a first compound and a second compound, the first compound may be a dopant, and the second compound may be a host.

In an embodiment, the second compound may include a pyridine group, a pyrimidine group, a pyrazine group, a pyridazine group, a triazine group, or one or more combinations thereof.

In an embodiment, an amount of the first compound may be about 0.01 wt % to about 15 wt %, based on 100 wt % of the second compound.

In an embodiment, a thickness of the emission layer may be about 100 Å to about 1,000 Å.

In an embodiment, the emission layer may emit blue light. For example, the emission layer may emit blue light having a maximum emission wavelength of about 410 nm to about 500 nm, about 410 nm to about 480 nm, about 420 nm to about 480 nm, or about 430 nm to about 470 nm.

In an embodiment, an electronic apparatus including the light-emitting device according to embodiments may be provided.

In an embodiment, the electronic apparatus may further include a thin-film transistor, the thin-film transistor may include a source electrode and a drain electrode, and the first electrode of the light-emitting device may be electrically connected to either the source electrode of the thin-film transistor or the drain electrode of the thin-film transistor.

In an embodiment, the electronic apparatus may further include a color filter, a color conversion layer, a touch screen layer, a polarizing layer, or one or more combinations thereof.

In an embodiment, provided is an organometallic compound represented by Formula 1.

Formula 1

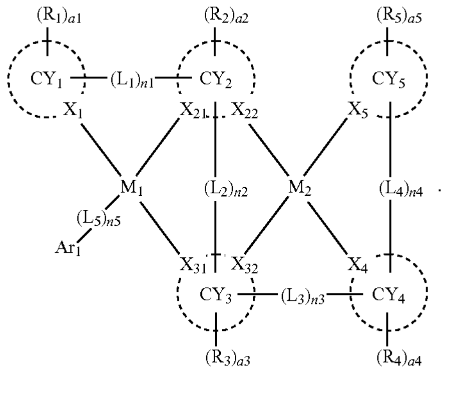

$M_1$ and $M_2$ may each independently be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$ to ring $CY_5$ may each independently be a $C_5$-$C_{30}$ carbocyclic group or a $C_1$-$C_{30}$ heterocyclic group, $X_1$, $X_{21}$, $X_{22}$, $X_{31}$, $X_{32}$, $X_4$, and $X_5$ may each independently be C or N, $L_1$ to $L_5$ may each independently be a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' may each indicate a binding site to a neighboring atom, n1 to n5 may each independently be an integer from 1 to 5, $Ar_1$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$ to $R_5$, $R_{1a}$, and $R_{1b}$ may each independently be hydrogen, deuterium, —F, —Cl, —Br, —I, a hydroxyl group, a cyano group, a nitro group, —SCN, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a5 may each independently be an integer from 0 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, a $C_7$-$C_{60}$ aryl alkyl group, a $C_2$-$C_{60}$ heteroaryl alkyl group, or one or more combinations thereof.

In an embodiment, $M_1$ and $M_2$ may be identical to each other.

In an embodiment, $M_1$ and $M_2$ may each be platinum (Pt).

In an embodiment, $M_1$ and $M_2$ may be different from each other.

In an embodiment, ring $CY_1$ to ring $CY_4$ may each be a 6-membered ring, and ring $CY_5$ may be a 5-membered ring.

In an embodiment, ring $CY_1$ to ring $CY_4$ may each independently be: a benzene group, a pyridine group, a pyrimidine group, a pyrazine group, a pyridazine group, or a triazine group; or a benzene group, a pyridine group, a pyrimidine group, a pyrazine group, a pyridazine group, or a triazine group, each condensed with a benzene group, a pyridine group, a pyrimidine group, a pyrazine group, a pyridazine group, a cyclohexane group, a cyclohexene group, an adamantane group, a norbornane group, a cyclopentane group, a cyclopentene group, a pyrrole group, a pyrazole group, an imidazole group, a triazole group, an oxazole group, an isoxazole group, an oxadiazole group, a thiazole group, an isothiazole group, a thiadiazole group, or one or more combinations thereof.

In an embodiment, ring $CY_5$ may be: a pyrrole group, a pyrazole group, an imidazole group, a triazole group, an oxazole group, an isoxazole group, an oxadiazole group, a thiazole group, an isothiazole group, or thiadiazole group; or a pyrrole group, a pyrazole group, an imidazole group, a triazole group, an oxazole group, an isoxazole group, an oxadiazole group, a thiazole group, an isothiazole group, or a thiadiazole group, each condensed with a benzene group, a pyridine group, a pyrimidine group, a pyrazine group, a pyridazine group, a cyclopentane group, a cyclopentene group, a pyrrole group, a pyrazole group, an imidazole group, a triazole group, an oxazole group, an isoxazole group, an oxadiazole group, a thiazole group, an isothiazole group, a thiadiazole group, or one or more combinations thereof.

In an embodiment, $X_5$ may be C, and a bond between $X_5$ and $M_2$ may be a coordinate bond. For example, $X_5$ may be a carbon of a carbene moiety.

In an embodiment, $X_1$ may be C and a covalent bond may be formed between $X_1$ and $M_1$, $X_{21}$ may be C and a covalent bond may be formed between $X_{21}$ and $M_1$, and $X_{31}$ may be C and a covalent bond may be formed between $X_{31}$ and $M_1$.

In an embodiment, $X_{22}$ may be C or N and a covalent bond may be formed between $X_{22}$ and $M_2$, $X_{32}$ may be C and a covalent bond may be formed between $X_{32}$ and $M_2$, $X_4$ may be C and a covalent bond may be formed between $X_4$ and $M_2$, and $X_5$ may be C and a coordinate bond may be formed between $X_5$ and $M_2$. For example, $X_5$ may be a carbon of a carbene moiety.

In an embodiment, $L_5$ may be *—C≡C—*', and n5 may be 1.

In an embodiment, $L_1$, $L_2$, and $L_4$ may each be a single bond, $L_3$ may be *—N($R_{1a}$)—*', *—O—*', or *—S—*', * and *' may each indicates a binding site to a neighboring atom, and $R_{1a}$ may be the same as described in connection with Formula 1.

In an embodiment, $Ar_1$ may be a $C_1$-$C_{60}$ nitrogen-containing heterocyclic group unsubstituted or substituted with at least one $R_{10a}$, and an atom bonded to $L_5$ in $Ar_1$ may be N. For example, an electron density and multiple bonding properties may be further increased by an unshared electron pair of N included in $Ar_1$.

In an embodiment, at least one of Conditions 1 to 5 may be satisfied:

Condition 1 a group represented by

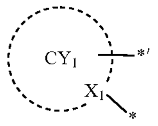

in Formula 1 is represented by one of Formulae CY1-1 to CY1-24:

CY1-1

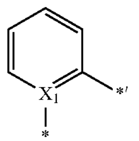

CY1-2

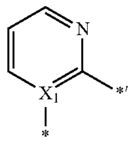

-continued

CY1-3

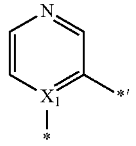

CY1-4

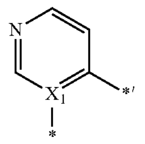

CY1-5

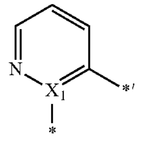

CY1-6

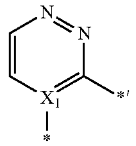

CY1-7

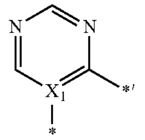

CY1-8

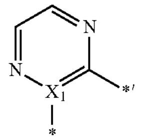

CY1-9

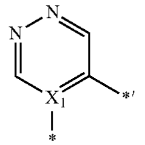

CY1-10

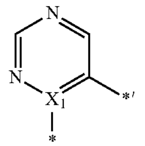

CY1-11

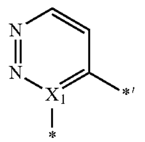

CY1-12

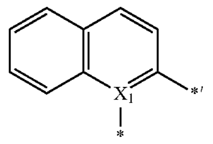

-continued
CY1-13
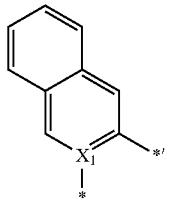
CY1-14
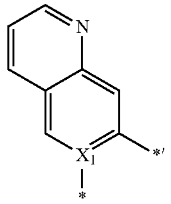
CY1-15
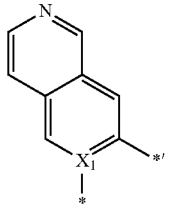
CY1-16
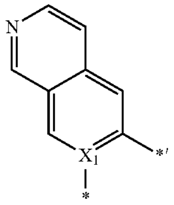
CY1-17
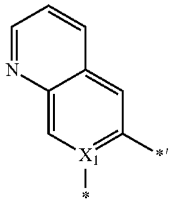
CY1-18
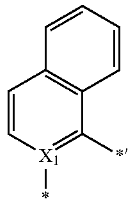
CY1-19
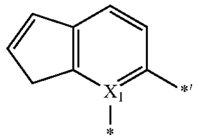
CY1-20
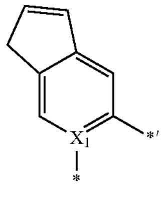
-continued
CY1-21
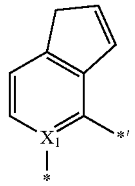
CY1-22
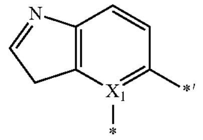
CY1-23
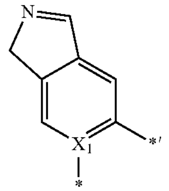
CY1-24
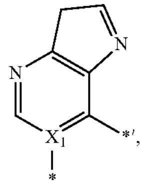
wherein, in Formulae CY1-1 to CY1-24,
$X_1$ is the same as described in connection with Formula 1,
* is a binding site to $M_1$, and
*' is a binding site to $L_1$;
Condition 2
a group represented by
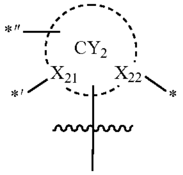
in Formula 1 is represented by one of Formulae CY2-1 to CY2-12:
CY2-1
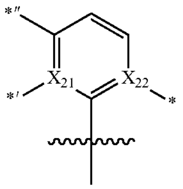

-continued
CY2-2
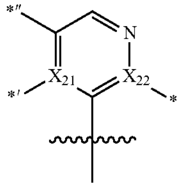
CY2-3
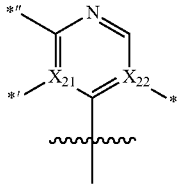
CY2-4
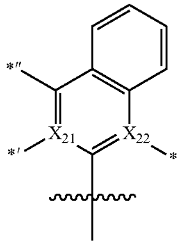
CY2-5
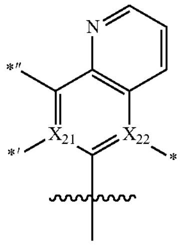
CY2-6
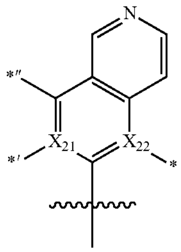
CY2-7
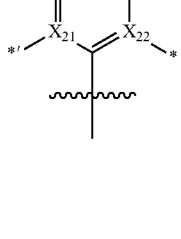
-continued
CY2-8
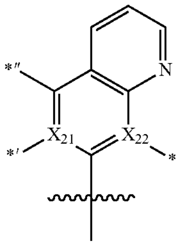
CY2-9
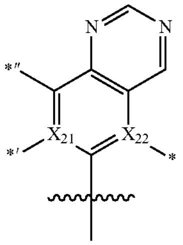
CY2-10
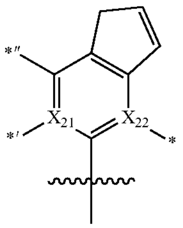
CY2-11
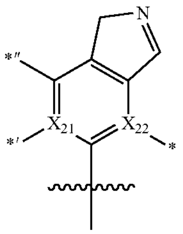
CY2-12
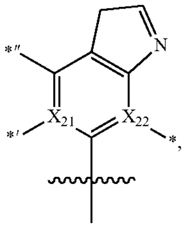
wherein, in Formulae CY2-1 to CY2-12,
$X_{21}$ and $X_{22}$ are respectively the same as those described in connection with Formula 1,
* indicates a binding site to $M_2$, and
*' indicates a binding site to $M_1$,
*" indicates a binding site to $L_1$, and
∿∿∿ indicates a binding site to $L_2$;

Condition 3
a group represented by
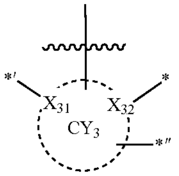
in Formula 1 is represented by one of Formulae CY3-1 to CY3-12:
CY3-1
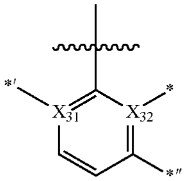
CY3-2
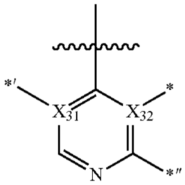
CY3-3
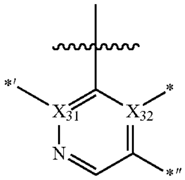
CY3-4
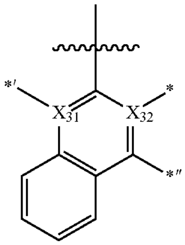
CY3-5
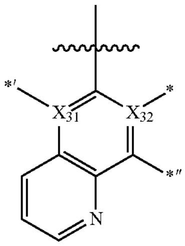
-continued
CY3-6
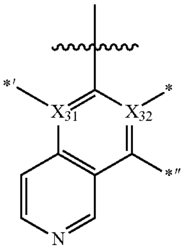
CY3-7
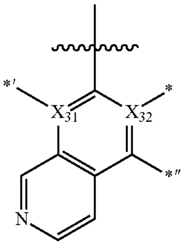
CY3-8
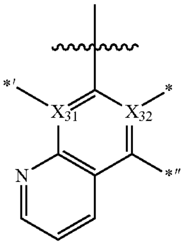
CY3-9
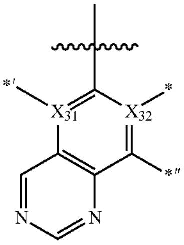
CY3-10
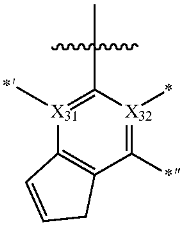
CY3-11
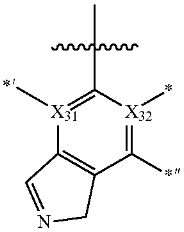

-continued

CY3-12

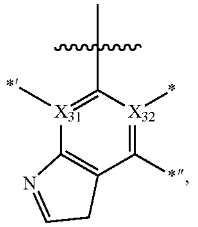

wherein, in Formulae CY3-1 to CY3-12, $X_{31}$ and $X_{32}$ are respectively the same as those described in connection with Formula 1,

* indicates a binding site to $M_2$, and

*' indicates a binding site to $M_1$,

*" indicates a binding site to $L_3$, and indicates a binding site to $L_2$;

Condition 4 a group represented by

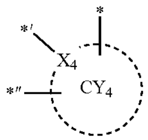

in Formula 1 is represented by one of Formulae CY4-1 to CY4-16:

CY4-1

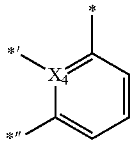

CY4-2

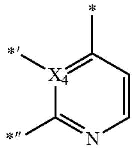

CY4-3

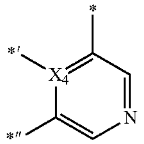

CY4-4

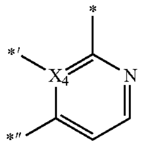

CY4-5

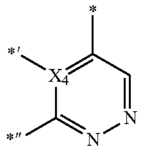

-continued

CY4-6

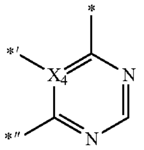

CY4-7

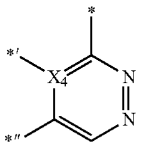

CY4-8

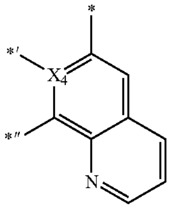

CY4-9

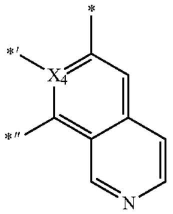

CY4-10

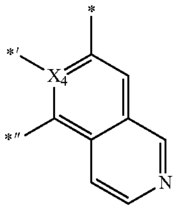

CY4-11

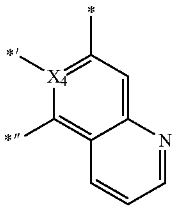

CY4-12

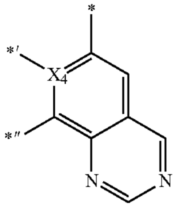

CY4-13

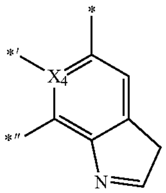

-continued
CY4-14
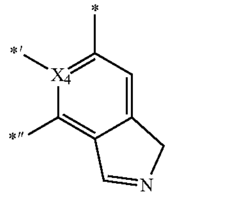
CY4-15
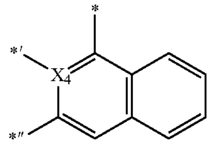
CY4-16
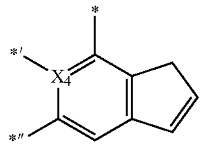,
wherein, in Formulae CY4-1 to CY4-16,
$X_4$ is the same as described in connection with Formula 1,
* indicates a binding site to $L_4$,
*' indicates a binding site to $M_2$, and
*" indicates a binding site to $L_3$; and
Condition 5
a group represented by
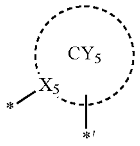
in Formula 1 is represented by one of Formulae CY5-1 to CY5-22:
CY5-1
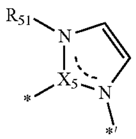
CY5-2
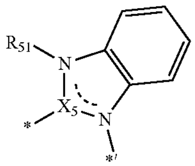
CY5-3
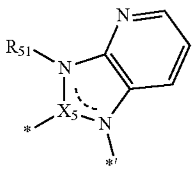
-continued
CY5-4
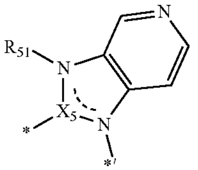
CY5-5
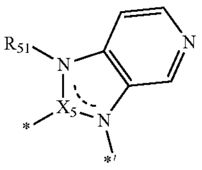
CY5-6
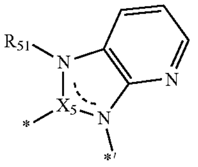
CY5-7
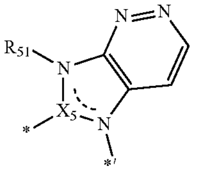
CY5-8
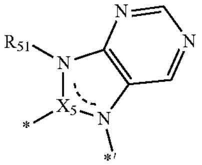
CY5-9
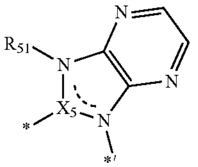
CY5-10
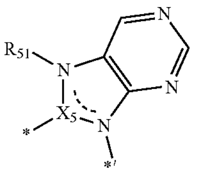
CY5-11
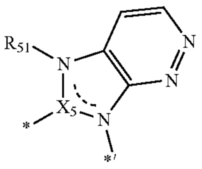
CY5-12
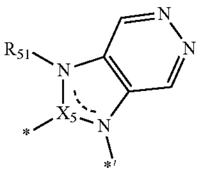

-continued

CY5-13

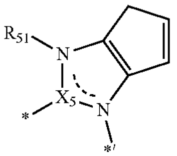

CY5-14

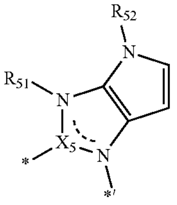

CY5-15

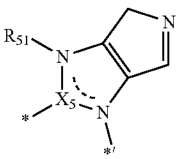

CY5-16

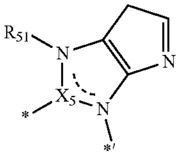

CY5-17

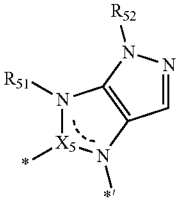

CY5-18

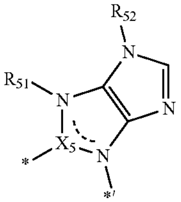

CY5-19

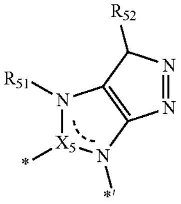

CY5-20

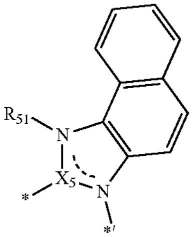

-continued

CY5-21

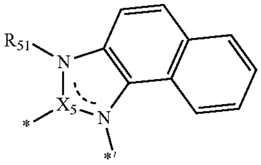

CY5-22

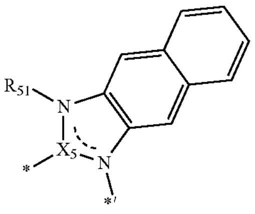

, wherein, in Formulae CY5-1 to CY5-22, $X_5$ is the same as described in connection with Formula 1, $R_{51}$ and $R_{52}$ each independently be the same as $R_5$ described in connection with Formula 1,

* indicates a binding site to $M_2$, and

*' indicates a binding site to $L_4$.

In an embodiment, $L_5$ may be *—C($R_{1a}$)=C($R_{1b}$)—*' or *—C≡C—*', * and *' in $L_5$ may each indicate a binding site to a neighboring atom, and $Ar_1$ may be a group represented by Formula 1A:

Formula 1A

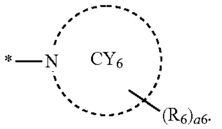

In Formula 1A, $CY_6$ may be a $C_1$-$C_{60}$ heterocyclic group, $R_6$ may be deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a6 may be an integer from 0 to 10,

* may indicate a binding site to a neighboring atom, and $R_{1a}$, $R_{1b}$, $R_{10a}$, and $Q_1$ to $Q_3$ are respectively the same as those described in connection with Formula 1.

In an embodiment, $Ar_1$ may be a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a pyrrolidinyl group, a piperidinyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a pyrrolidinyl group, a piperidinyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, or —$P(=O)(Q_{31})(Q_{32})$.

In an embodiment, $Ar_1$ may be a group represented by one of Formulae $Ar_1(1)$ to $Ar_1(7)$:

Ar1(1)

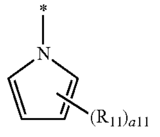

Ar1(2)

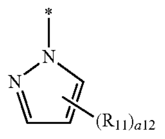

-continued

Ar1(3)

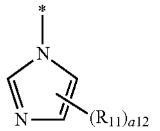

Ar1(4)

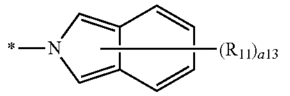

Ar1(6)

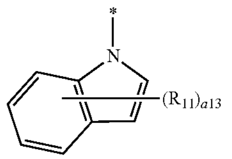

Ar1(5)

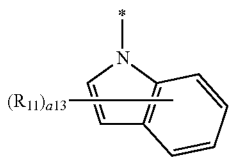

Ar1(7)

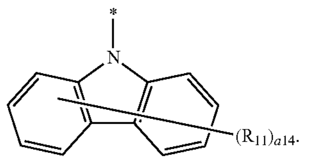

In Formulae $Ar_1(1)$ to $Ar_1(7)$, $R_{11}$ may be deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a11 may be an integer from 0 to 4, a12 may be an integer from 0 to 3, a13 may be an integer from 0 to 6, a14 may be an integer from 0 to 8,

* may indicate a binding site to a neighboring atom, and $R_{10a}$ and $Q_1$ to $Q_3$ are respectively the same as those described in connection with Formula 1.

In an embodiment, $R_1$ to $R_5$ may each independently be:

hydrogen, deuterium, —F, —Cl, —Br, —I, —SCN, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with at least one of deuterium, —F, —Cl, —Br, —I, —SCN, —$CD_3$, —$CD_2H$, —$CDH_2$, —$CF_3$, —$CF_2H$, —$CFH_2$, a $C_1$-$C_{10}$ alkyl group, a pyrrolidinyl group, a piperidinyl group, a phenyl group, a biphenyl group, a naphthyl group, a pyridinyl group, armor a pyrimidinyl group;

a pyrrolidinyl group, a piperidinyl group, a phenyl group, a biphenyl group, a alkylphenyl group, a naphthyl group, a fluorenyl group, a phenanthrenyl group, an anthracenyl group, a triphenylenyl group, a pyrrolyl group, a thiophenyl group, a furanyl group, an imidazolyl group, a pyrazolyl group, a thiazolyl group, an isothiazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a triazolyl group, a tetrazolyl group, an oxadiazolyl group, a triazinyl group, a dibenzofuranyl group, a dibenzothiophenyl group, each unsubstituted or substituted with at least one of deuterium, —F, —Cl, —Br, —I, —SCN, $—CD_3$, $—CD_2H$, $—CDH_2$, $—CF_3$, $—CF_2H$, $—CFH_2$, $C_1$-$C_{20}$ alkyl group, a $C_1$-$C_{20}$ alkoxy group, a $C_1$-$C_{20}$ alkylthio group, a pyrrolidinyl group, a piperidinyl group, a phenyl group, a biphenyl group, a $C_1$-$C_{10}$ alkylphenyl group, a naphthyl group, a fluorenyl group, a phenanthrenyl group, an anthracenyl group, a triphenylenyl group, a pyrrolyl group, a thiophenyl group, a furanyl group, an imidazolyl group, a pyrazolyl group, a thiazolyl group, an isothiazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a triazolyl group, a tetrazolyl group, a triazinyl group, a dibenzofuranyl group, a dibenzothiophenyl group, and $—N(Q_{31})(Q_{32})$; or $—N(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with at least one of deuterium, a $C_1$-$C_{10}$ alkyl group, a phenyl group, a biphenyl group, a pyridinyl group, a pyrimidinyl group, a pyridazinyl group, a pyrazinyl group, or a triazinyl group.

In an embodiment, an organometallic compound represented by Formula 1-1 may be provided:

Formula 1-1

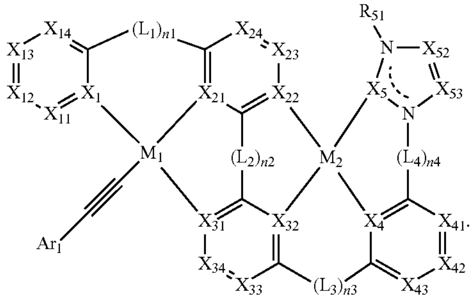

In Formula 1-1, $M_1$, $M_2$, $X_1$, $X_{21}$, $X_{22}$, $X_{31}$, $X_{32}$, $X_4$, $X_5$, n1 to n4, $L_1$ to $L_4$, and $Ar_1$ may respectively be the same as those described in connection with Formula 1, $X_{11}$ may be $C(R_{11})$ or N, $X_{12}$ may be $C(R_{12})$ or N, $X_{13}$ may be $C(R_{13})$ or N, and $X_{14}$ may be $C(R_{14})$ or N, $R_{11}$ to $R_{14}$ may respectively be the same as described in connection with $R_1$ in Formula 1, and two or more of $R_{11}$ to $R_{14}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{23}$ may be $C(R_{23})$ or N, and $X_{24}$ may be $C(R_{24})$ or N, $R_{23}$ and $R_{24}$ may respectively be the same as described in connection with $R_2$ in Formula 1, and $R_{23}$ and $R_{24}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{33}$ may be $C(R_{33})$ or N, and $X_{34}$ may be $C(R_{34})$ or N, $R_{33}$ and $R_{34}$ may respectively be the same as described in connection with $R_3$ in Formula 1, and $R_{33}$ and $R_{34}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{41}$ may be $C(R_{41})$ or N, $X_{42}$ may be $C(R_{42})$ or N, and $X_{43}$ may be $C(R_{43})$ or N, $R_{41}$ to $R_{43}$ may respectively be the same as described in connection with $R_4$ in Formula 1, and two or more of $R_{41}$ to $R_{43}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{52}$ may be $C(R_{52})$ or N, and $X_{53}$ may be $C(R_{53})$ or N, and $R_{51}$ to $R_{53}$ may respectively be the same as described in connection with $R_5$ in Formula 1, and two or more of $R_{51}$ to $R_{53}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

The organometallic compound according to an embodiment may have a triplet metal-to-ligand charge transfer state ($^3$MLCT) value of about 14% or more. The organometallic compound according to an embodiment exhibits a high $^3$MLCT proportion of about 14% or higher, and thus may be included in the emission layer, thereby contributing to stable emission of blue light and improvement of the efficiency of an organic light-emitting device.

The $^3$MLCT described in the present disclosure shows the relative proportion of $^3$MLCT, assuming that 100% of the charge is transferred from a metal atom to a ligand.

In an embodiment, the compound represented by Formula 1 may be any one of Compounds BD01 to BD104:

BD01

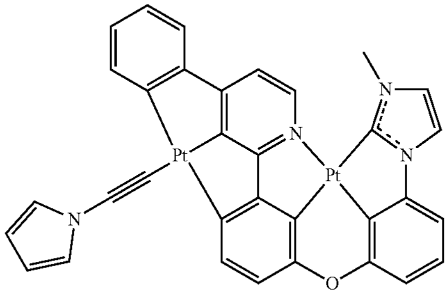

BD02

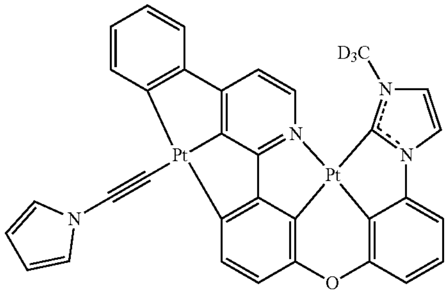

BD03

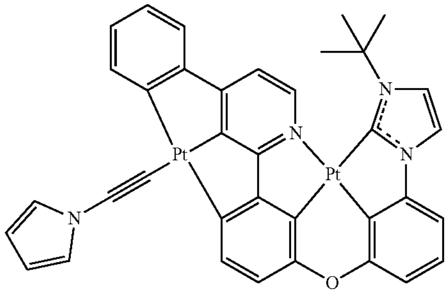

BD04

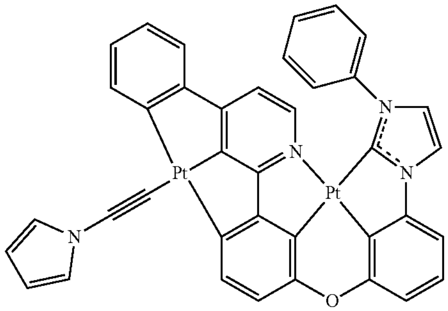

-continued

BD05

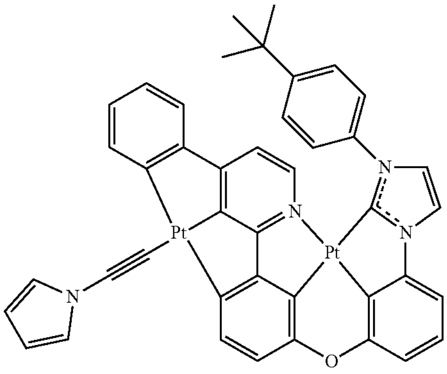

BD06

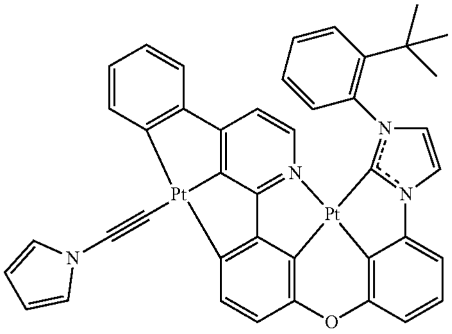

BD07

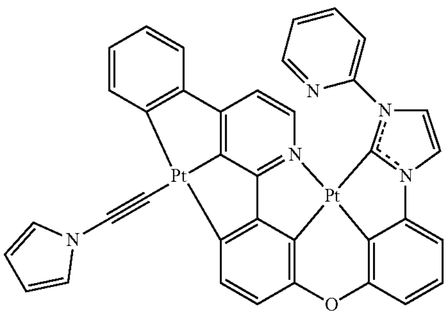

BD08

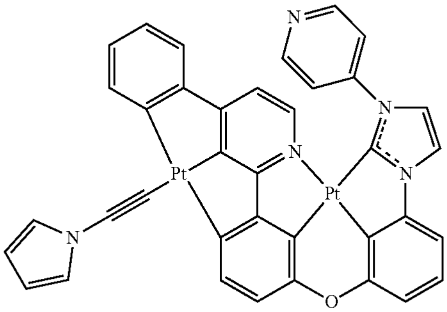

-continued
BD09
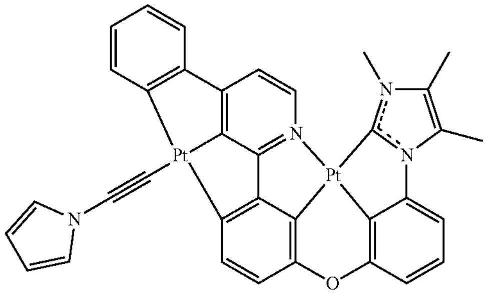
BD10
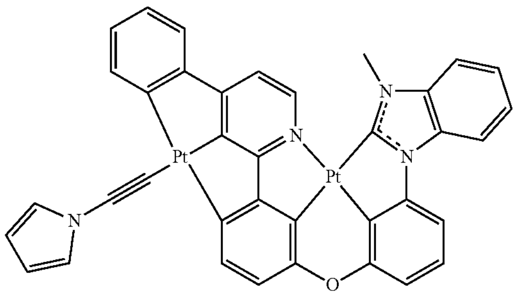
BD11
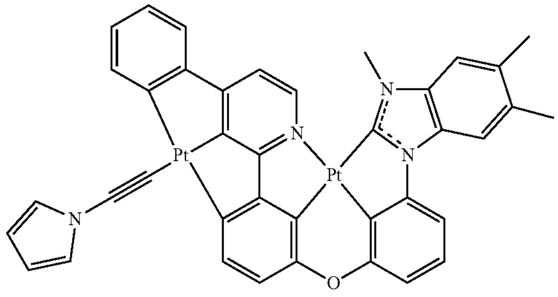
BD12
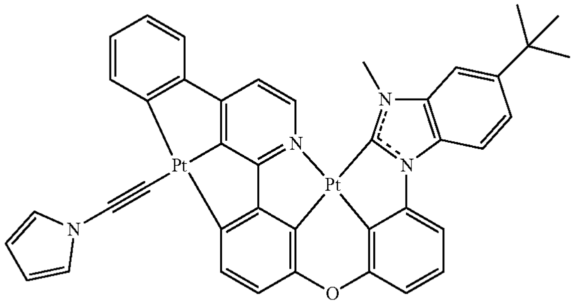
BD13
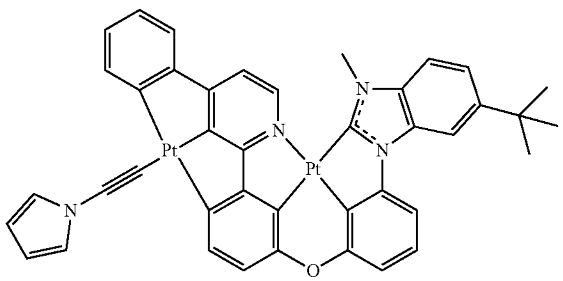
-continued
BD14
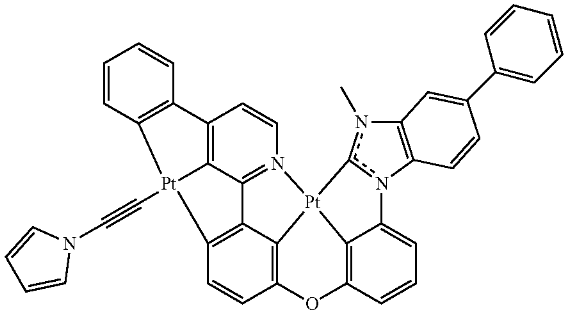
BD15
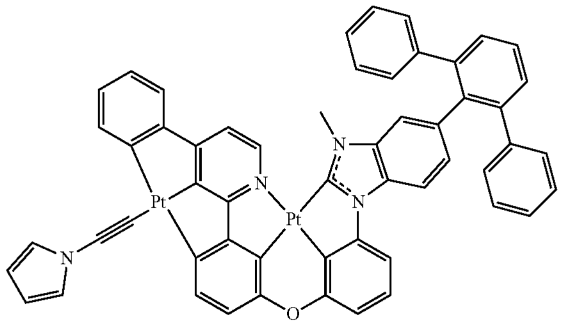
BD16
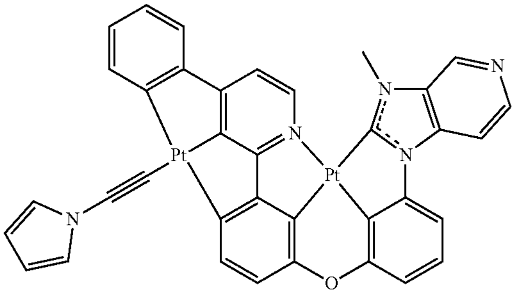
BD17
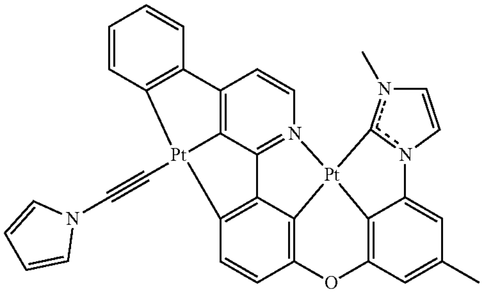

-continued
BD18
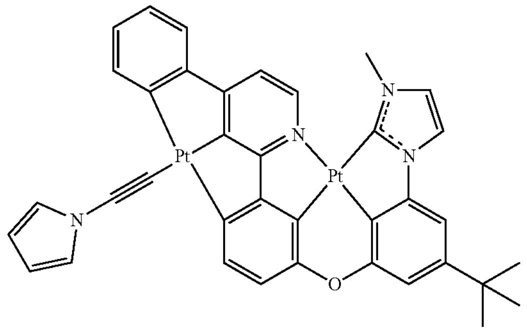
BD19
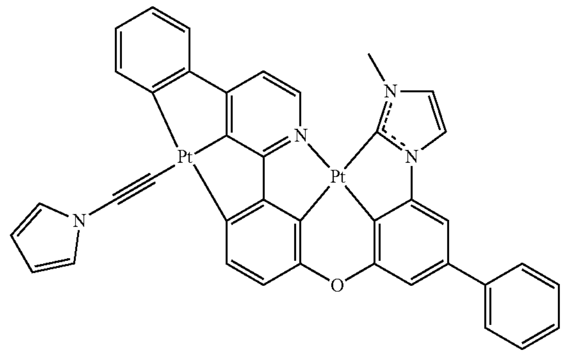
BD20
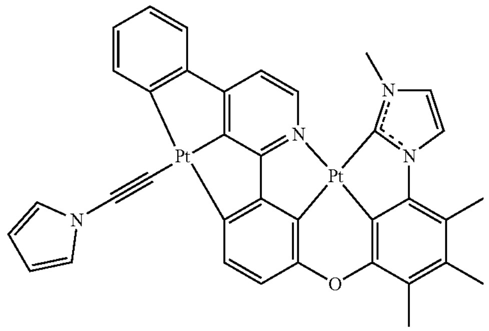
BD21
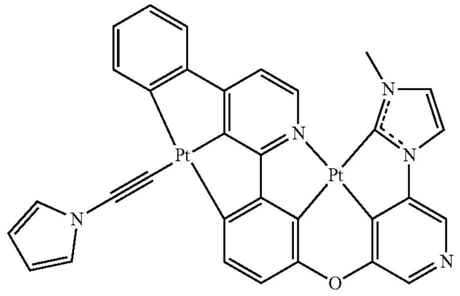
-continued
BD22
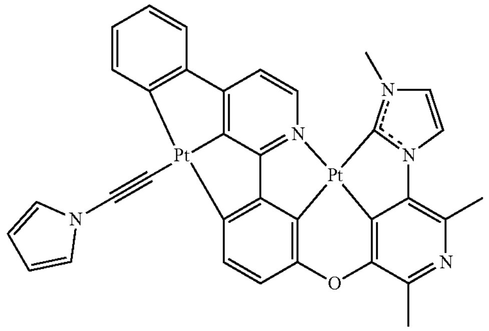
BD23
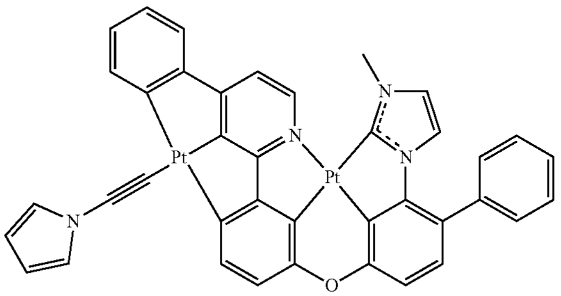
BD24
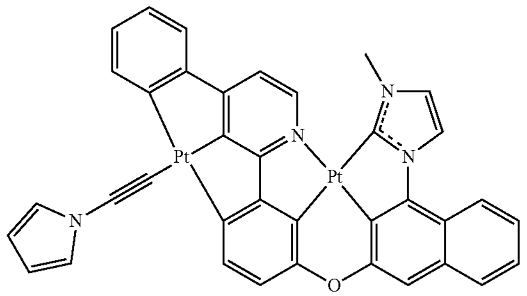
BD25
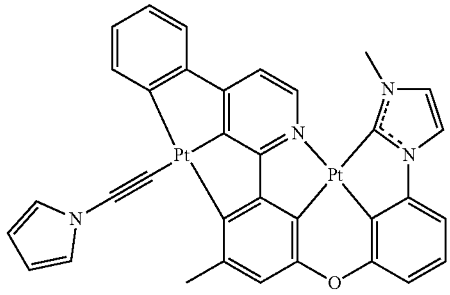
BD26
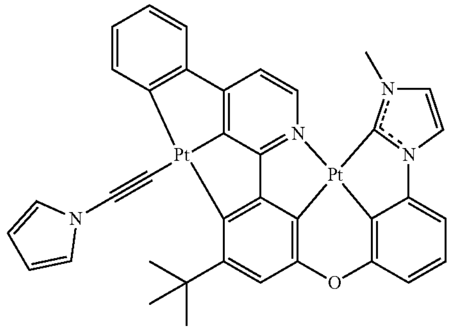

-continued
BD27
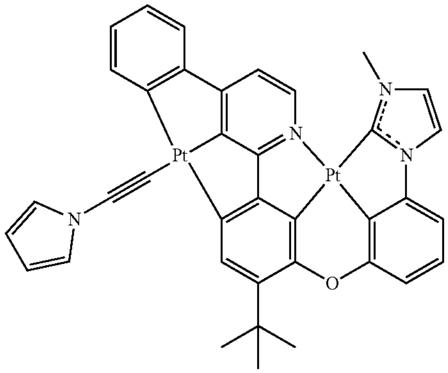
BD28
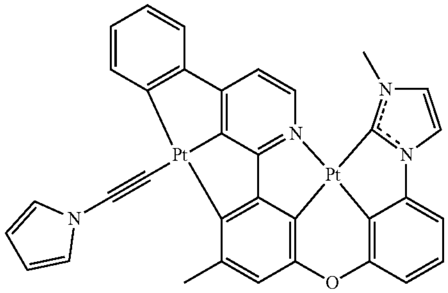
BD29
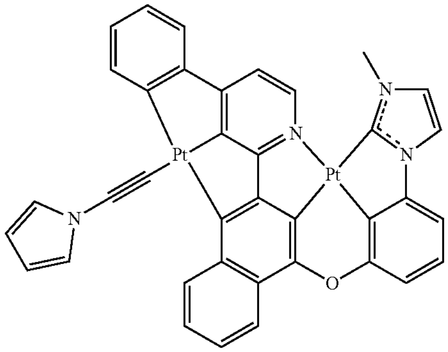
BD30
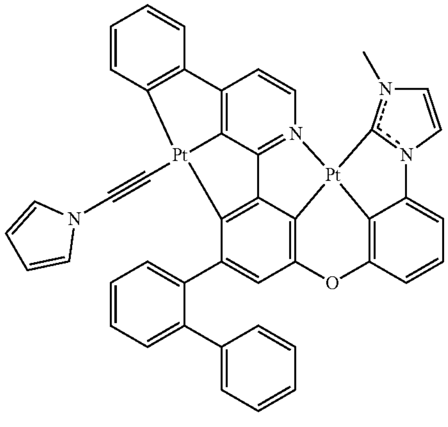
-continued
BD31
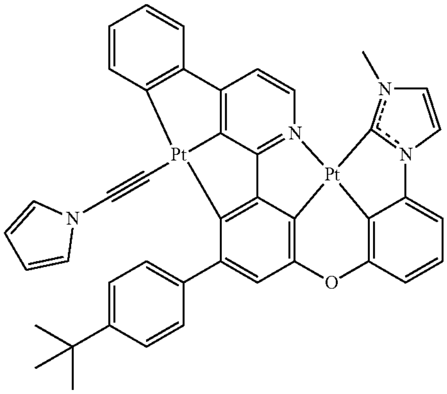
BD32
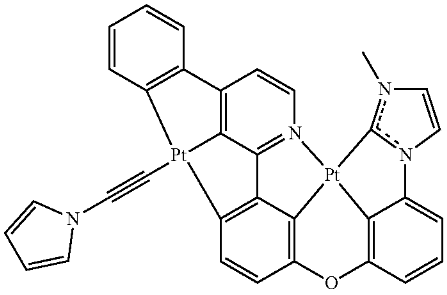
BD33
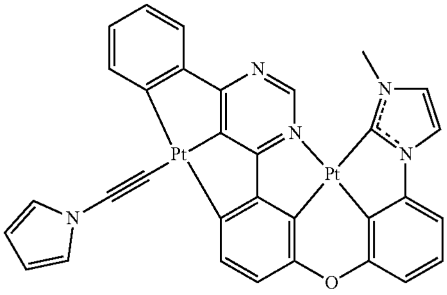
BD34
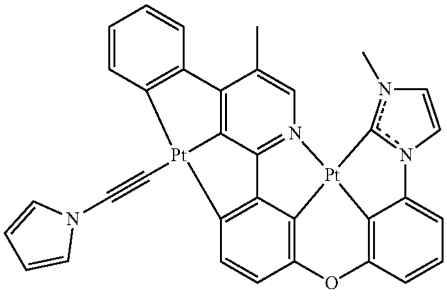
BD35
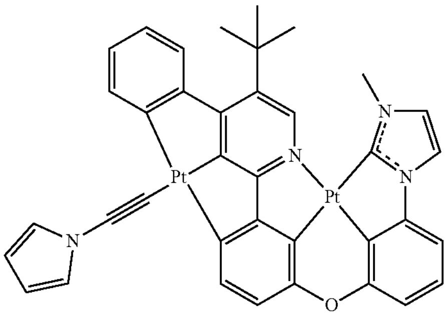

-continued
BD36
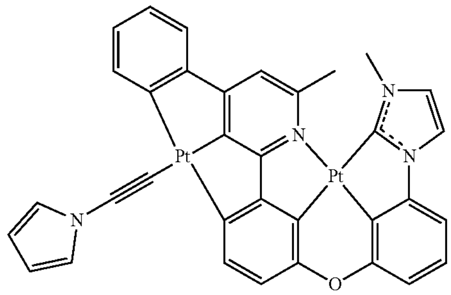
BD37
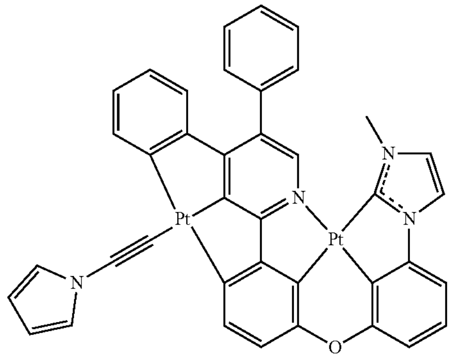
BD38
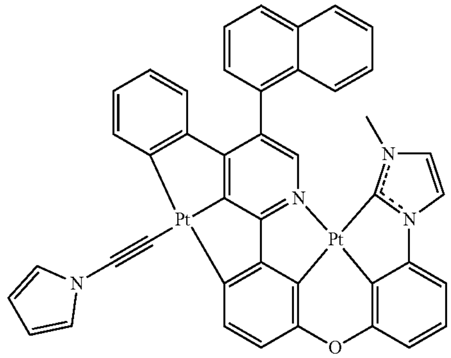
BD39
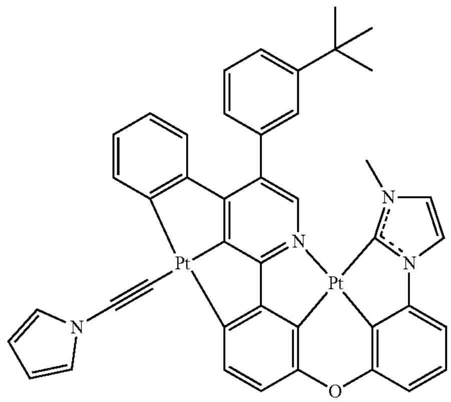
-continued
BD40
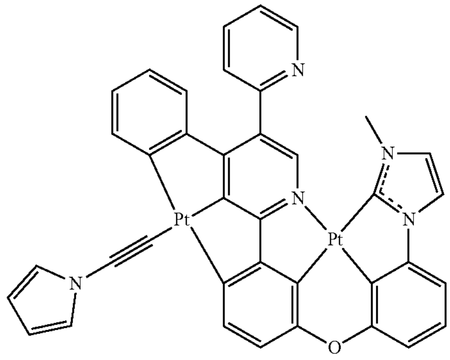
BD41
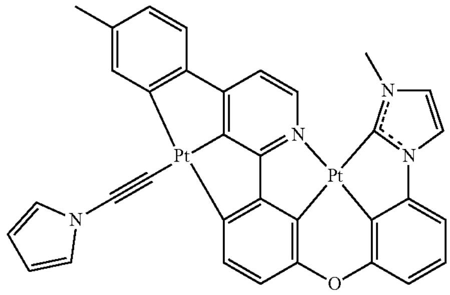
BD42
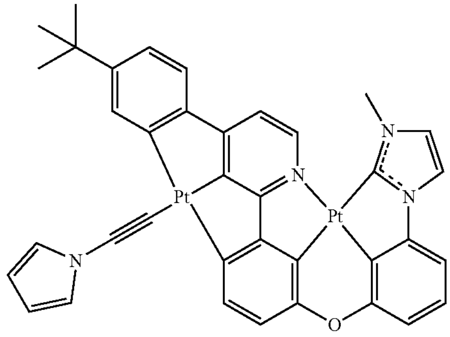
BD43
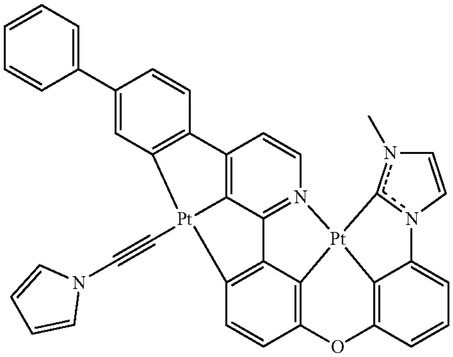

-continued
BD44
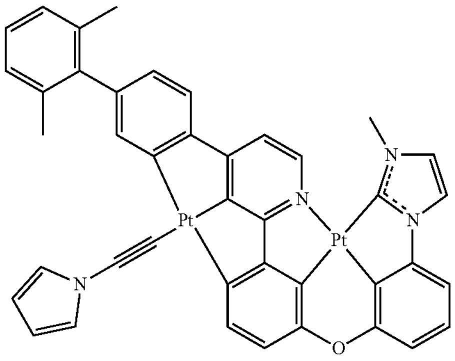
BD45
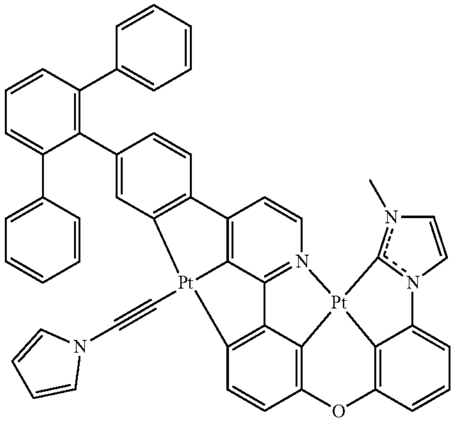
BD46
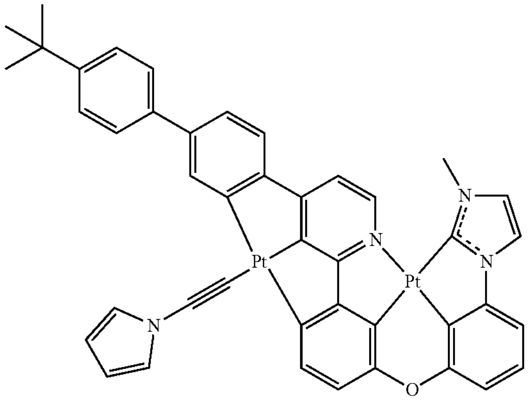
BD47
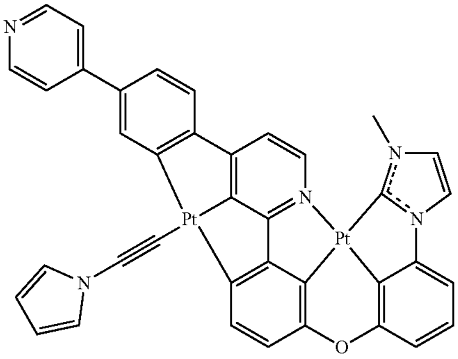
-continued
BD48
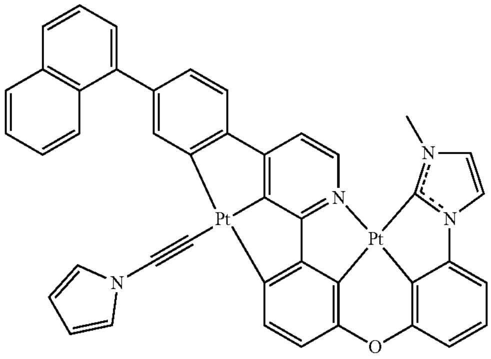
BD49
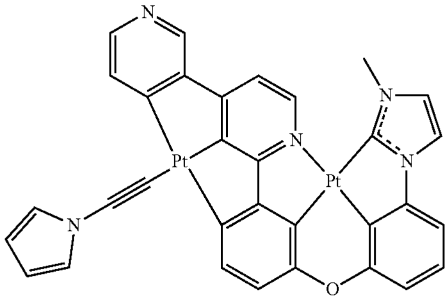
BD50
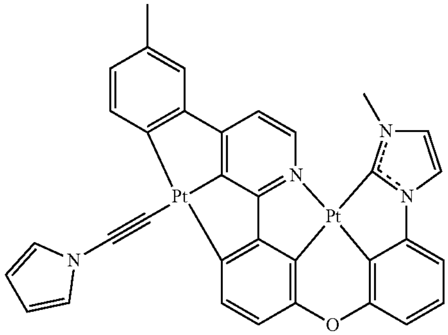
BD51
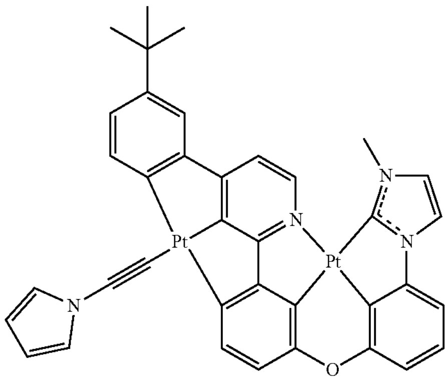

-continued
BD52
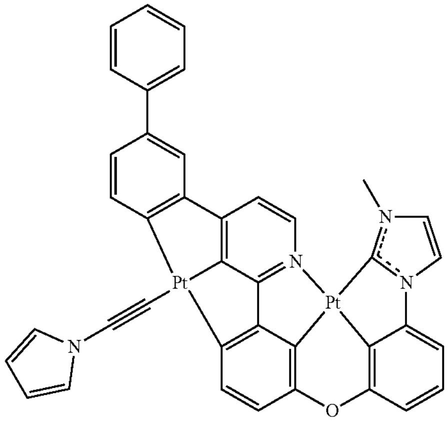
BD53
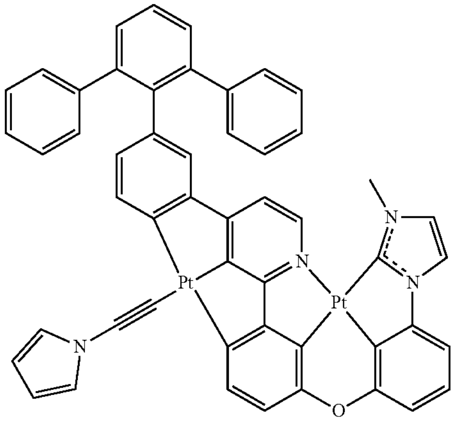
BD54
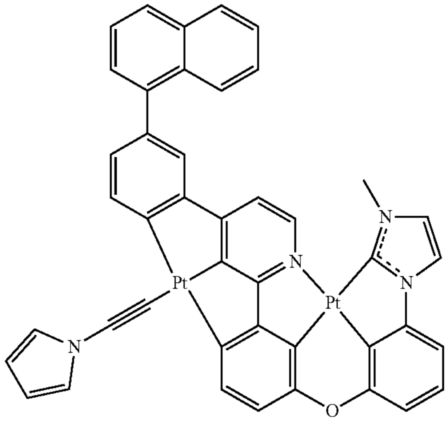
-continued
BD55
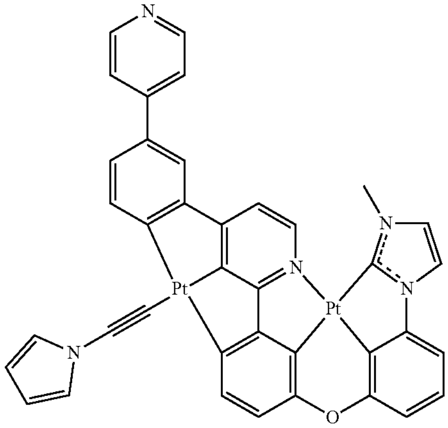
BD56
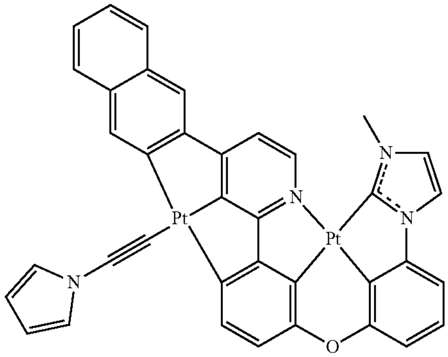
BD57
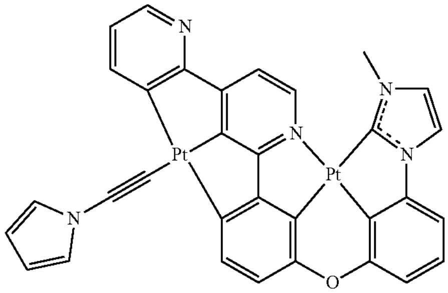
BD58
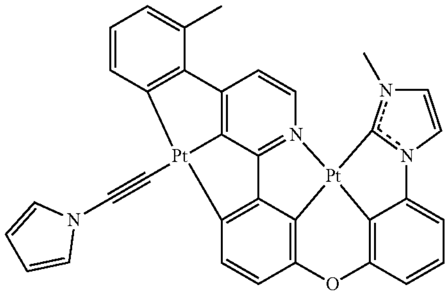

-continued
BD59
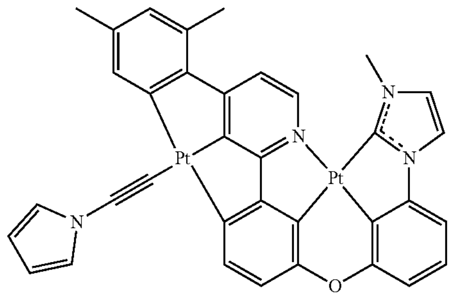
BD60
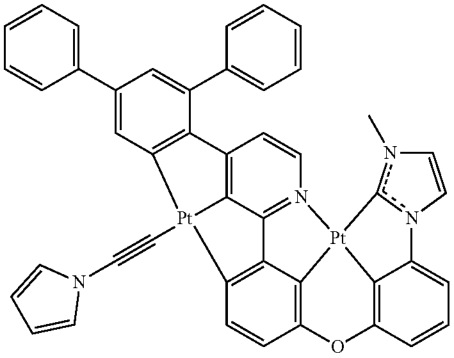
BD61
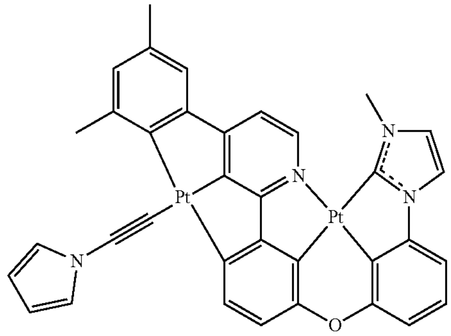
BD62
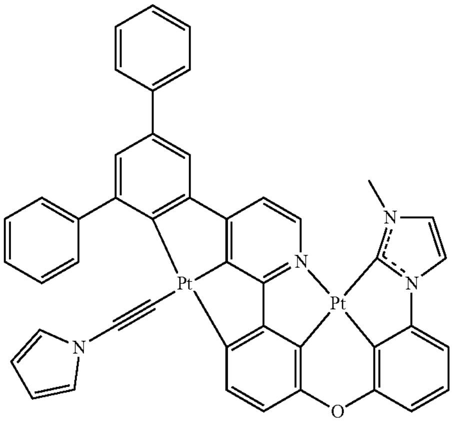
-continued
BD63
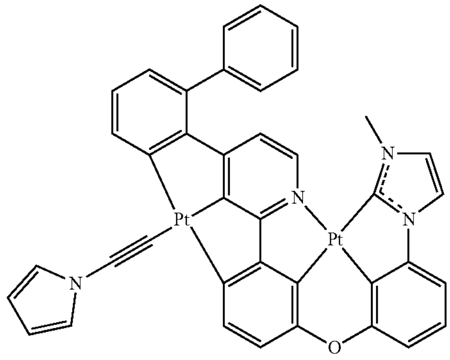
BD64
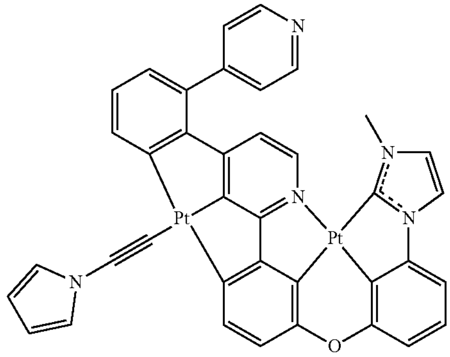
BD65
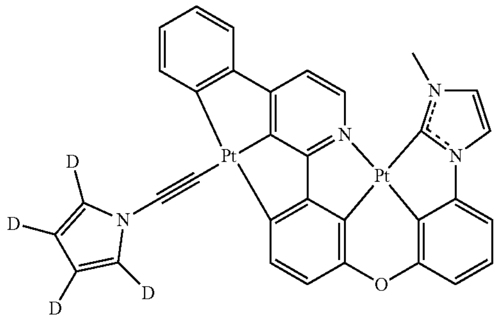
BD66
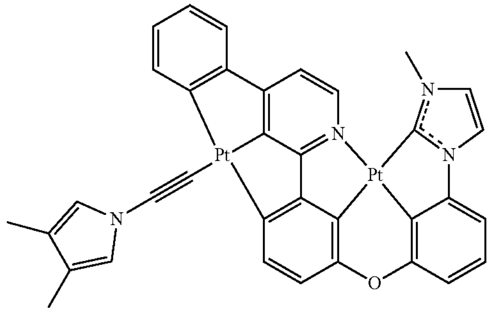

-continued
BD67
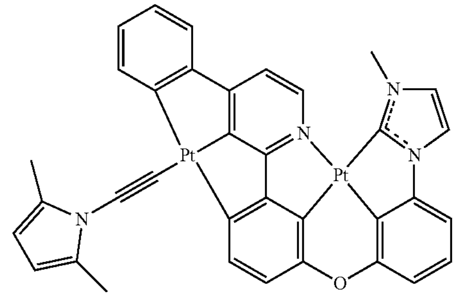
BD68
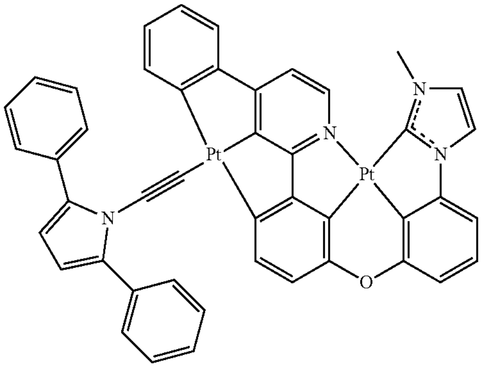
BD69
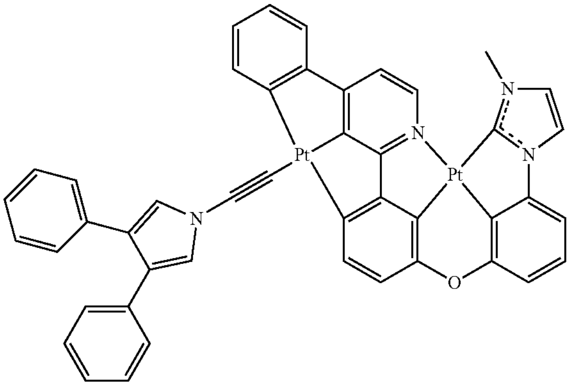
BD70
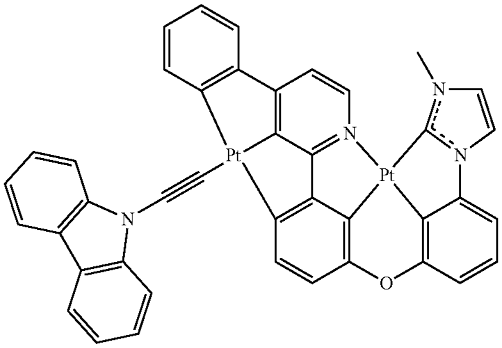
-continued
BD71
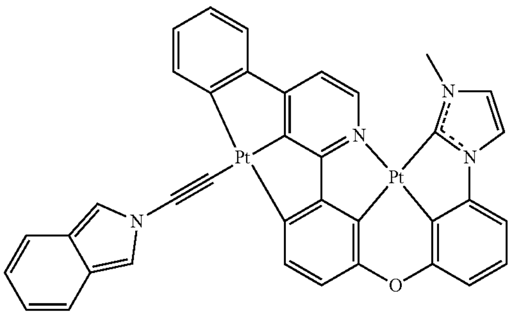
BD72
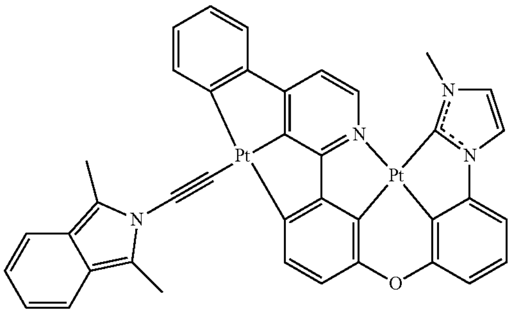
BD73
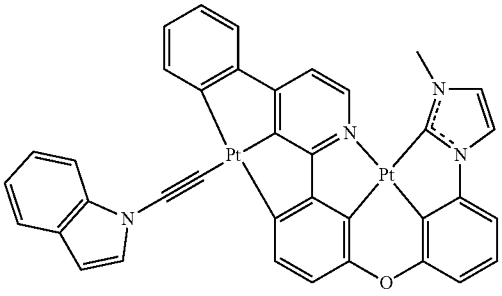
BD74
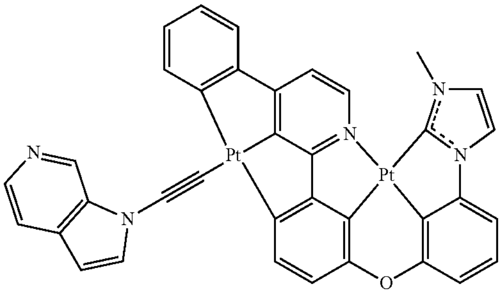
BD75
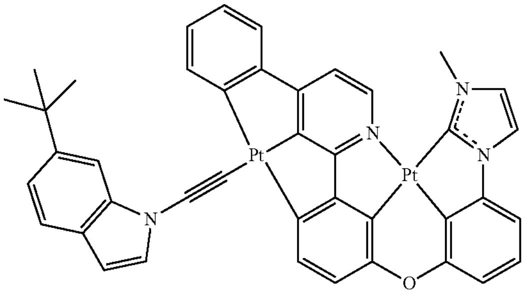

-continued
BD76
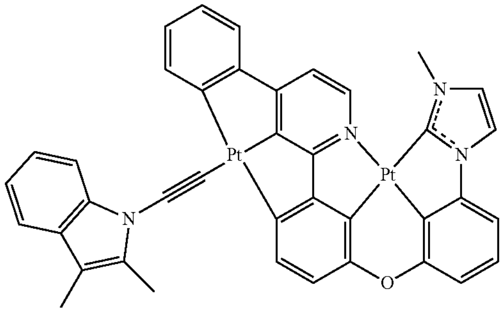
BD77
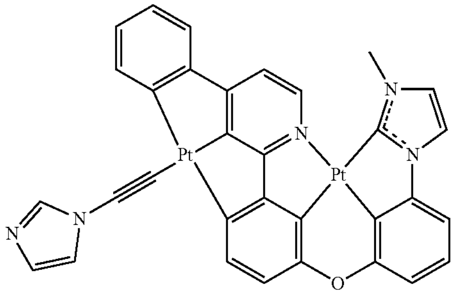
BD78
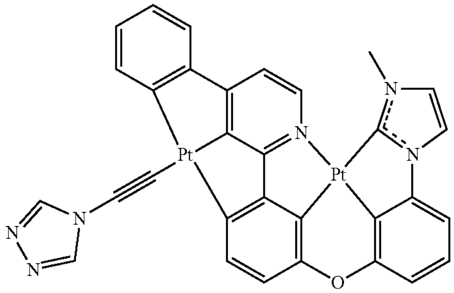
BD79
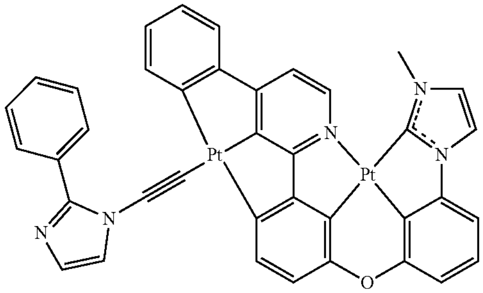
BD80
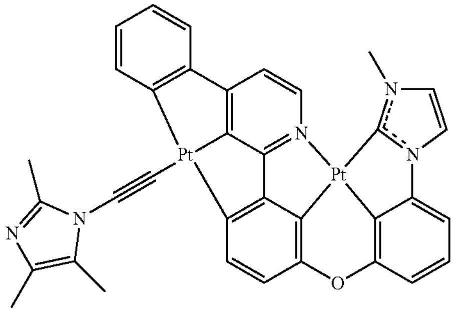
-continued
BD81
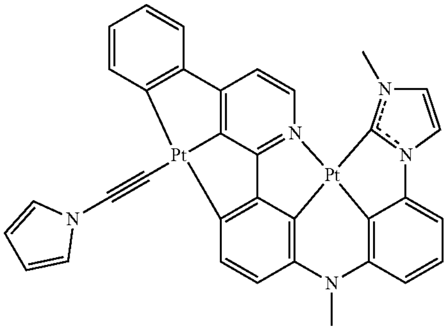
BD82
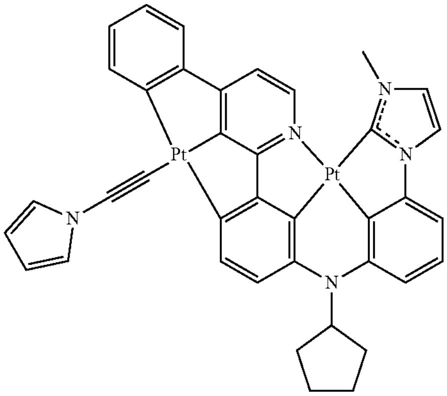
BD83
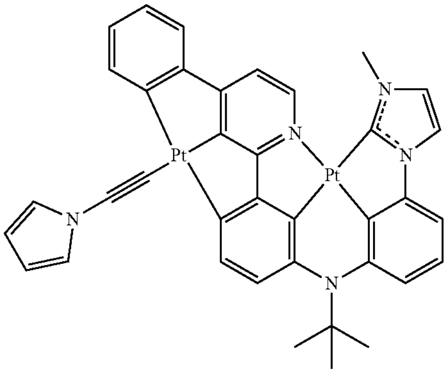
BD84
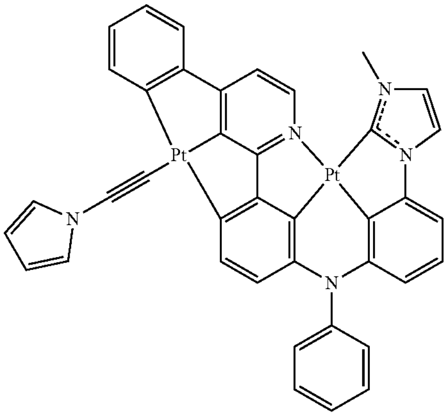

-continued
BD85
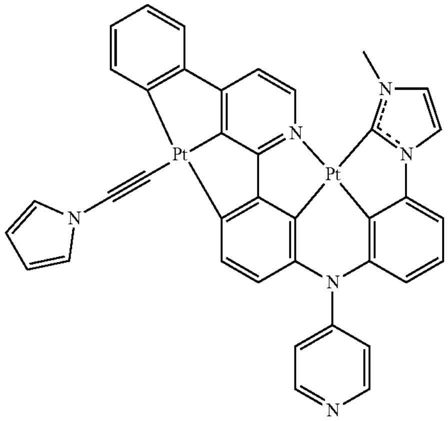
BD86
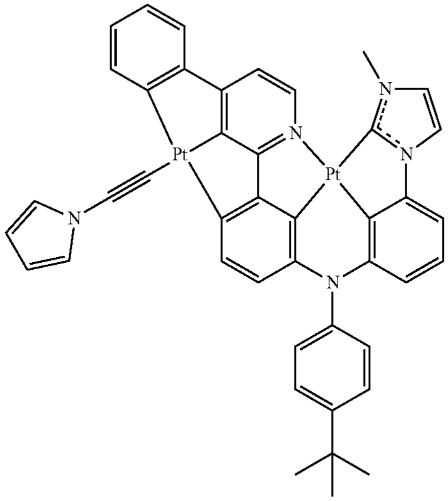
BD87
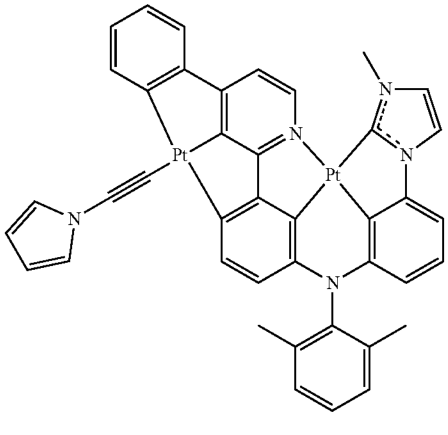
-continued
BD88
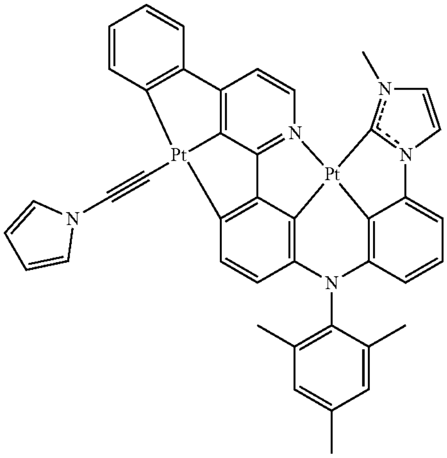
BD89
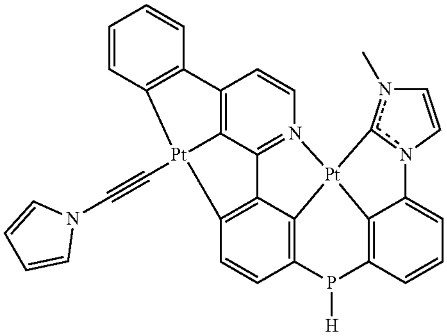
BD90
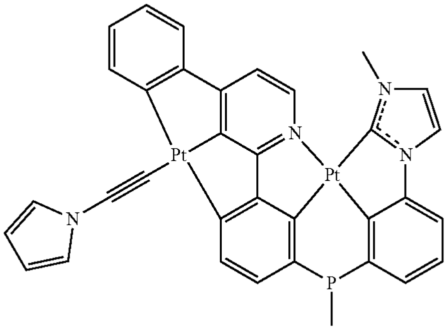
BD91
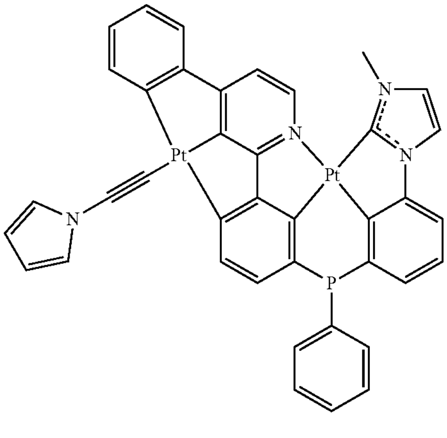

-continued
BD92
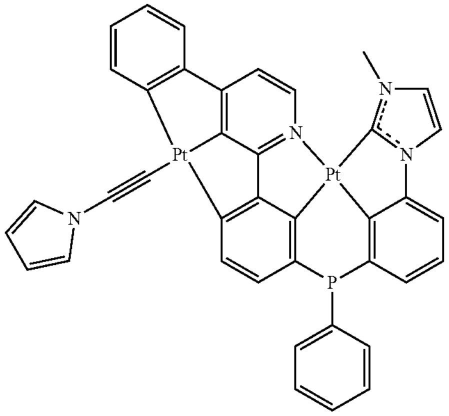
BD93
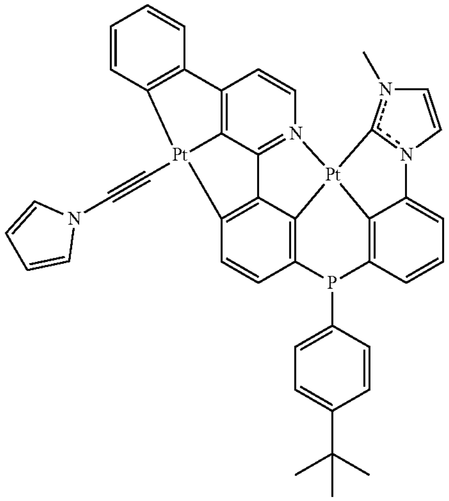
BD94
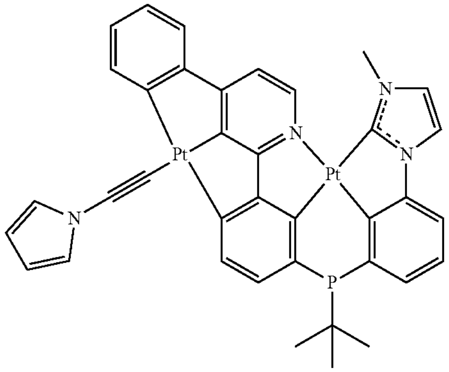
BD95
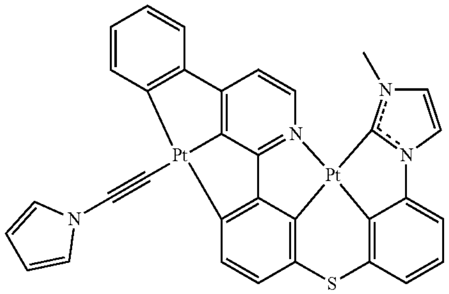
-continued
BD96
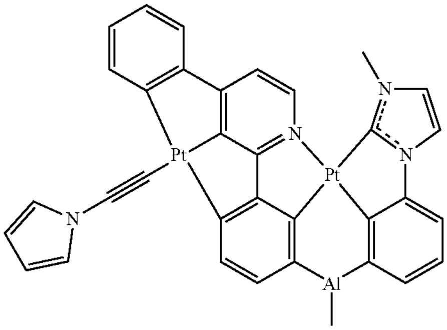
BD97
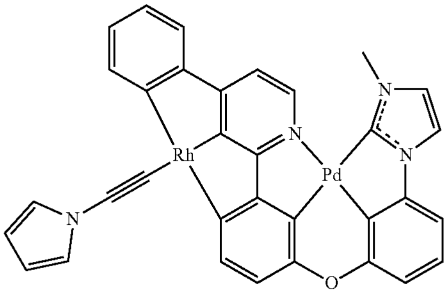
BD98
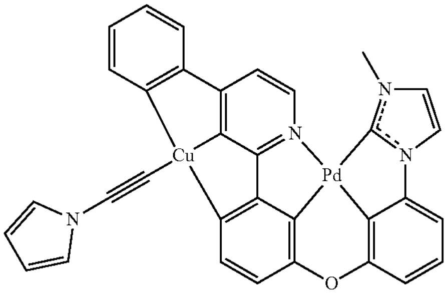
BD99
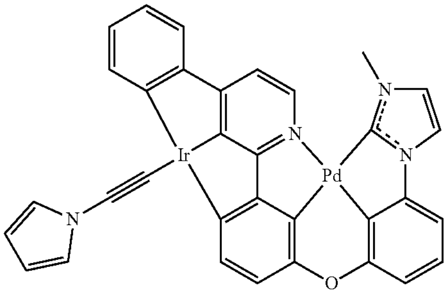
BD100
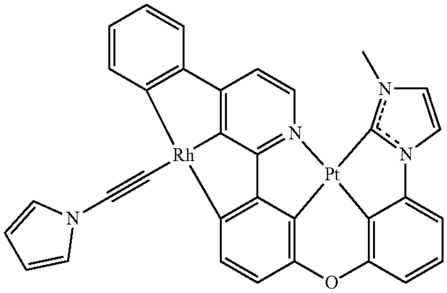

-continued

BD101

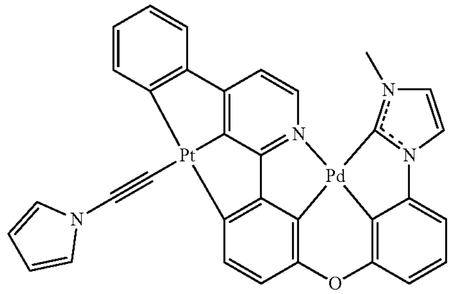

BD102

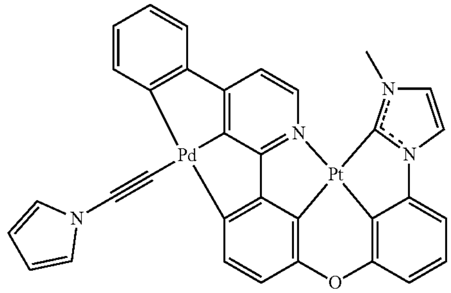

BD103

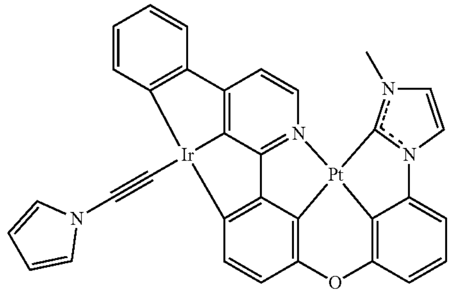

BD104

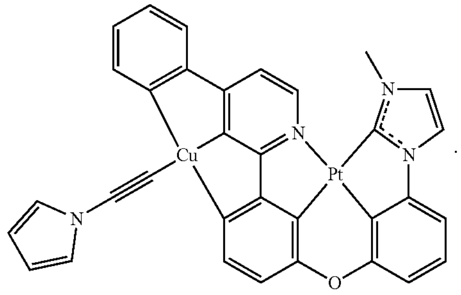

The organometallic compound represented by Formula 1 or 1-1 has two transition metals $M_1$ and $M_2$ as illustrated in Formula 1, and a ligand having the same backbone as represented by Formula 1, wherein ring $CY_2$ and ring $CY_3$ are bonded to each other through $(L_2)_{n2}$.

A moiety including ring $CY_2$ and ring $CY_3$ has a structure bonded to $M_1$ and $M_2$ at the same time, and thus the ligand included in Formula 1 may have a more rigid molecular structure.

Also, when $M_1$ and $M_2$ having different electrochemical environments are included together, an excited energy level of the organometallic compound may be diversified, and thus a range of absorbed energy and a wavelength range of emitted light may be broadened.

Accordingly, the luminance and luminescence efficiency of an electronic apparatus, for example, a light-emitting device, including the organometallic compound represented by Formula 1 may be improved (increased).

Methods of synthesizing the organometallic compound represented by Formula 1 may be easily understood to those of ordinary skill in the art by referring to Synthesis Examples and other Examples described herein.

In an embodiment, the light-emitting device may include a capping layer located outside the first electrode or located outside the second electrode.

In an embodiment, the light-emitting device may further include at least one of a first capping layer located outside the first electrode or a second capping layer located outside the second electrode, and the at least one of the first capping layer or the second capping layer may include the organometallic compound represented by Formula 1. More details for the first capping layer and/or second capping layer are respectively the same as those described in the present disclosure.

In an embodiment, the light-emitting device may include:

a first capping layer arranged outside the first electrode and including the organometallic compound represented by Formula 1;

a second capping layer arranged outside the second electrode and including the organometallic compound represented by Formula 1; or the first capping layer and the second capping layer.

The wording "(interlayer and/or capping layer) includes an organometallic compound" as used herein may be understood as "(interlayer and/or capping layer) may include one kind of organometallic compound represented by Formula 1 or two different kinds of organometallic compounds, each represented by Formula 1".

In an embodiment, the interlayer and/or capping layer may include Compound 1 only as the organometallic compound. In this regard, Compound 1 may be present in the emission layer of the light-emitting device. In an embodiment, the interlayer may include Compound 1 and Compound 2. In this regard, Compound 1 and Compound 2 may be present in substantially the same layer (for example, all of Compound 1 and Compound 2 may be present in the emission layer), or may be present in different layers (for example, Compound 1 may be present in the emission layer, and Compound 2 may be present in the electron transport region).

The term "interlayer" as used herein refers to a single layer and/or all of a plurality of layers located between the first electrode and the second electrode of the light-emitting device.

Description of FIG. 1

FIG. 1 is a schematic cross-sectional view of a light-emitting device 10 according to an embodiment of the disclosure. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate and/or a plastic substrate may be utilized. In an embodiment, the substrate may be a flexible substrate, and may include plastic(s) with excellent or suitable heat resistance and durability, such as polyimide (PI), polyethylene terephthalate (PET), polycarbonate, polyethylene napthalate, polyarylate (PAR), polyetherimide, or one or more combinations thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or one or more combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or one or more combinations thereof may be utilized as a material for forming a first electrode.

The first electrode 110 may have a single-layered structure consisting of a single layer or a multilayer structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to one or more suitable organic materials.

In one or more embodiments, the interlayer 130 may include, i) two or more emitting units sequentially stacked between the first electrode 110 and the second electrode 150, and ii) a charge generation layer located between the two emitting units. When the interlayer 130 includes emitting units and a charge generation layer as described above, the light-emitting device 10 may be a tandem light-emitting device.

Hole Transport Region in Interlayer 1304

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or one or more combinations thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or a combination thereof:

Formula 201

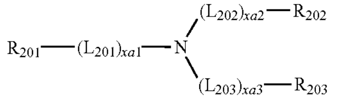

Formula 202

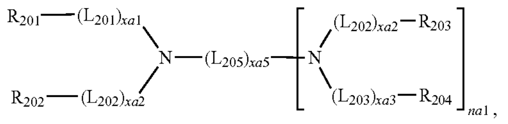

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217:

CY201

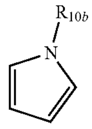

CY202

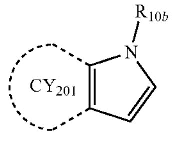

-continued

CY203

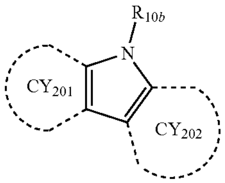

CY204

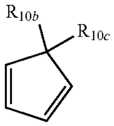

CY205

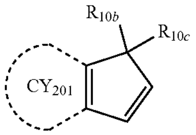

CY206

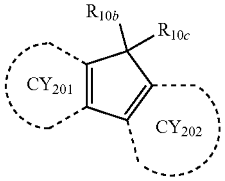

CY207

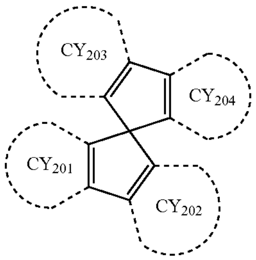

CY208

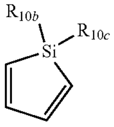

CY209

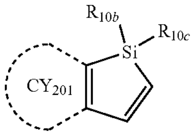

CY210

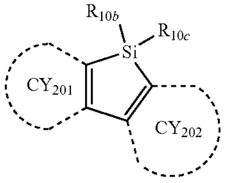

-continued

CY211

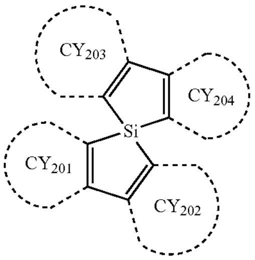

CY212

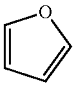

CY213

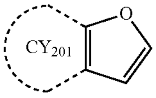

CY214

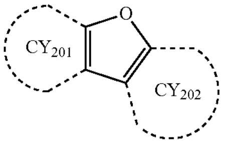

CY215

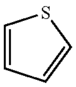

CY216

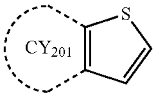

CY217

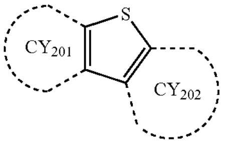

, wherein in Formulae CY201 to CY217, $R_{10b}$ and $R_{10c}$ may each be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of groups represented by Formulae CY201 to CY203.

In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include (e.g., may exclude) groups represented by Formulae CY201 to CY203.

In an embodiment, each of Formulae 201 and 202 may not include (e.g., may exclude) groups represented by Formulae CY201 to CY203, and may include at least one of groups represented by Formulae CY204 to CY217.

In an embodiment, each of Formulae 201 and 202 may not include (e.g., may exclude) groups represented by Formulae CY201 to CY217.

In an embodiment, the hole transport region may include at least one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or one or more combinations thereof:

HT1

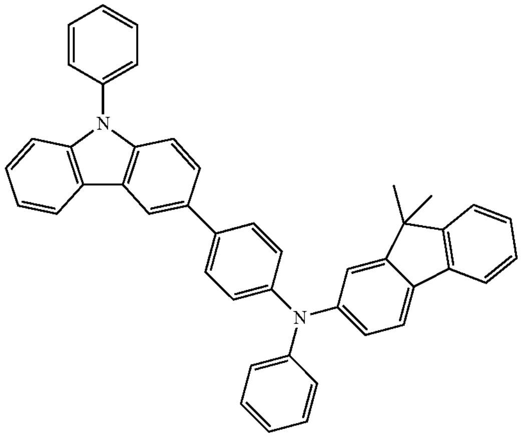

HT2

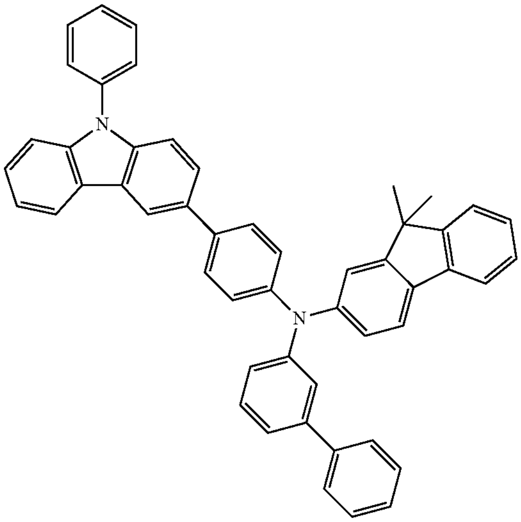

HT3

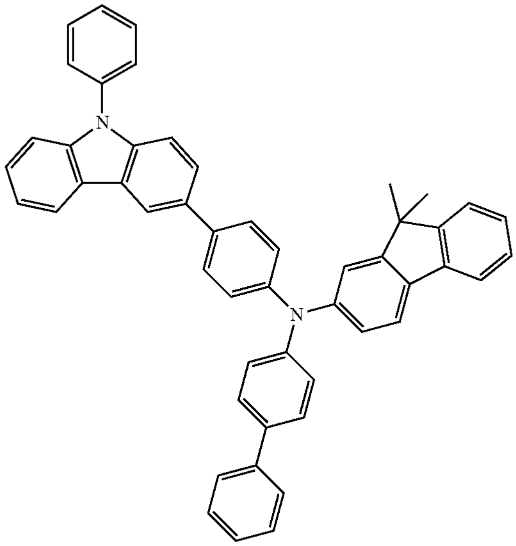

HT4

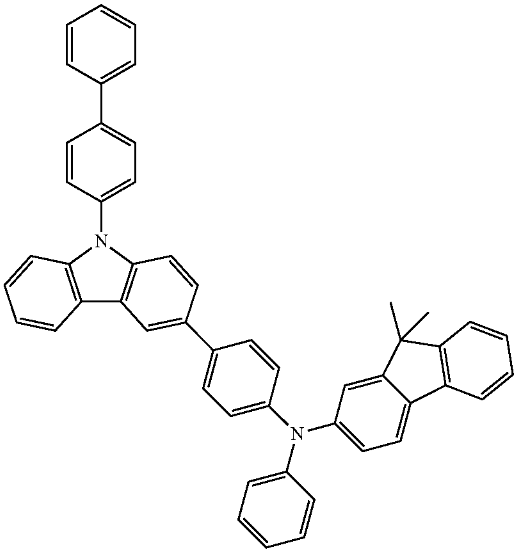

-continued
HT5
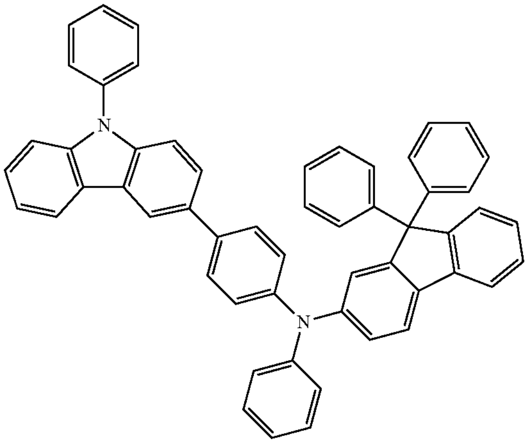
HT6
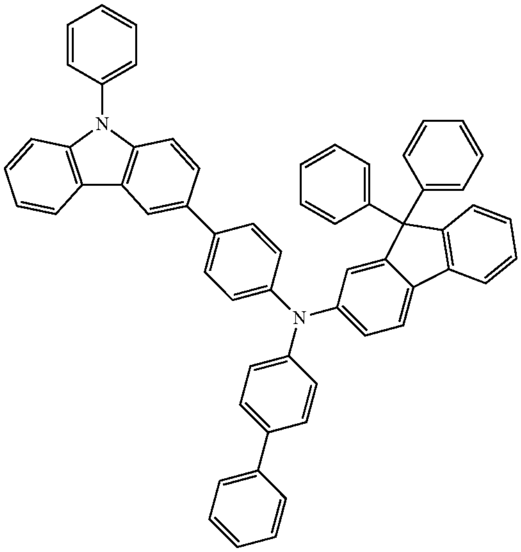
HT7
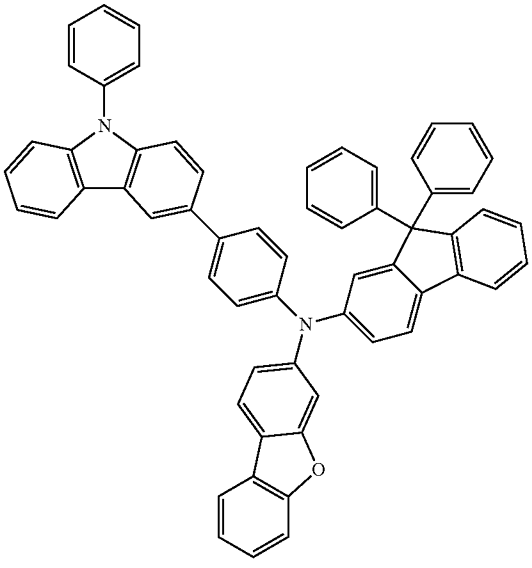
HT8
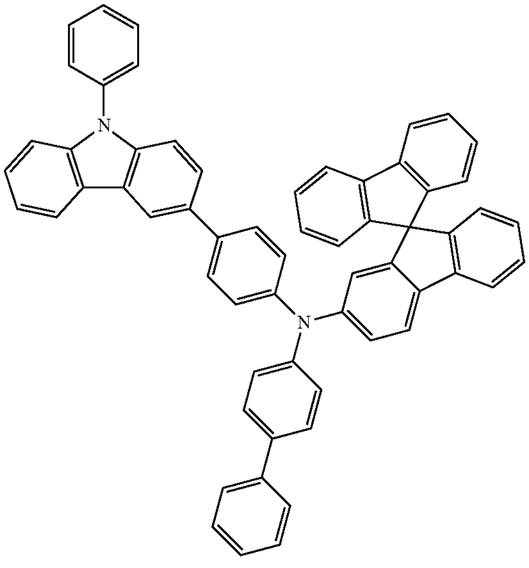

-continued
HT9
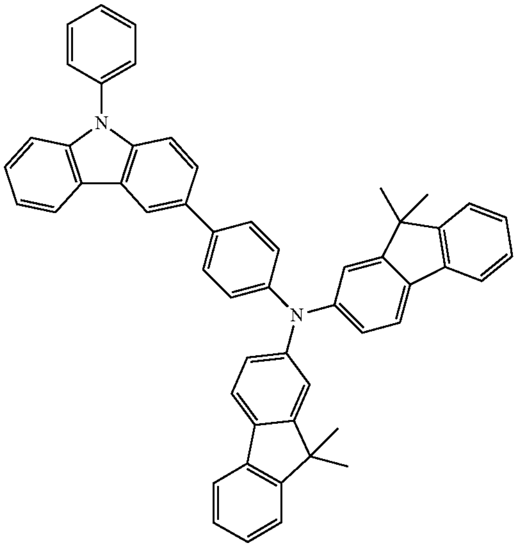
HT10
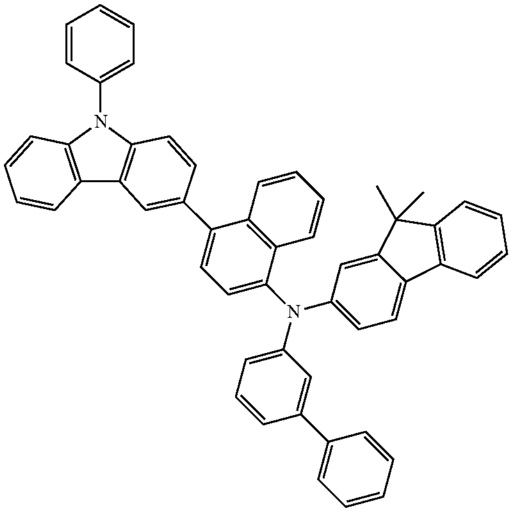
HT11
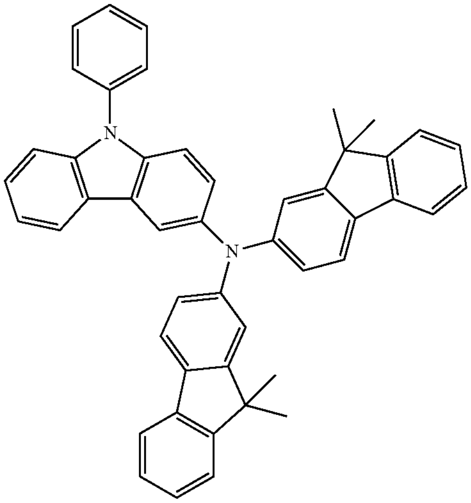
HT12
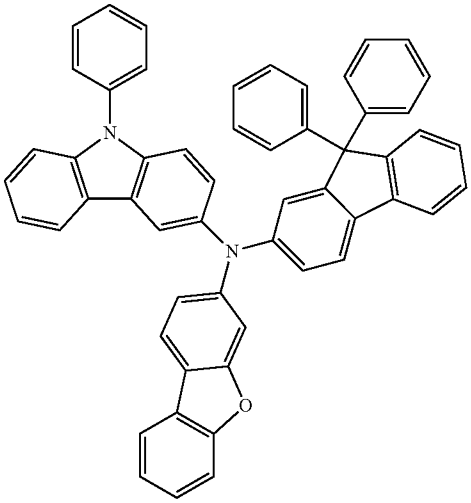
HT13
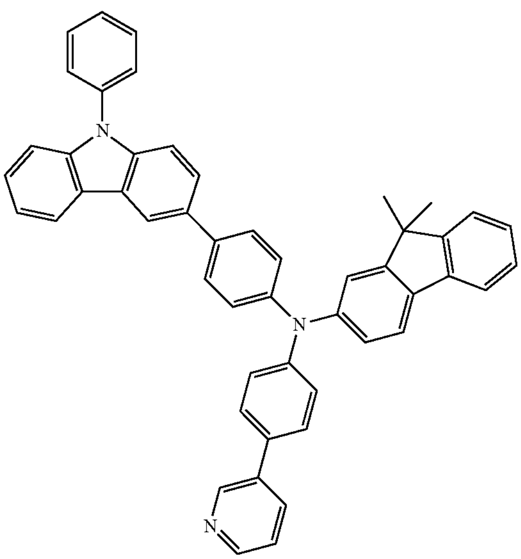
HT14
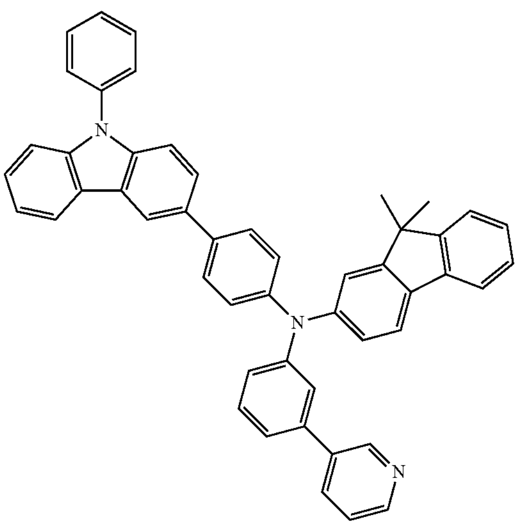

-continued
HT15
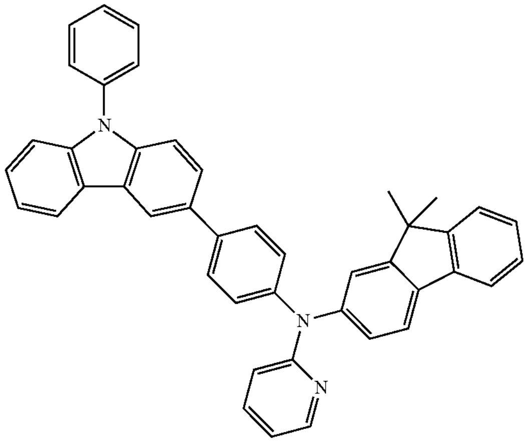
HT16
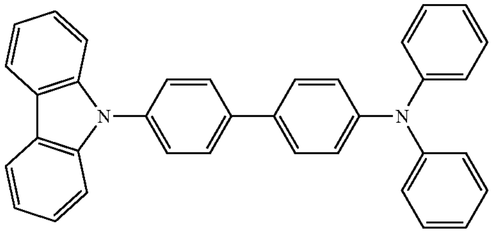
HT17
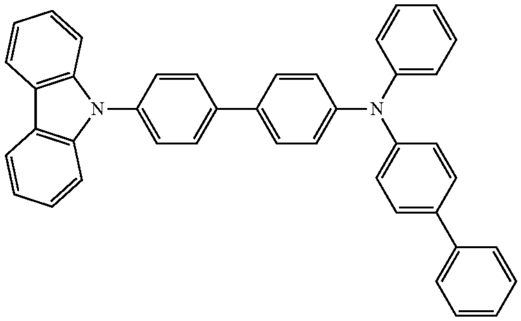
HT18
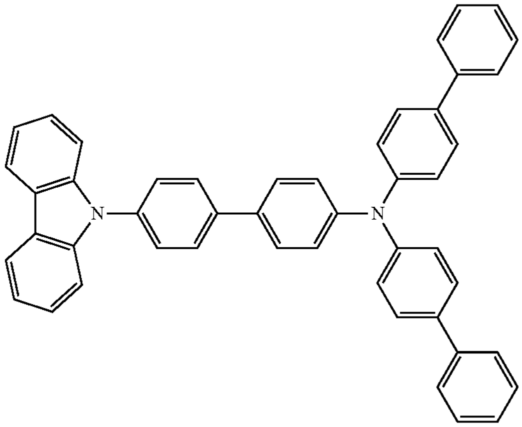
HT19
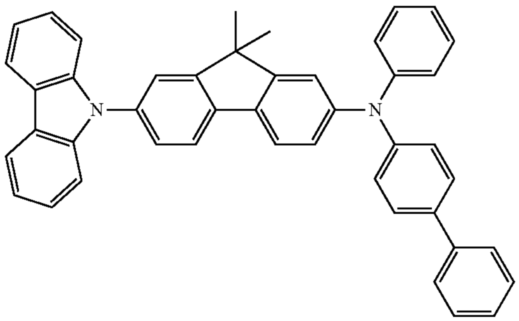
HT20
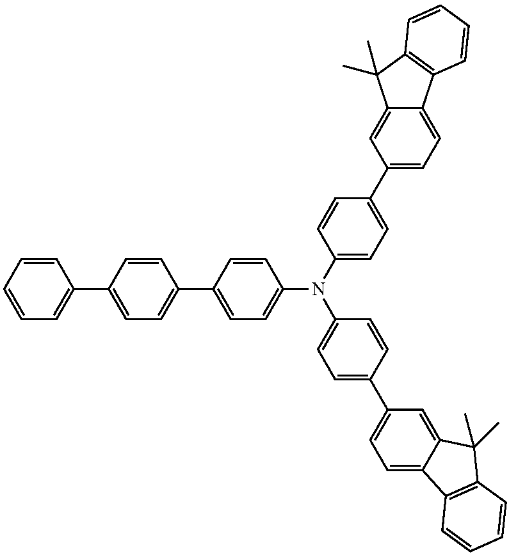

-continued
HT21
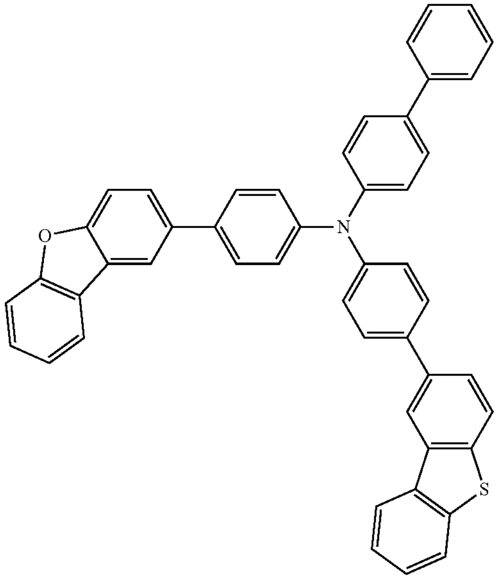
HT22
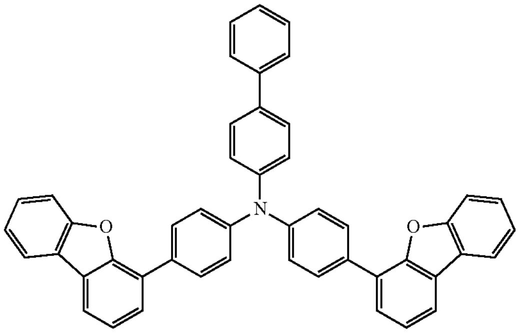
HT23
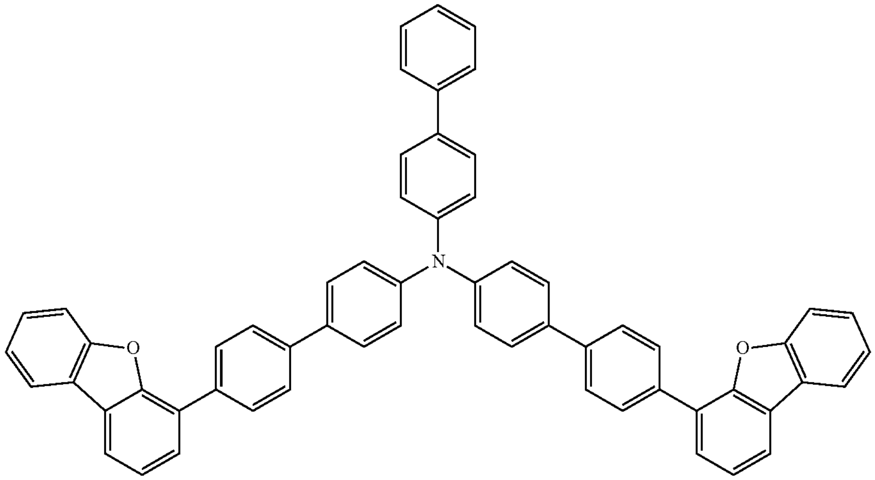
HT24
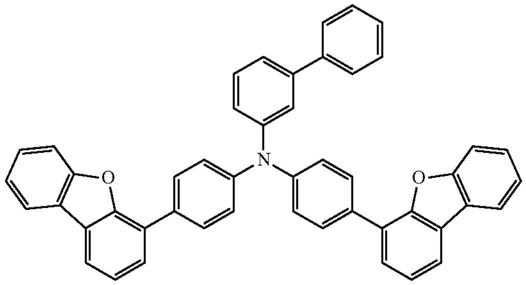
HT25
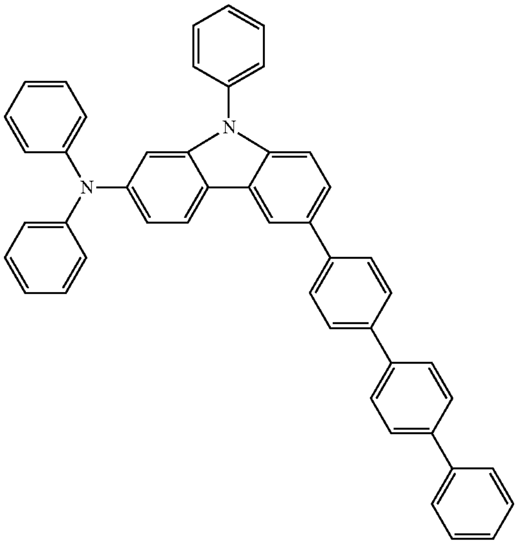

-continued
HT26
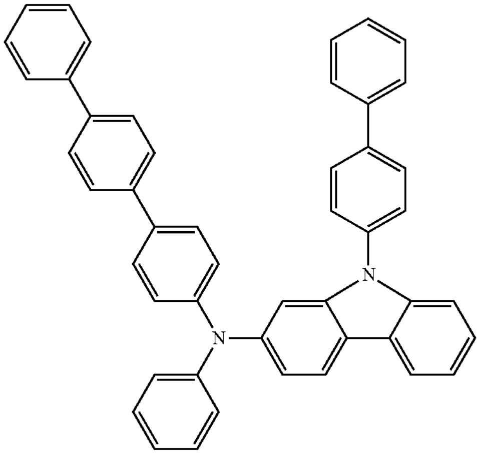
HT27
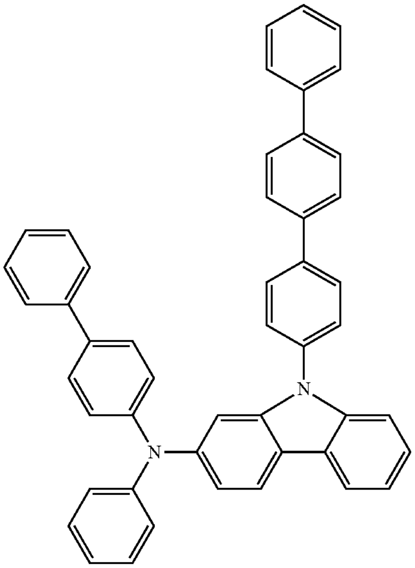
HT28
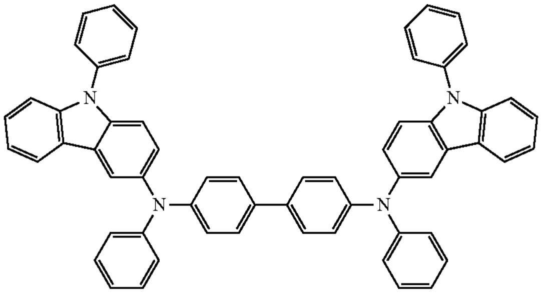
HT29
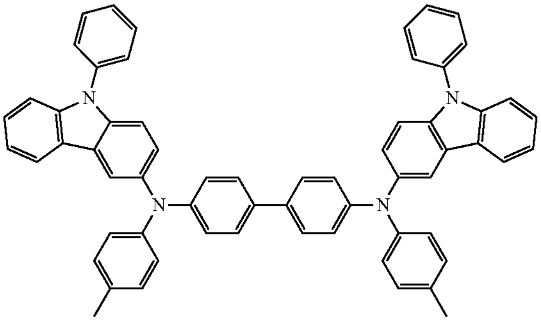
HT30
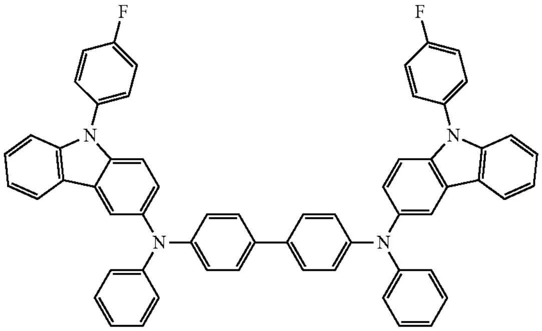
HT31
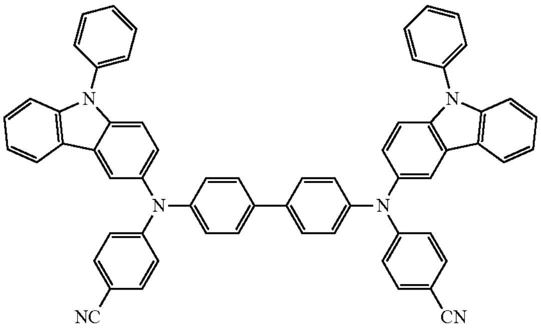

-continued
HT32
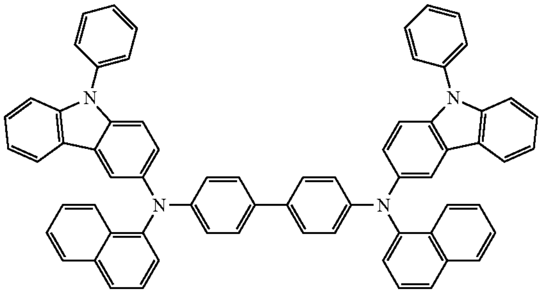
HT33
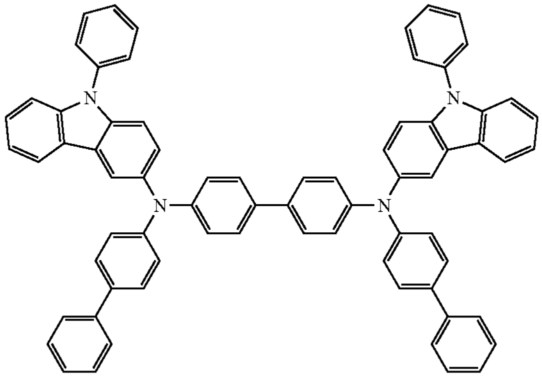
HT34
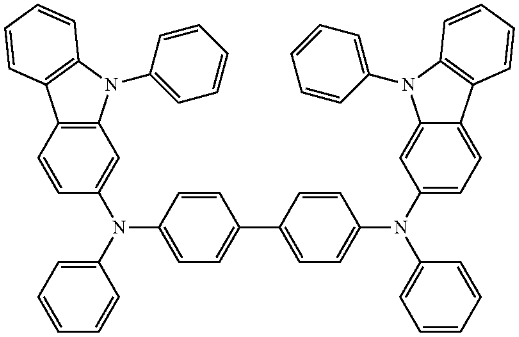
HT35
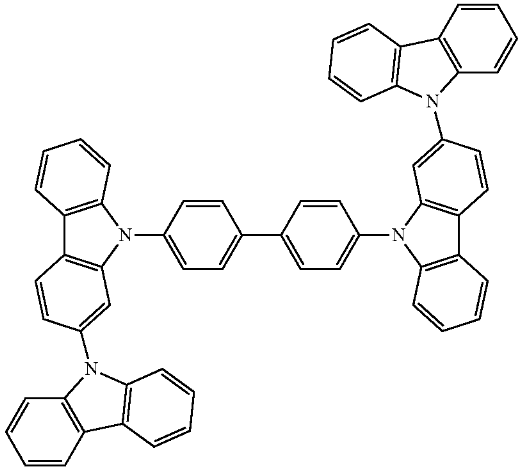
HT36
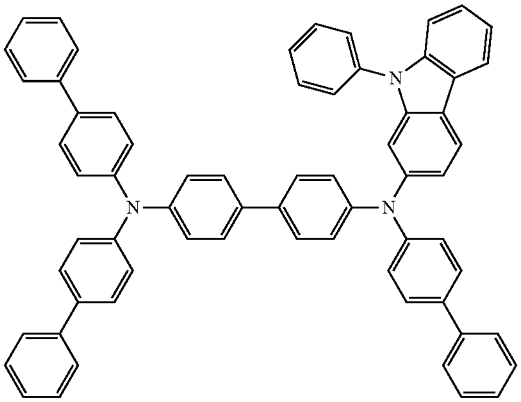
HT37
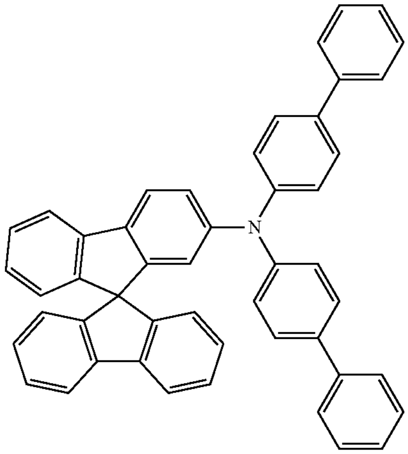

-continued
HT38
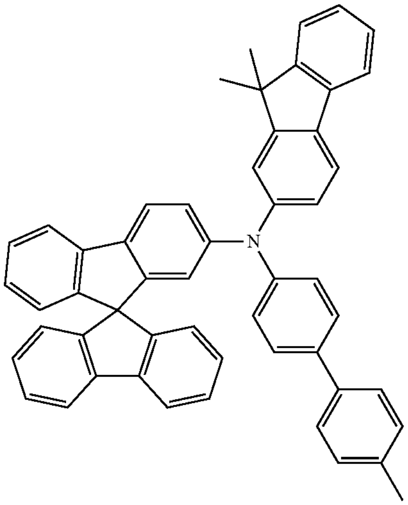
HT39
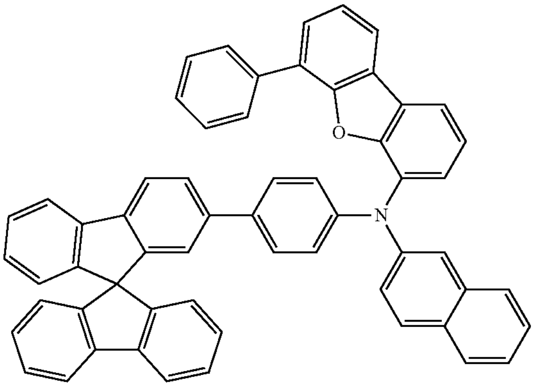
HT40
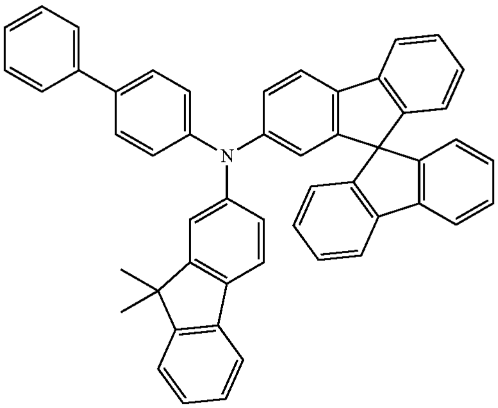
HT41
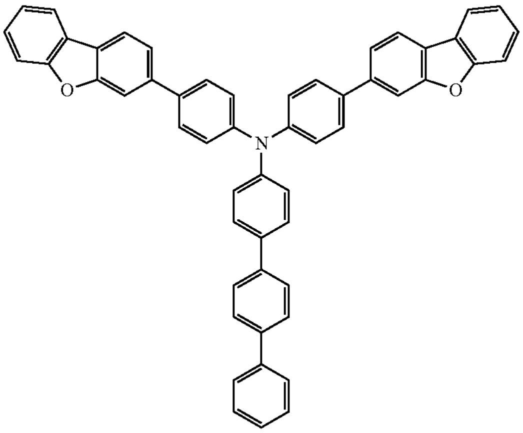
HT42
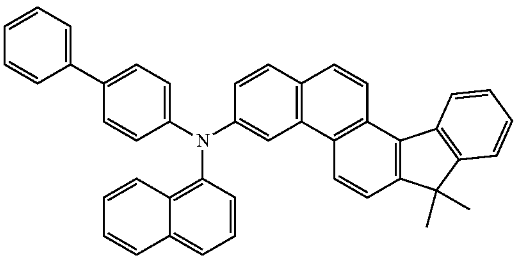
HT43
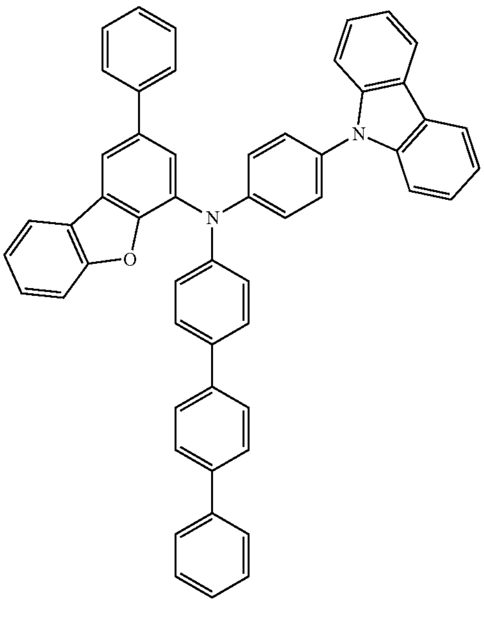

-continued
HT44
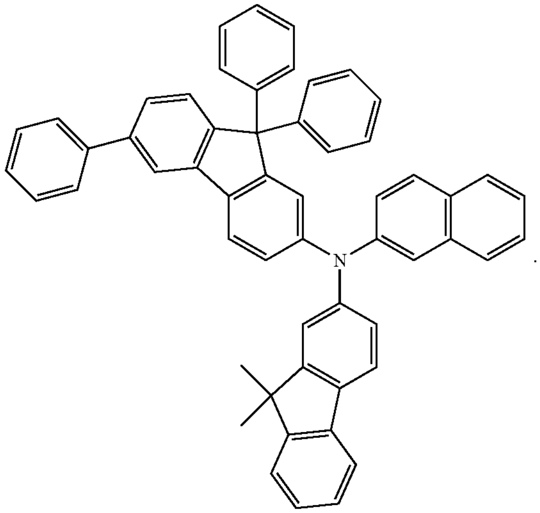
HT45
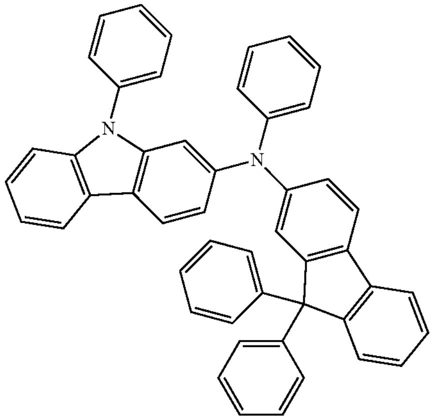
HT46
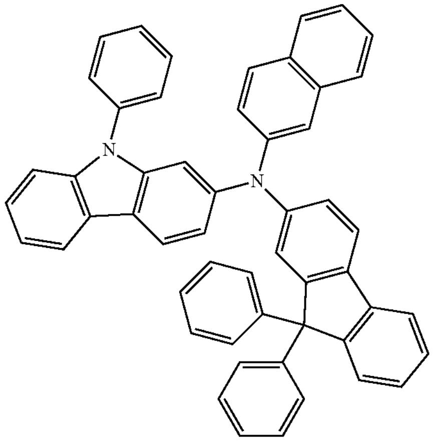
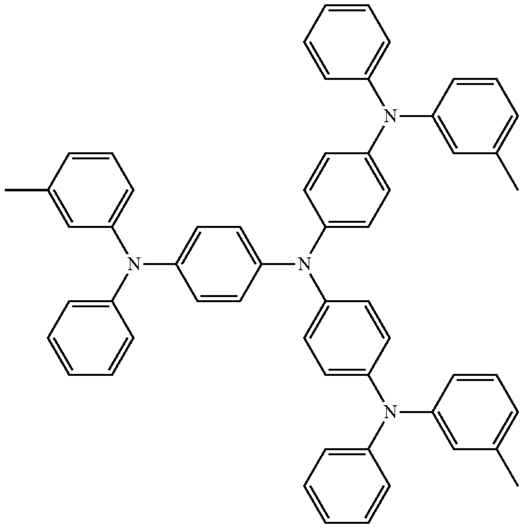
m-MTDATA
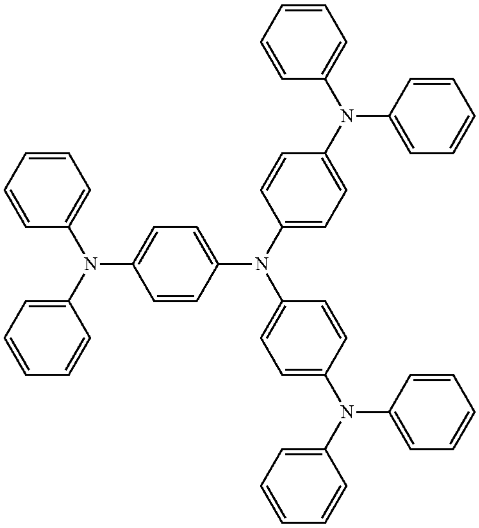
TDATA -continued
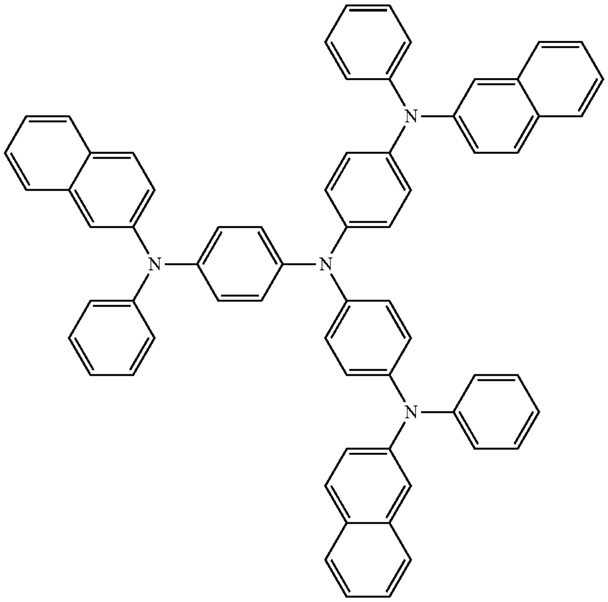
2-TNATA
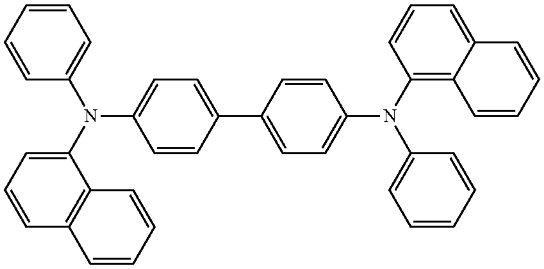
NPB
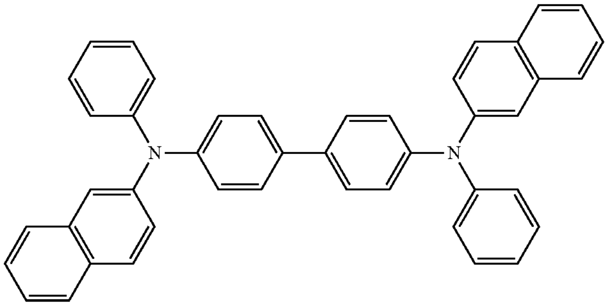
β-NPB
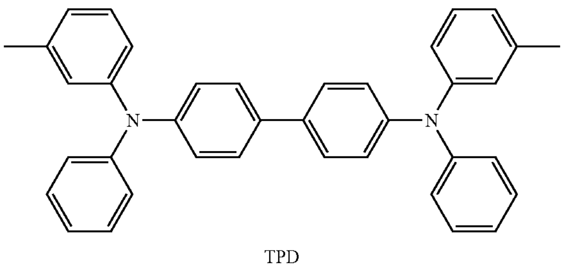
TPD
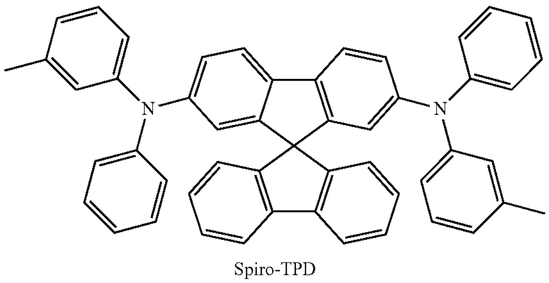
Spiro-TPD -continued

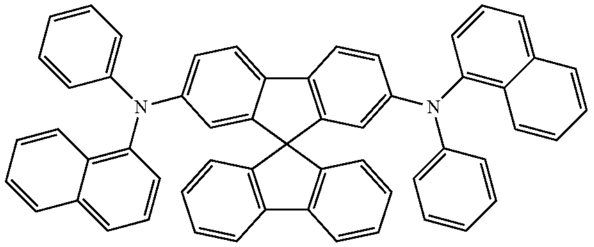

Spiro-NPB

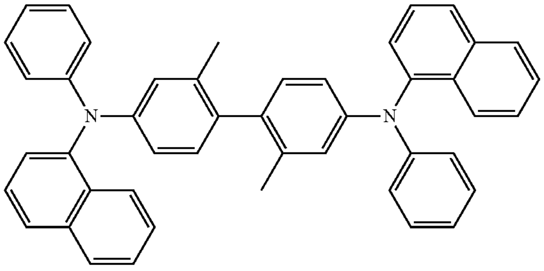

methylated-NPB

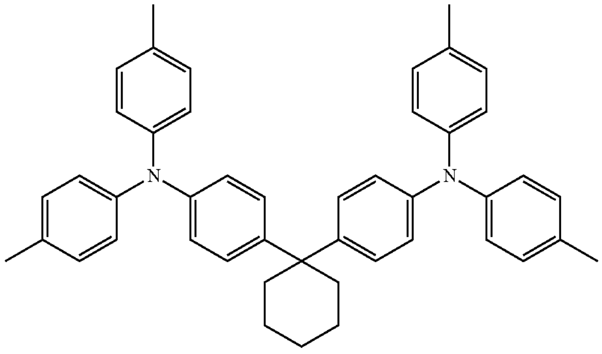

TAPC

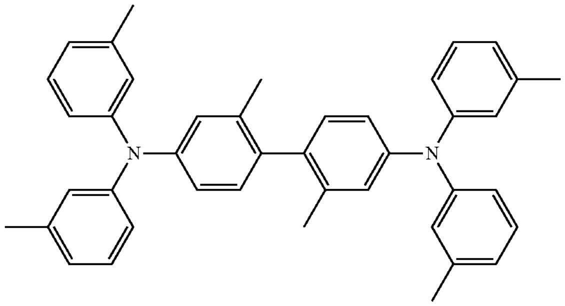

HMTPD

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory (suitable) hole-transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may be included in the emission auxiliary layer and/or the electron blocking layer.

p-Dopant

The hole transport region may further include, in addition to these materials, a charge-generation material for the improvement of conductive properties. The charge-generation material may be substantially uniformly or non-uniformly dispersed in the hole transport region (for example, in the form of a single layer consisting of a charge-generation material).

The charge-generation material may be, for example, a p-dopant.

In an embodiment, a LUMO energy level of the p-dopant may be about −3.5 eV or less.

In an embodiment, the p-dopant may include a quinone derivative, a cyano group-containing compound, a compound containing element EL1 and element EL2, or one or more combinations thereof.

Examples of the quinone derivative may include TCNQ, F4-TCNQ, and/or the like.

Examples of the cyano group-containing compound may include HAT-CN, a compound represented by Formula 221, and/or the like.

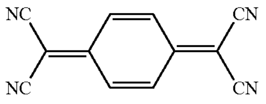

TCNQ

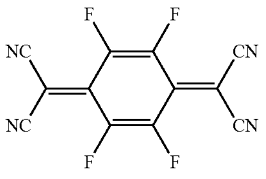

F4-TCNQ

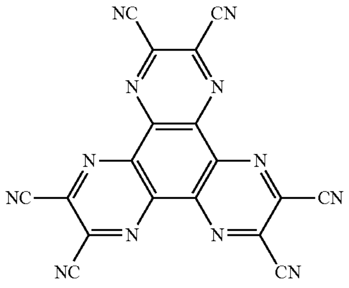

HAT-CN

Formula 221

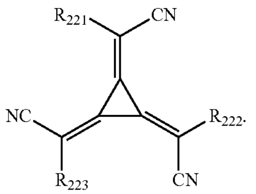

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or one or more combinations thereof.

In the compound containing element EL1 and element EL2, element EL1 may be metal, metalloid, or a combination thereof, and element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and/or tellurium (Te).

Examples of the non-metal may include oxygen (O) and/or halogen (for example, F, Cl, Br, I, etc.).

In an embodiment, examples of the compound containing element EL1 and element EL2 may include metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or one or more combinations thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Examples of the metal halide may include alkali metal halide, alkaline earth metal halide, transition metal halide, post-transition metal halide, and/or lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbC_{13}$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WC_{13}$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdC_{12}$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and/or $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and/or lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or a combination thereof.

An amount of the dopant in the emission layer may be from about 0.01 parts by weight to about 15 parts by weight based on 100 parts by weight of the host.

In an embodiment, the emission layer may include a quantum dot.

In an embodiment, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within the range, excellent or suitable light-emission characteristics may be obtained without a substantial increase in driving voltage.

Host

The host may include a compound represented by Formula 301

Formula 301

$$[Ar_{301}]_{xb11}—[(L_{301})_{xb1}—R_{301}]_{xb21}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or a combination thereof:

Formula 301-1

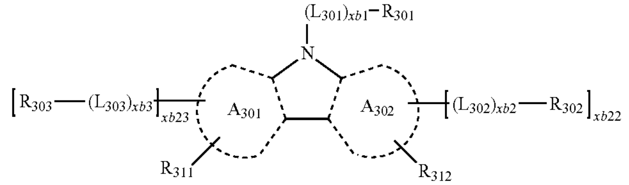

-continued

Formula 301-2

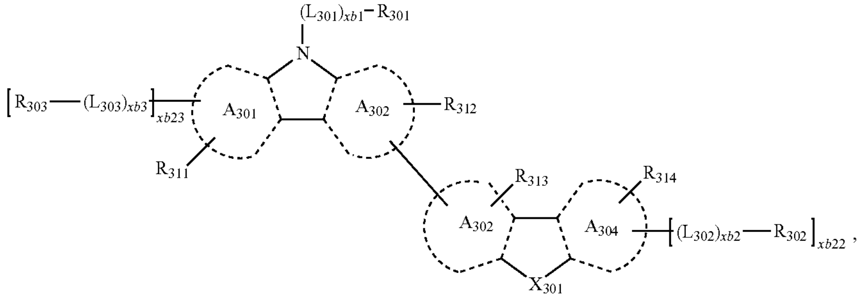

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described in the present disclosure, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or one or more combinations thereof.

In an embodiment, the host may include at least one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4"-bis(N-carbazolyl)-1,1'-biphenyl (CBP), 1,3-di-9-carbazolylbenzene (mCP), 1,3,5-tri(carbazol-9-yl)benzene (TCP), or one or more combinations thereof:

H1

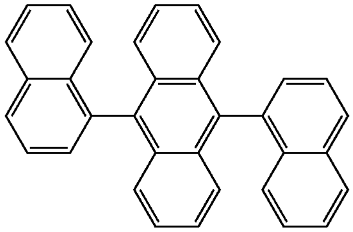

H2

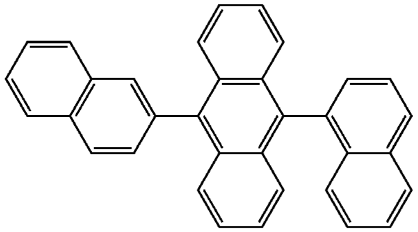

-continued

H3

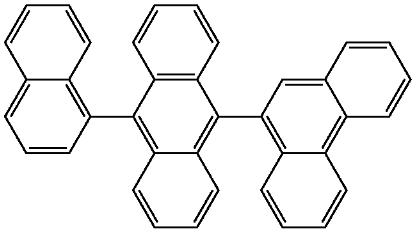

H4

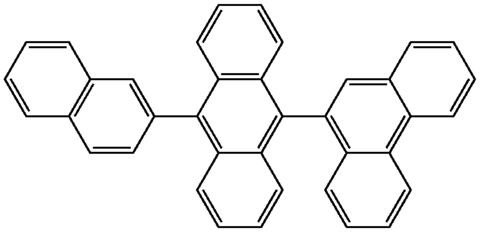

H5

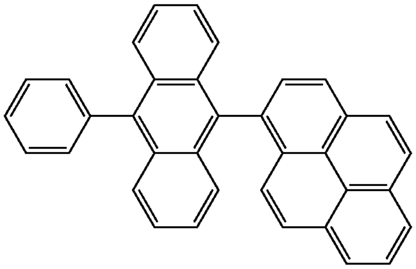

H6

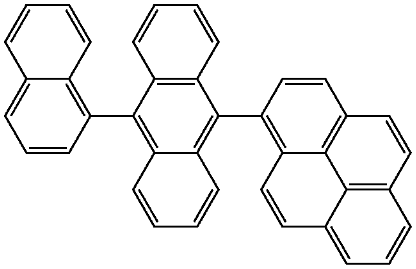

-continued
H7
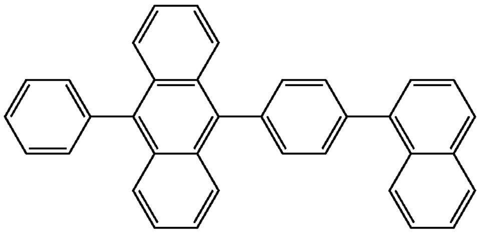
H8
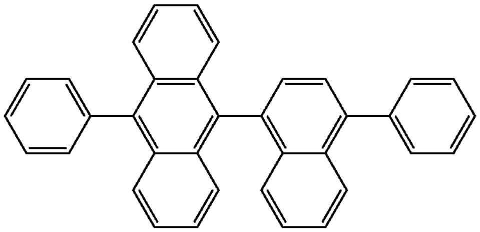
H9
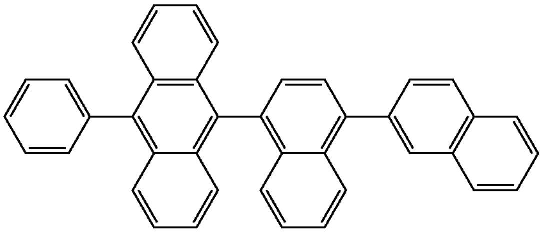
H10
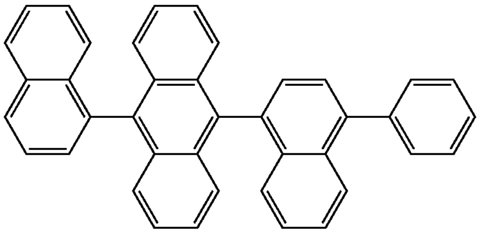
H11
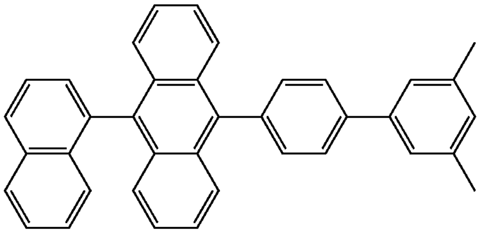
H12
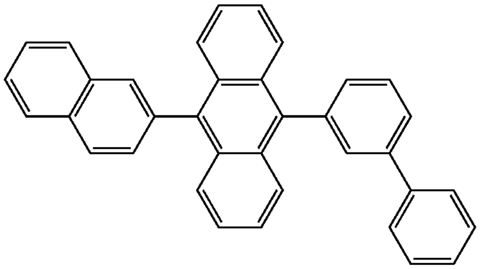
-continued
H13
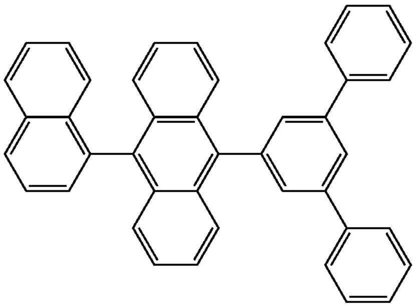
H14
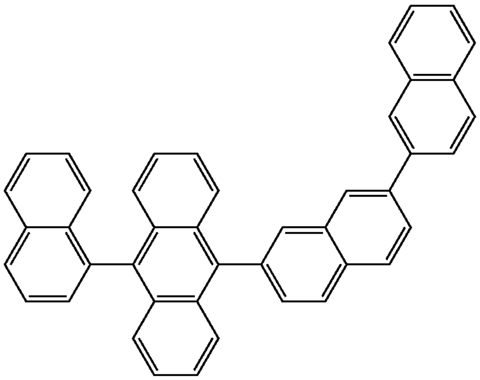
H15
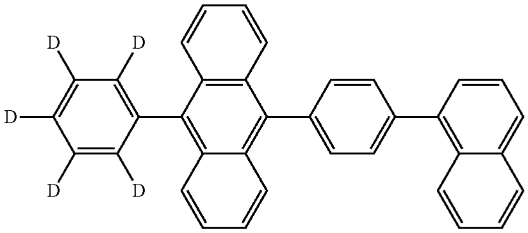
H16
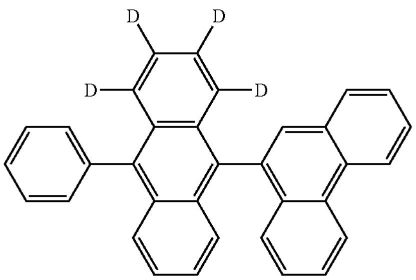
H17
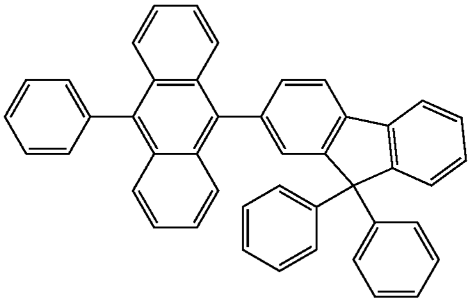

-continued
H18
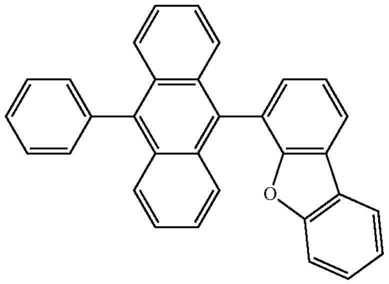
H19
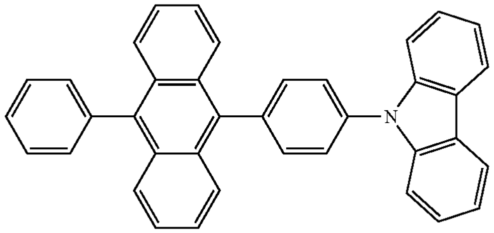
H20
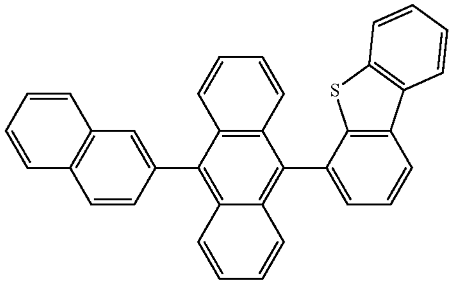
H21
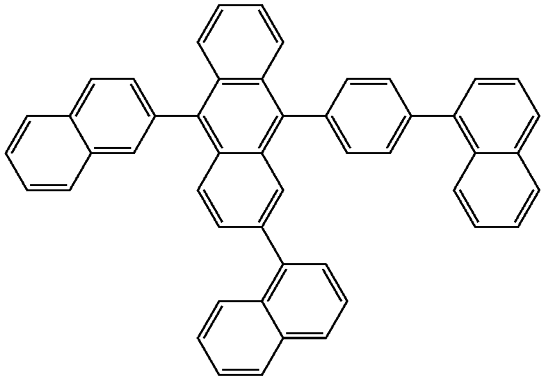
-continued
H22
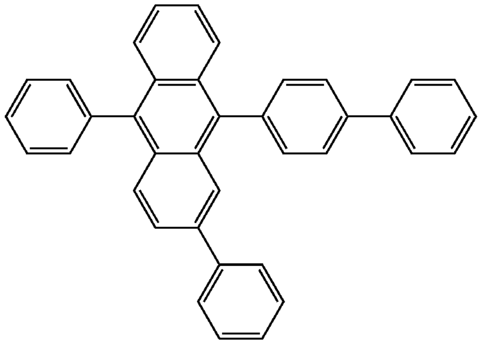
H23
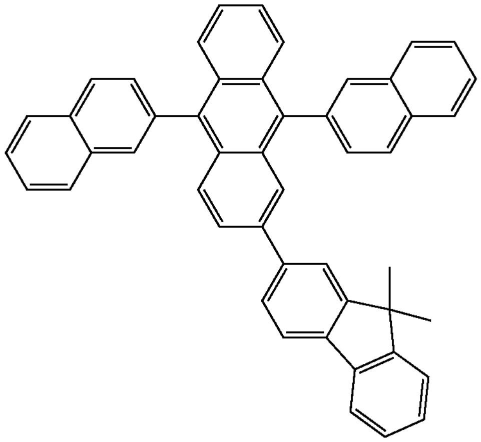
H24
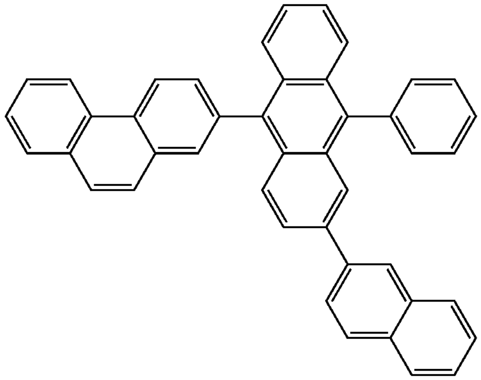

-continued
H25
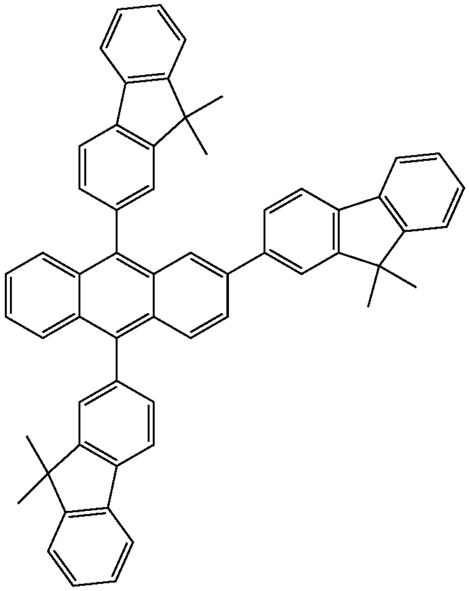
H26
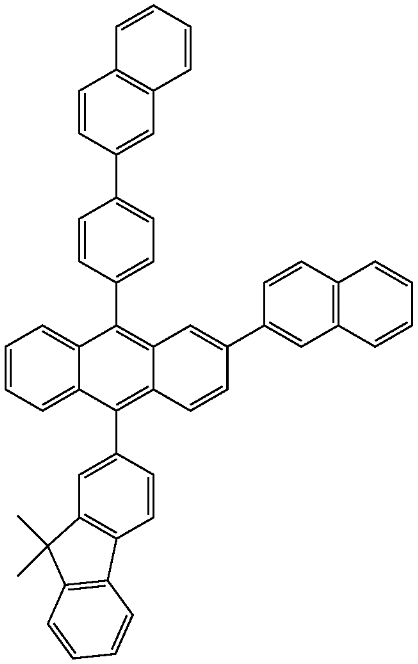
-continued
H27
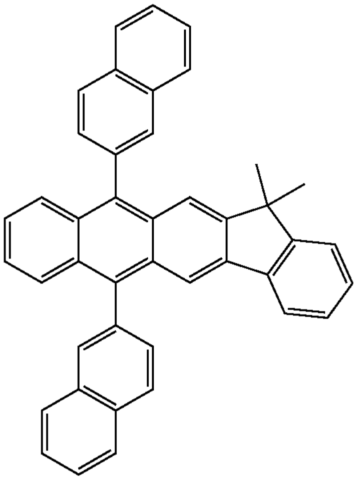
H28
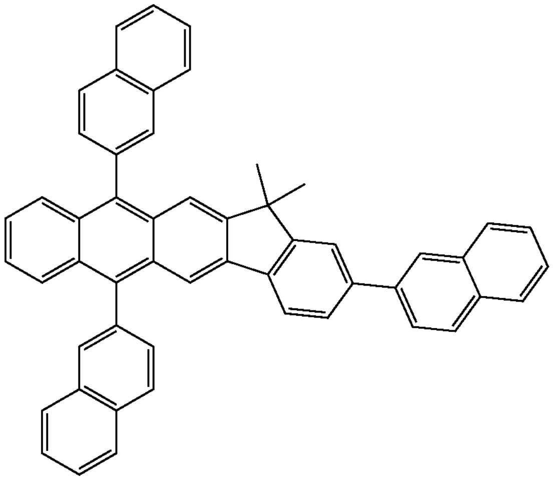
H29
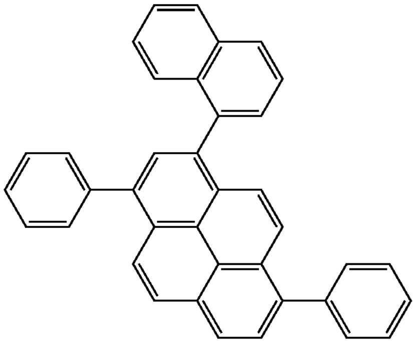

-continued
H30
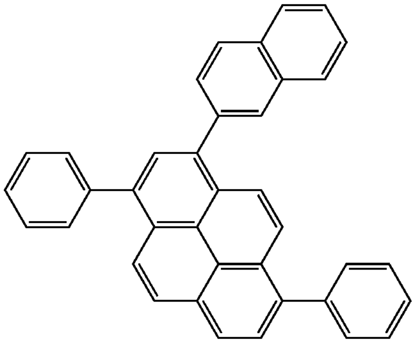
H31
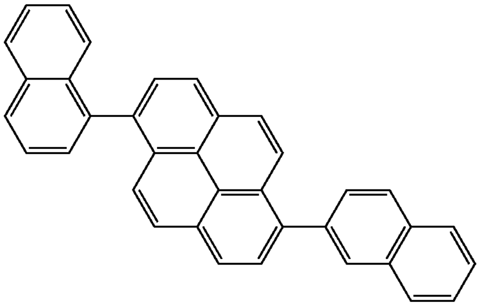
H32
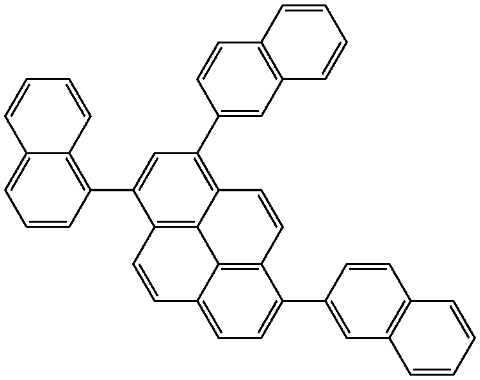
H33
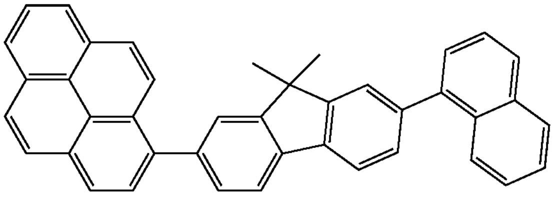
H34
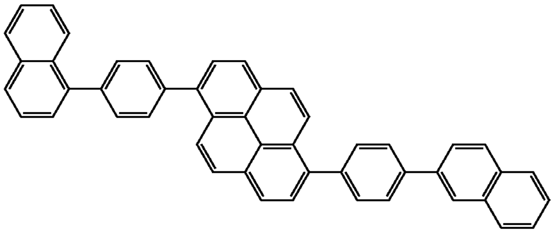
-continued
H35
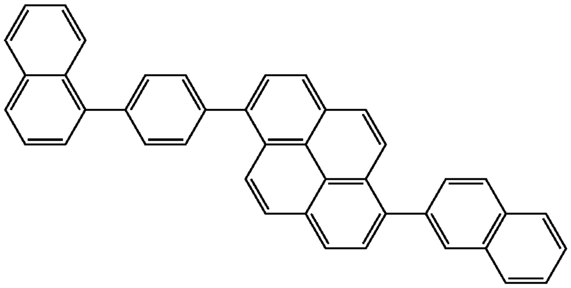
H36
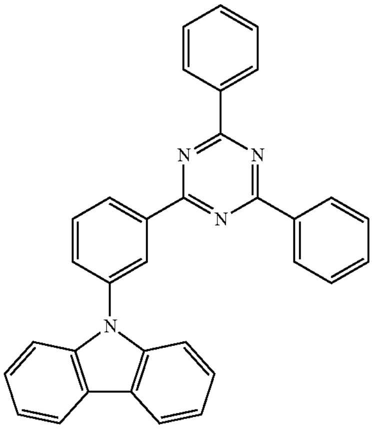
H37
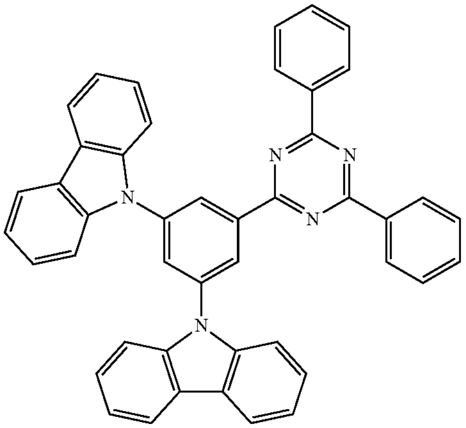
H38
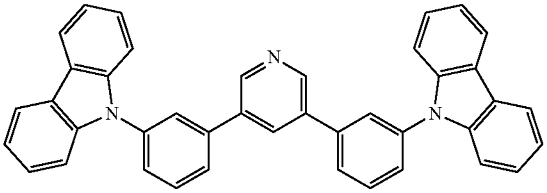

-continued
H39
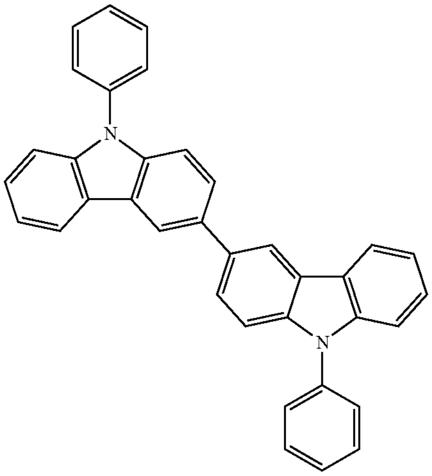
H40
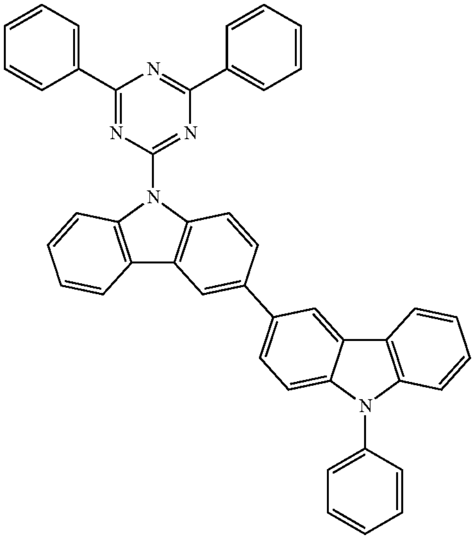
H41
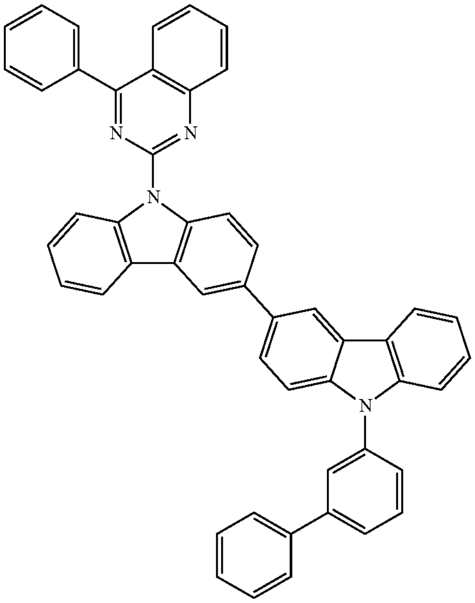
-continued
H42
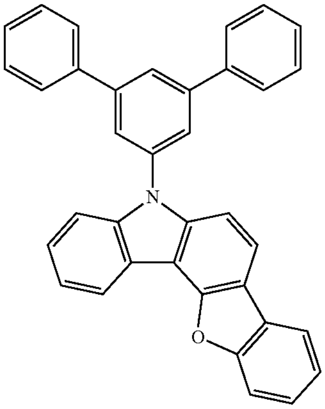
H43
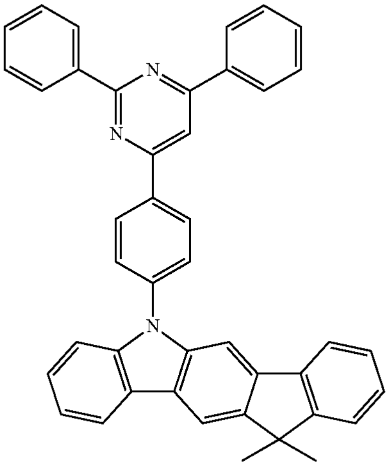
H44
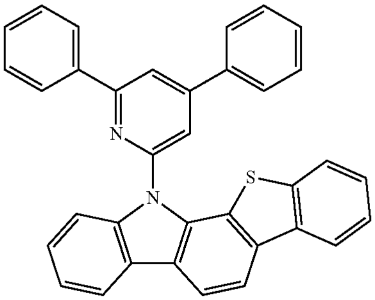
H45
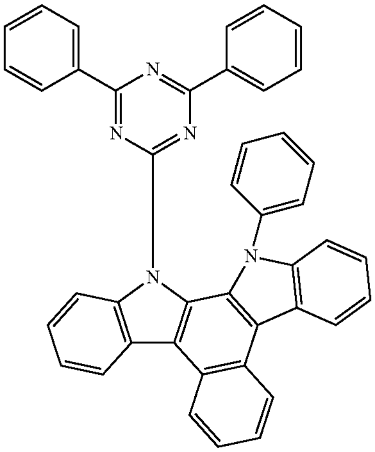

-continued
H46
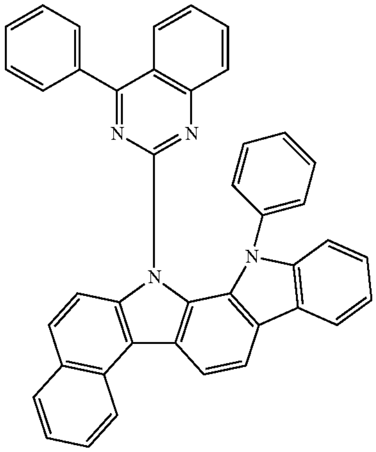
H47
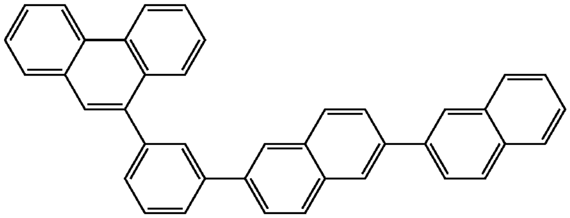
H48
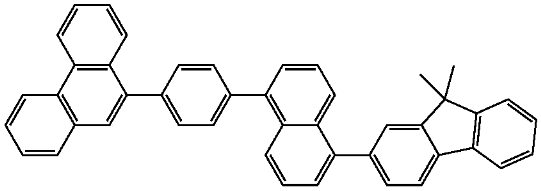
H49
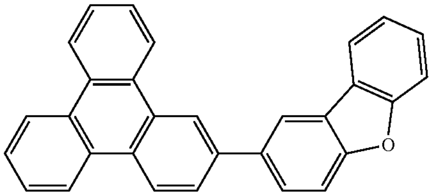
H50
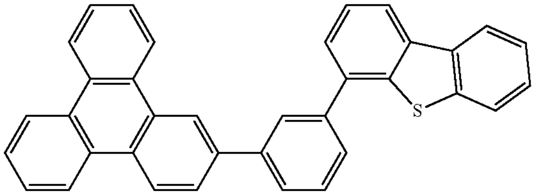
H51
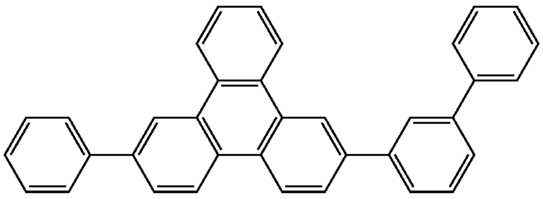
-continued
H52
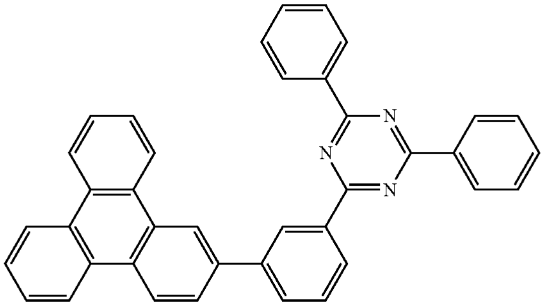
H53
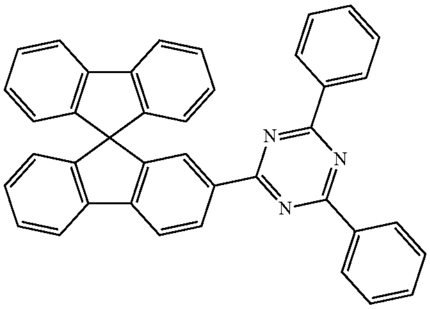
H54
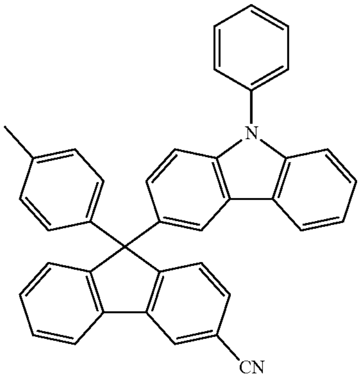
H55
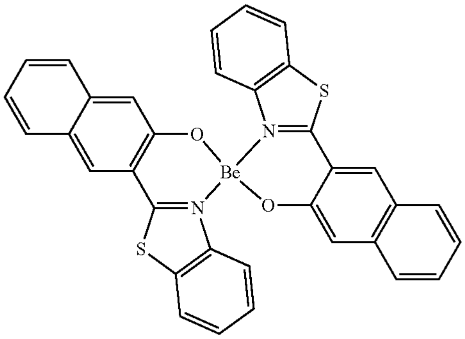

-continued
H56
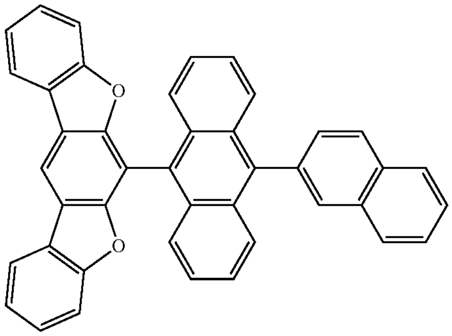
H57
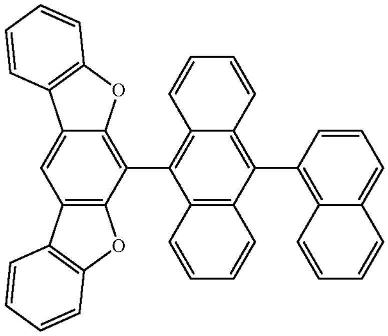
H58
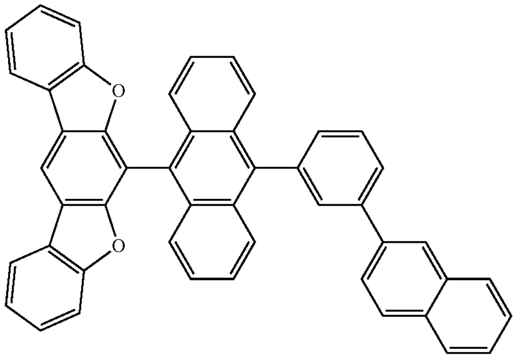
H59
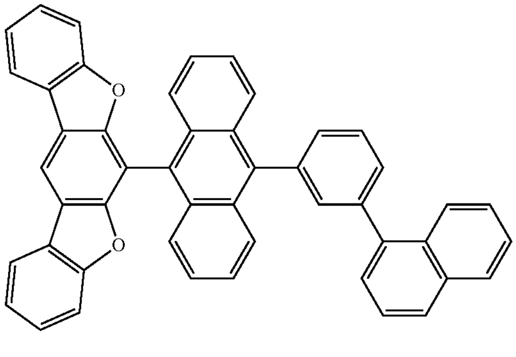
-continued
H60
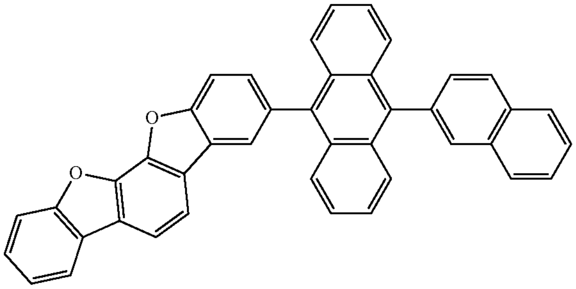
H61
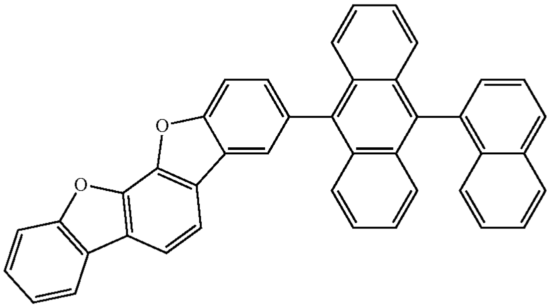
H62
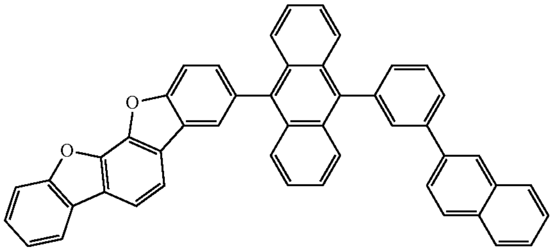
H63
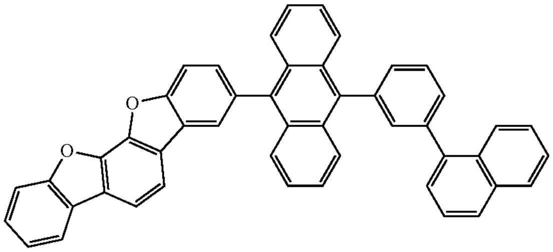
H64
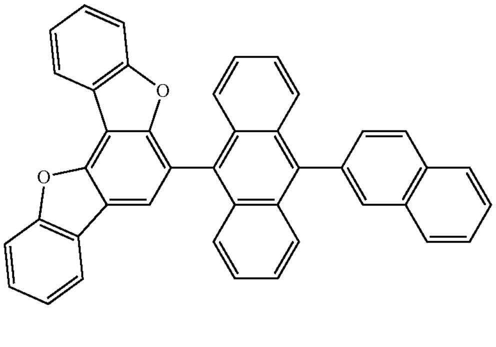

-continued
H65
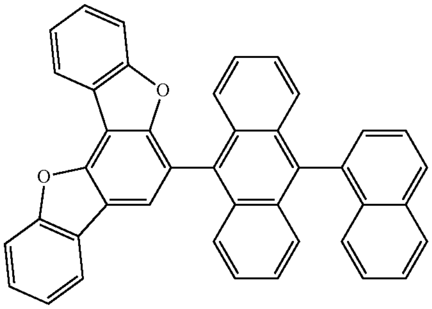
H66
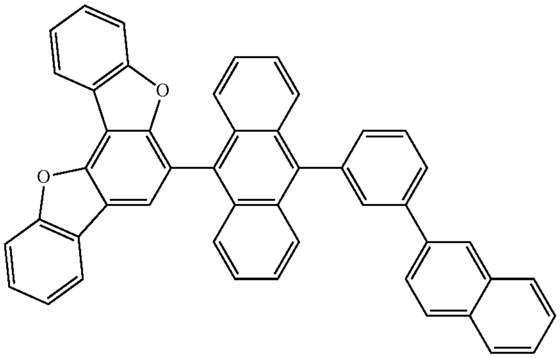
H67
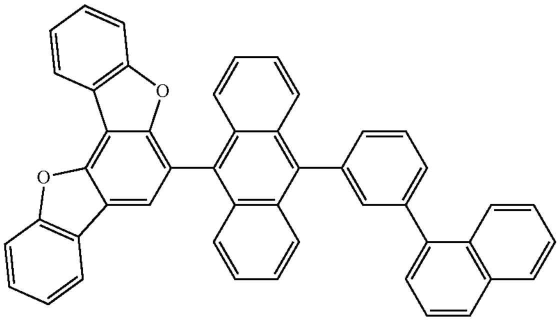
H68
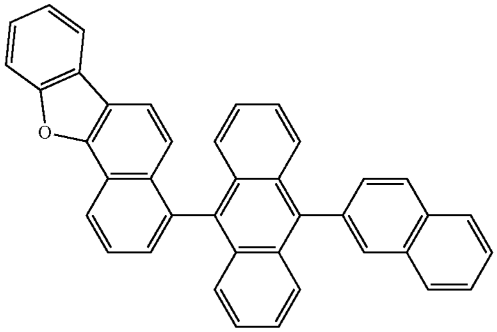
-continued
H69
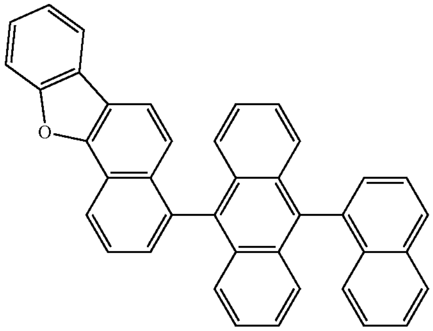
H70
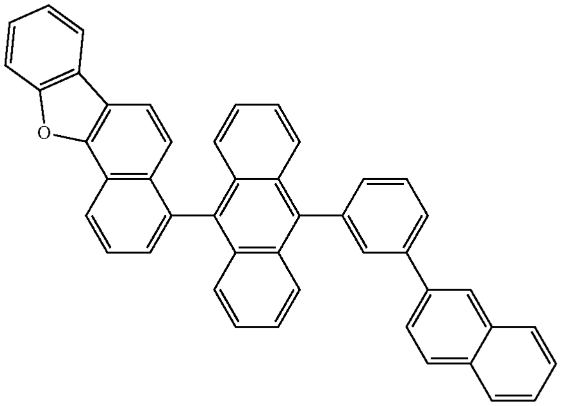
H71
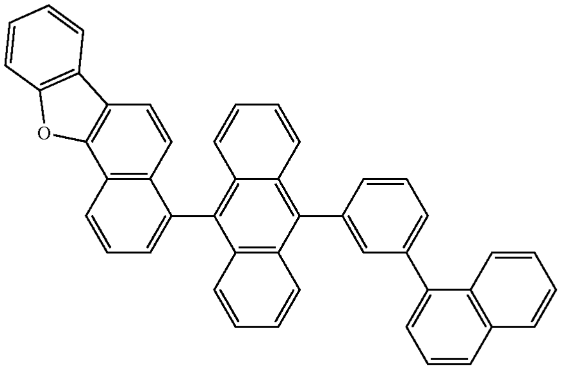
H72
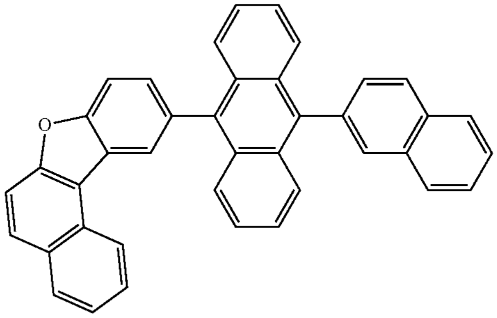

-continued
H73
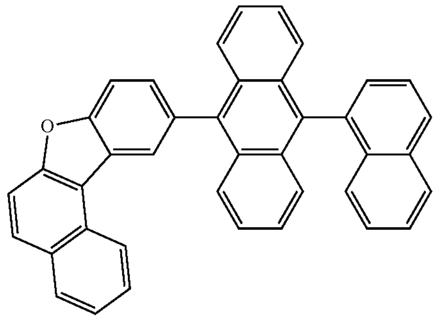
H74
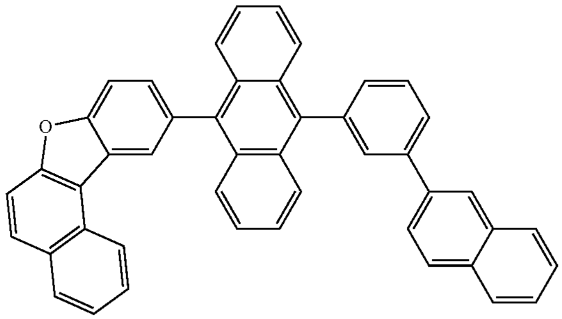
H75
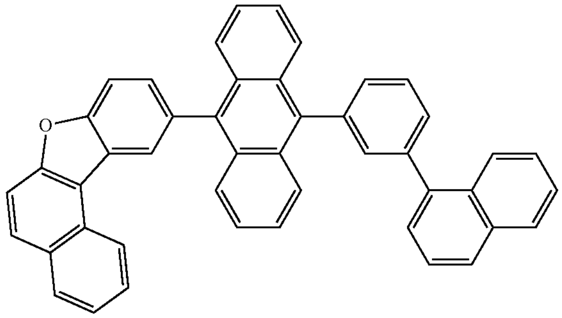
H76
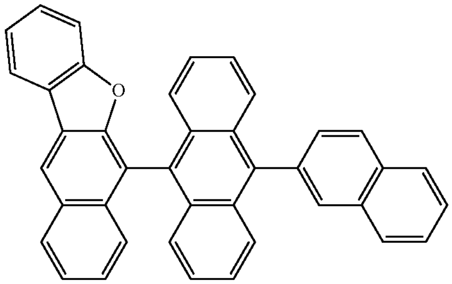
H77
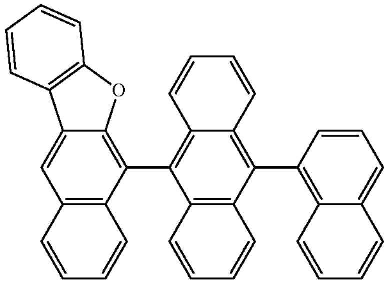
-continued
H78
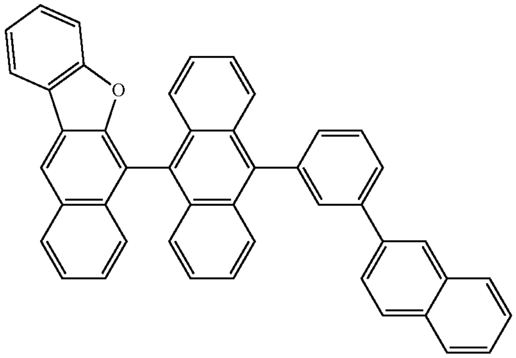
H79
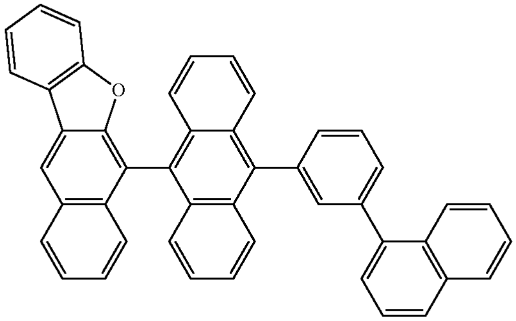
H80
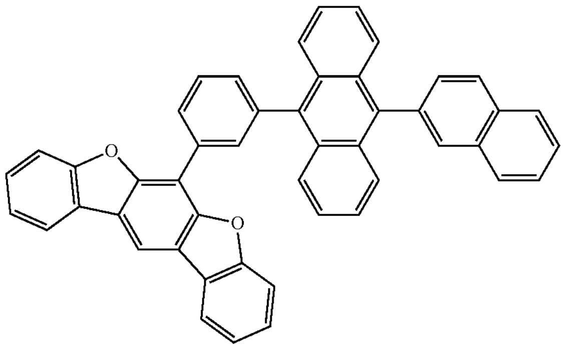
H81
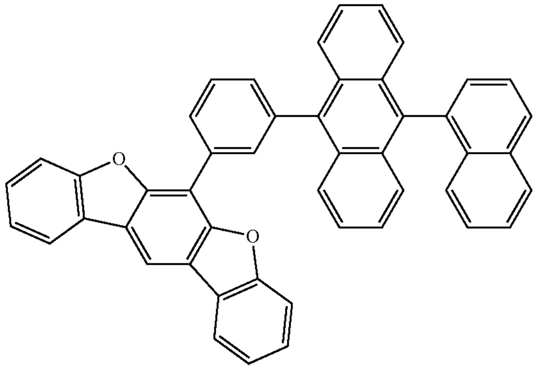

-continued
H82
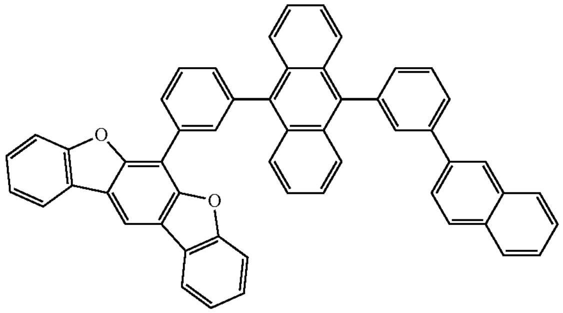
H83
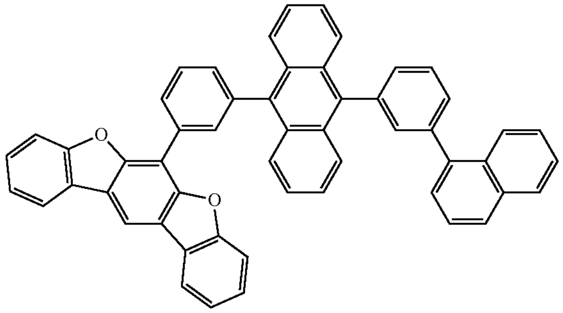
H84
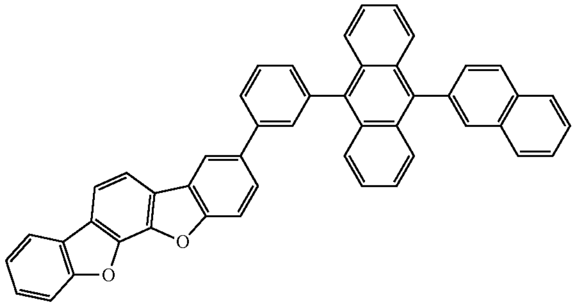
H85
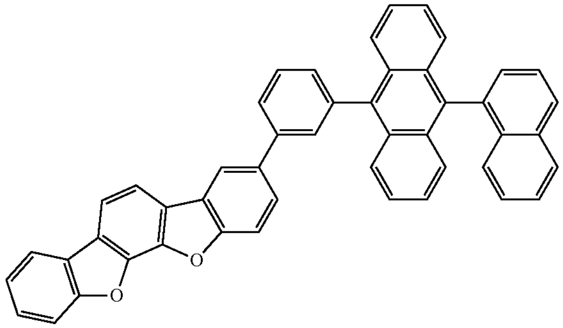
-continued
H86
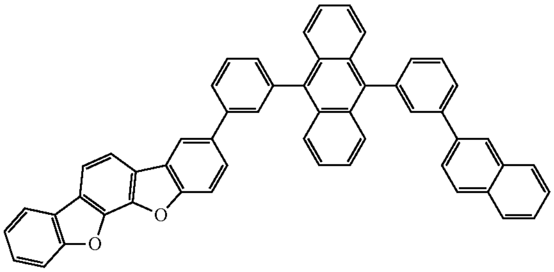
H87
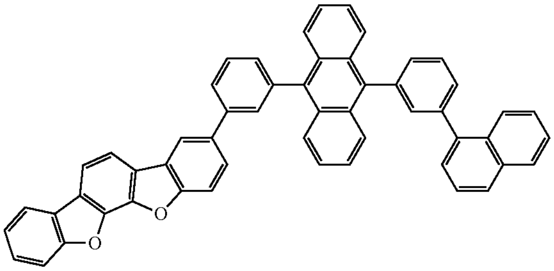
H88
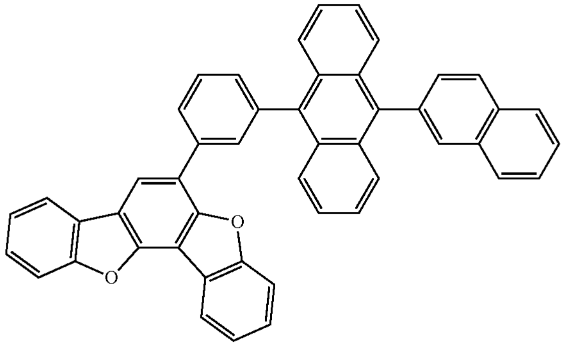
H89
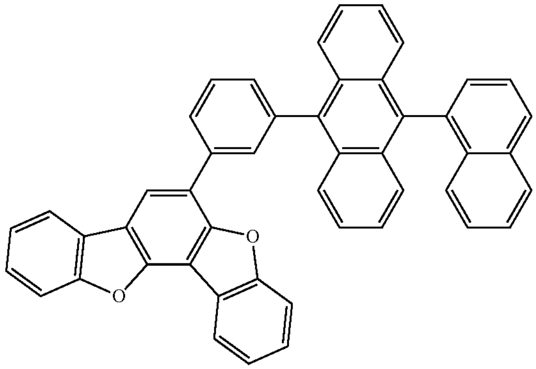

-continued
H90
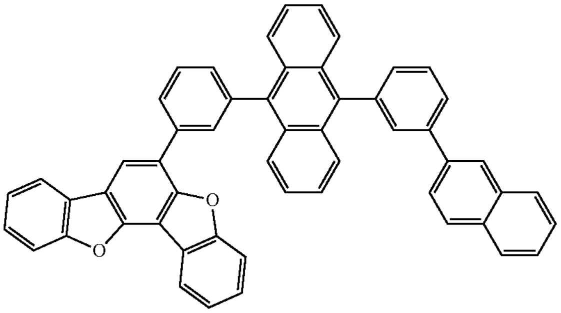
H91
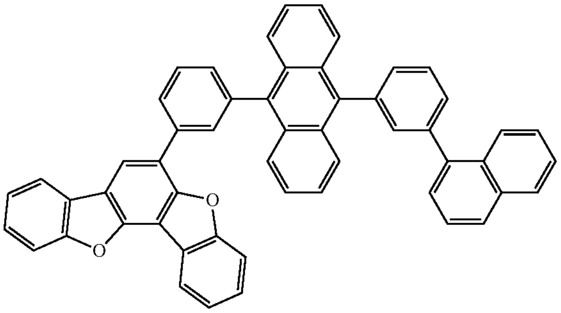
H92
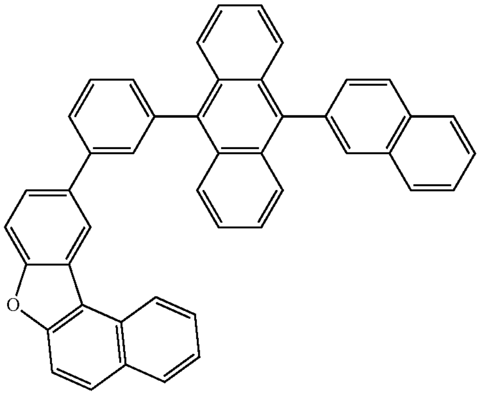
H93
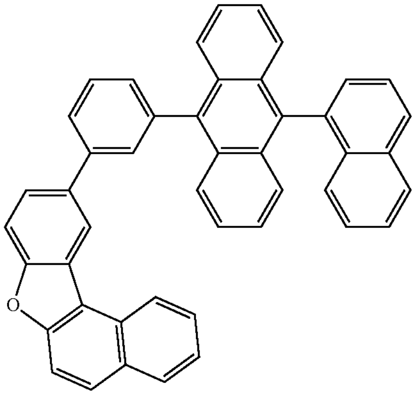
-continued
H94
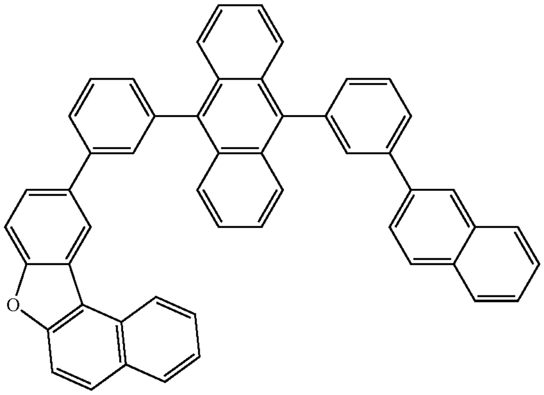
H95
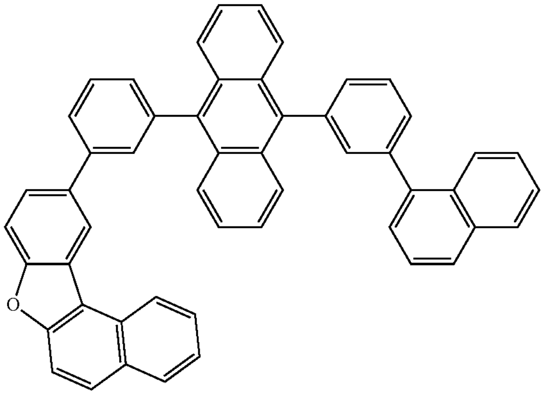
H96
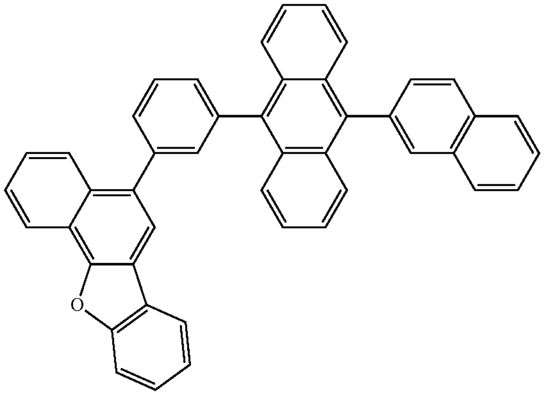
H97
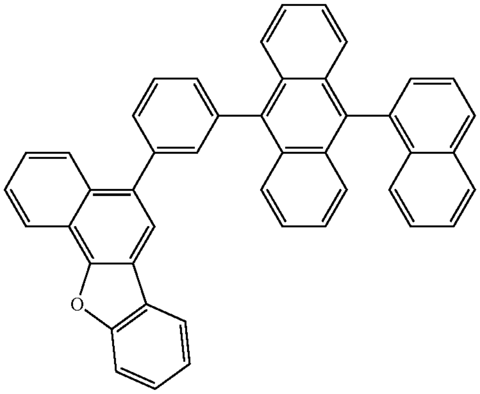

-continued
H98
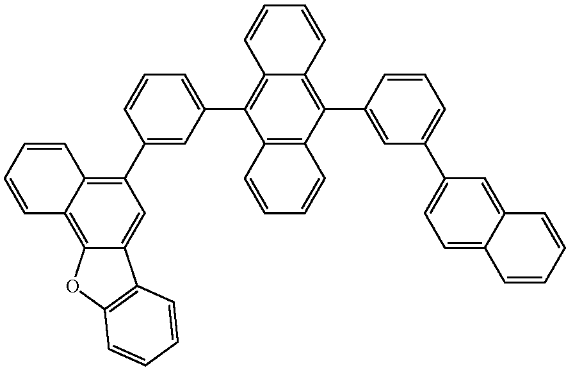
H99
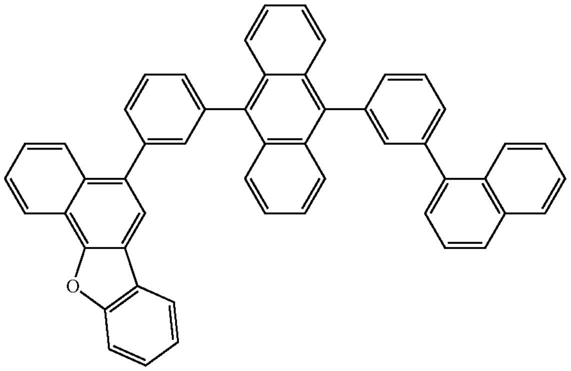
H100
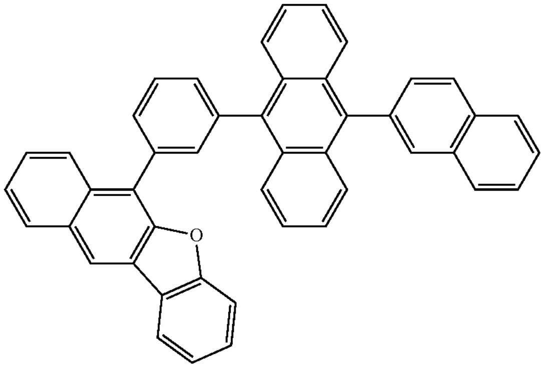
H101
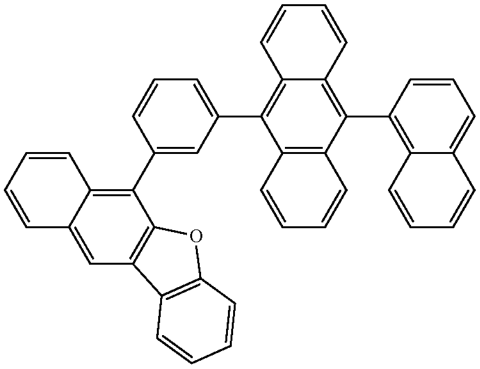
-continued
H102
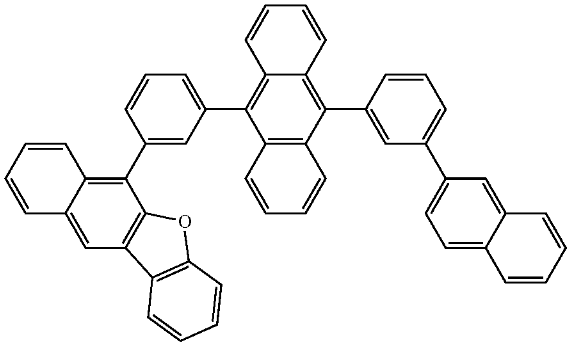
H103
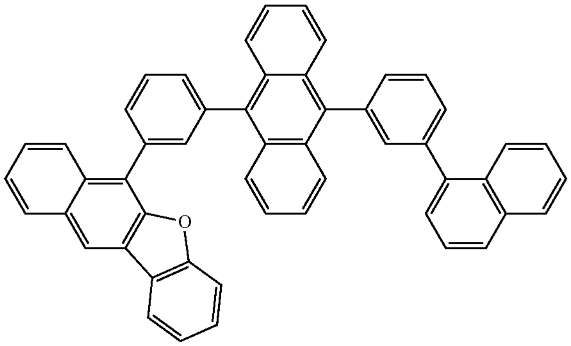
H104
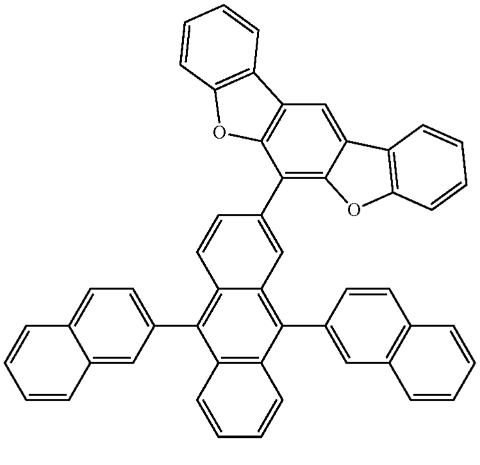

-continued
H105
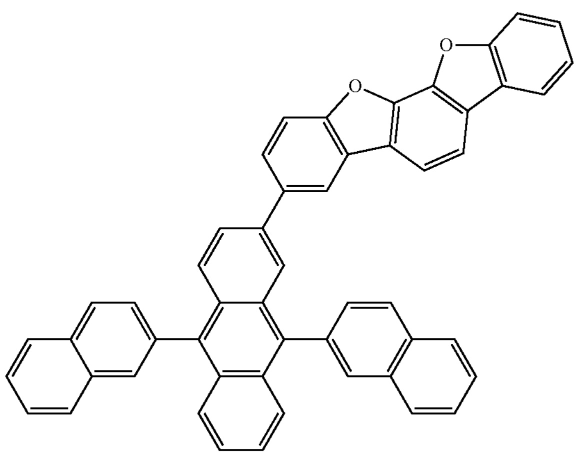
H106
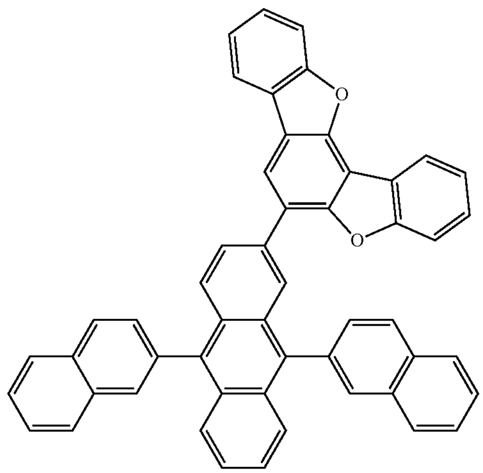
H107
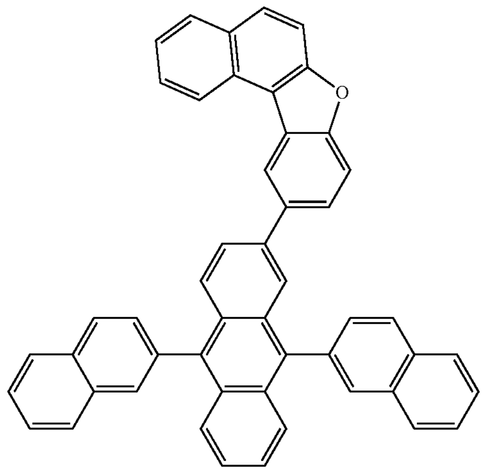
-continued
H108
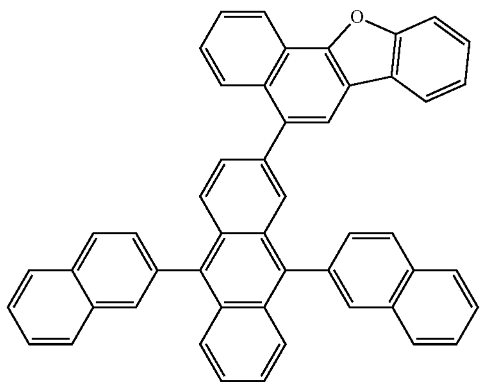
H109
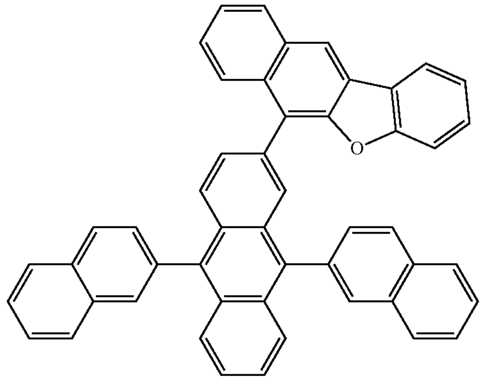
H110
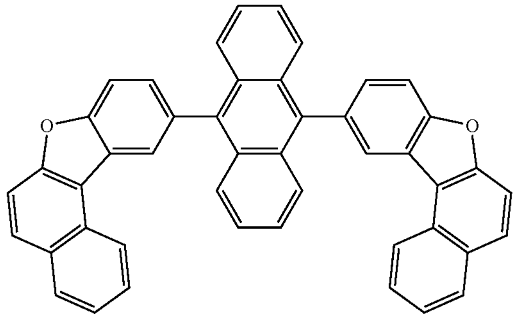
H111
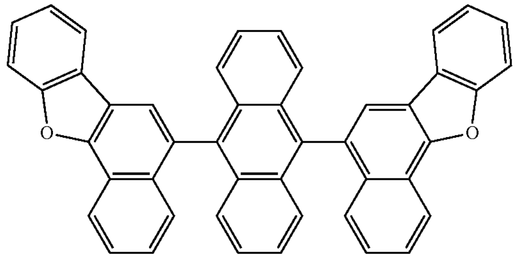

H112
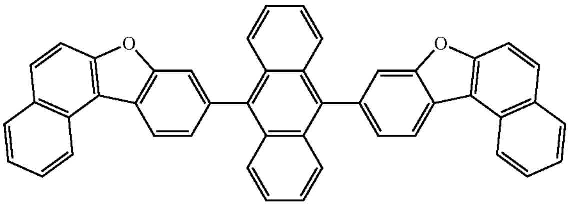
H113
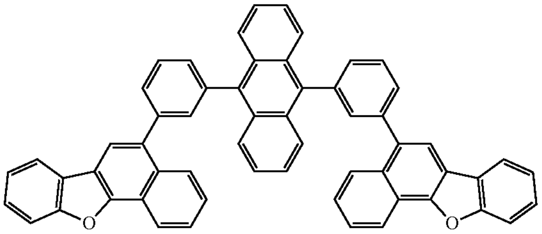
H114
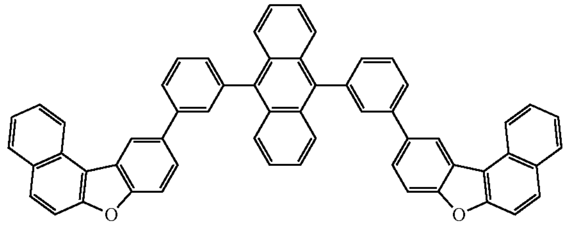
H115
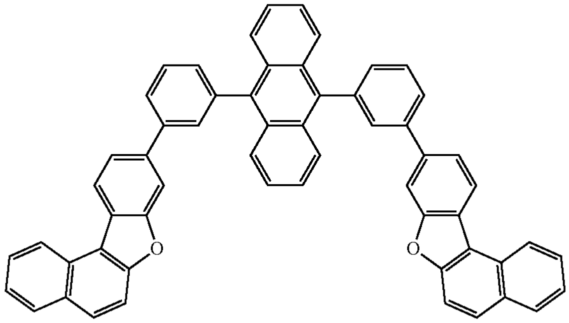
H116
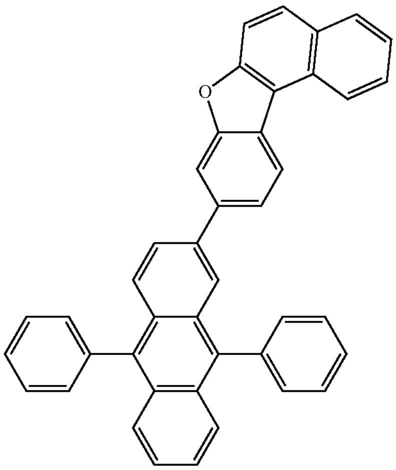
H117
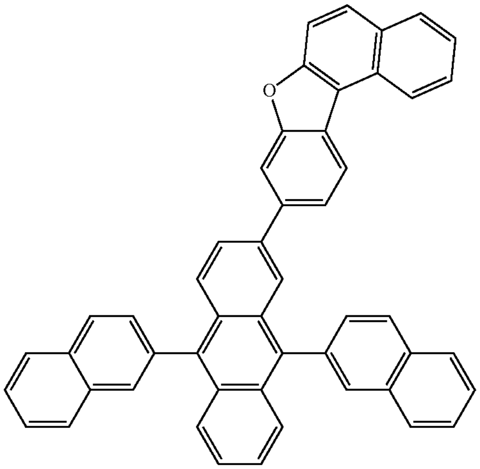
H118
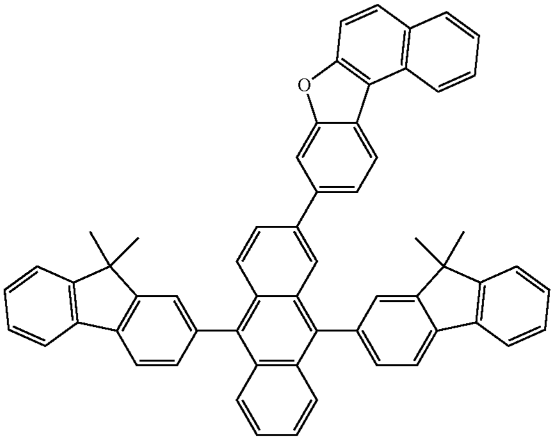
H119
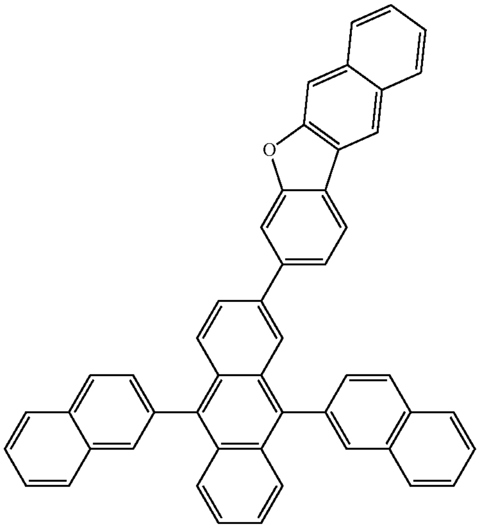

-continued

H120

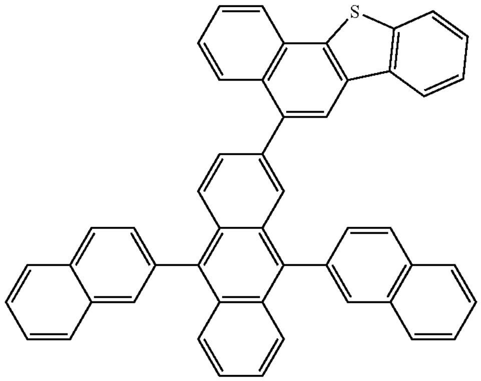

H121

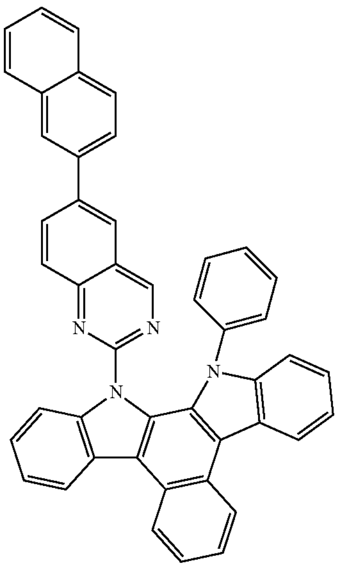

H122

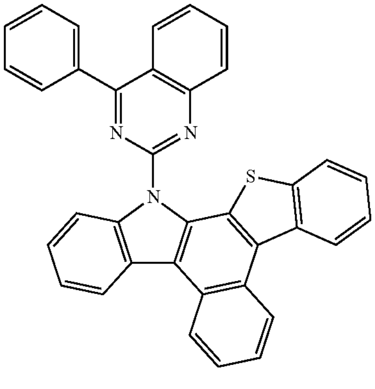

-continued

H123

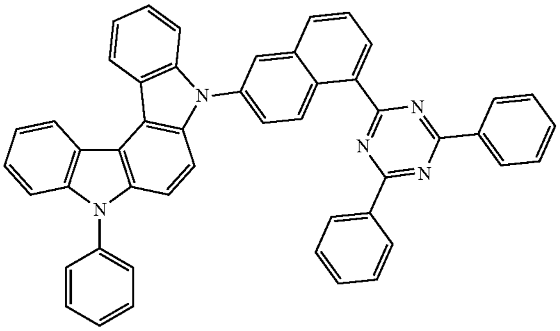

H124

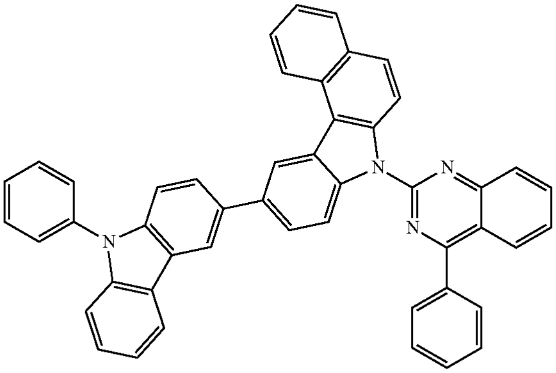

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or one or more combinations thereof.

The phosphorescent dopant may be electrically neutral.

In an embodiment, the phosphorescent dopant may include an organometallic compound represented by Formula 401:

Formula 401

$$M(L_{401})_{xc1}(L_{402})_{xc2}$$

Formula 402

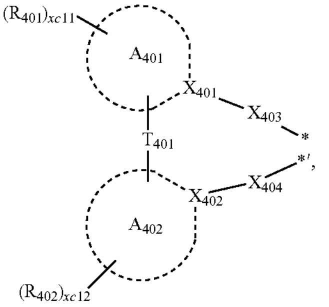

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or one or more combinations thereof.

The phosphorescent dopant may include, for example, at least one of compounds PD1 to PD39, or one or more combinations thereof:

PD1

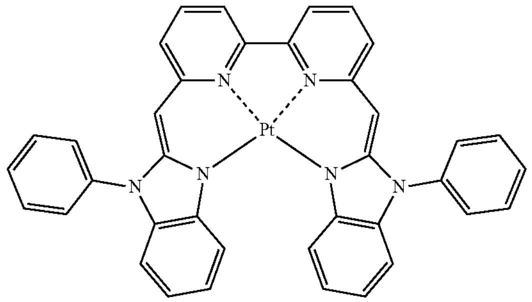

PD2

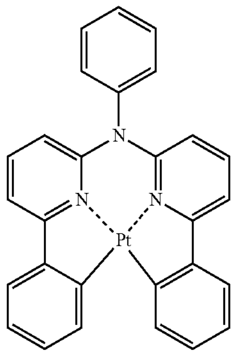

PD3

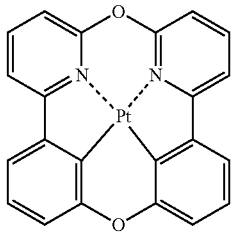

PD4

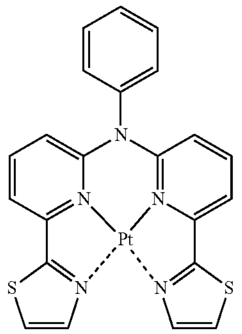

PD5

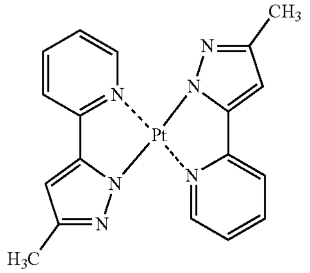

-continued
PD6
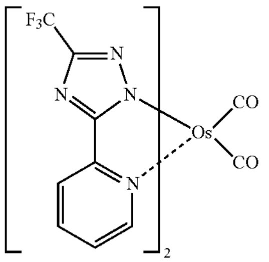
PD7
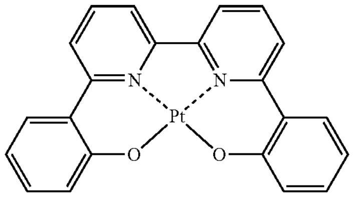
PD8
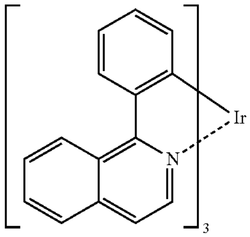
PD9
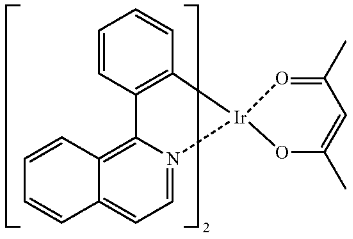
PD10
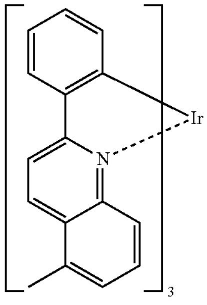
PD11
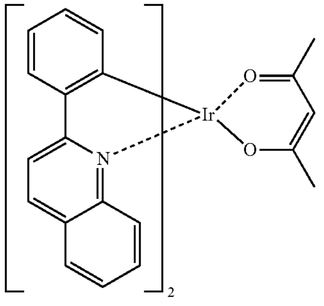
-continued
PD12
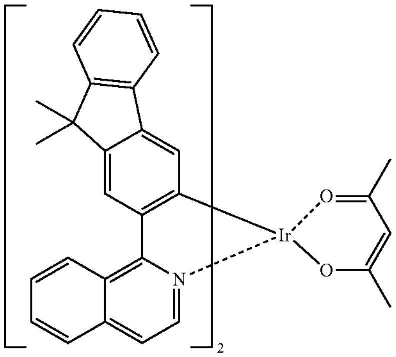
PD13
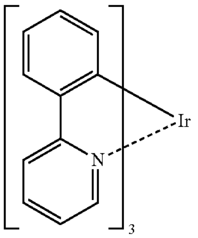
PD14
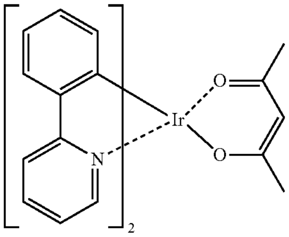
PD15
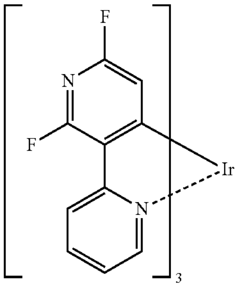
PD16
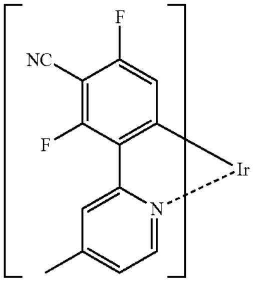

-continued
PD17
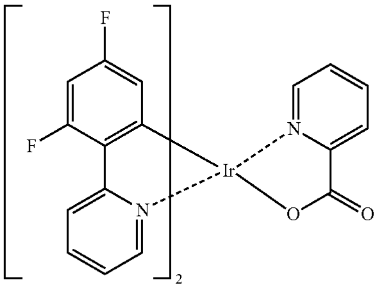
PD18
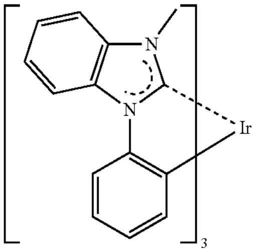
PD19
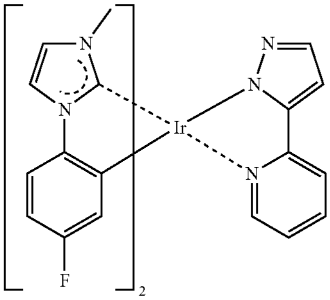
PD20
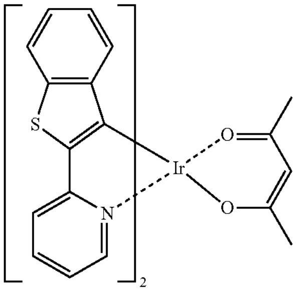
PD21
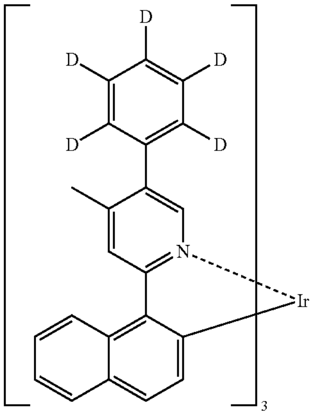
-continued
PD22
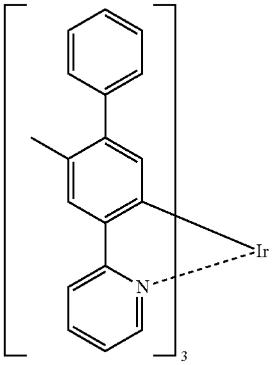
PD23
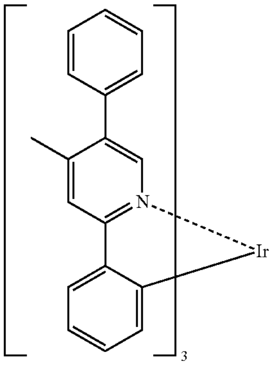
PD24
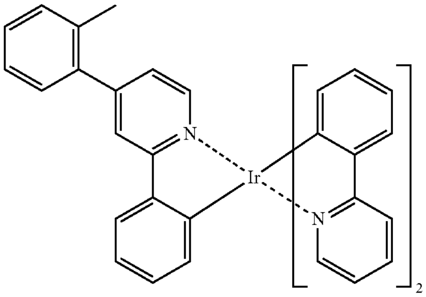
PD25
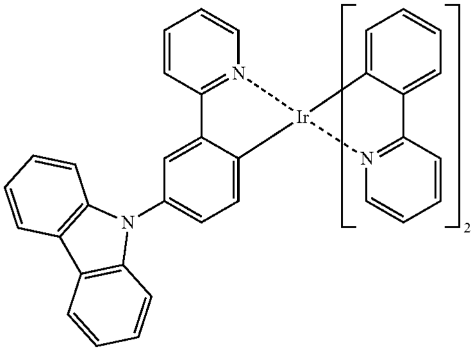

-continued
PD26
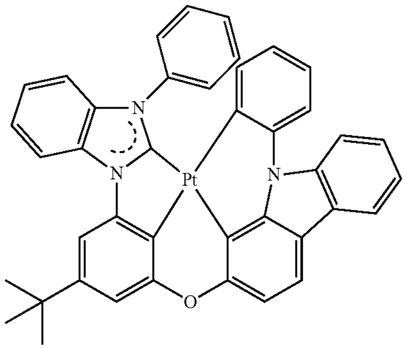
PD27
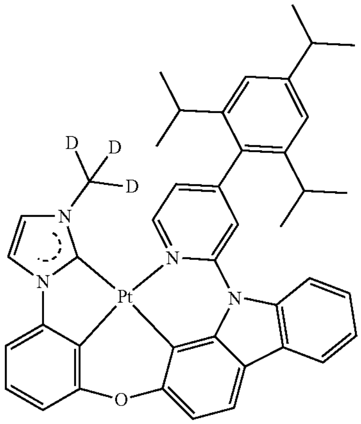
PD28
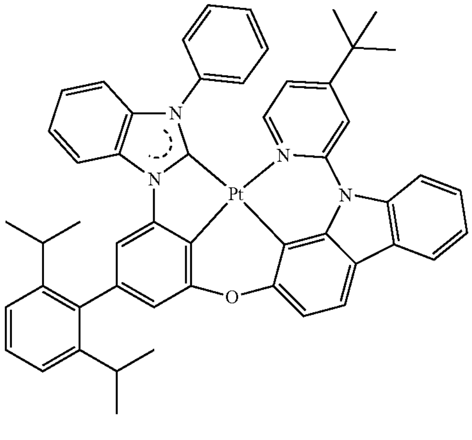
-continued
PD29
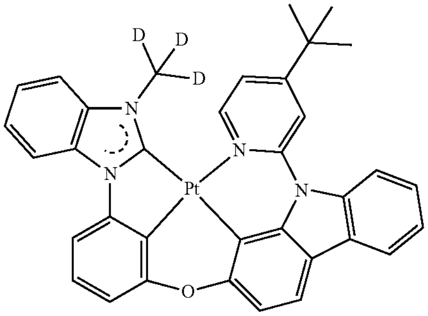
PD30
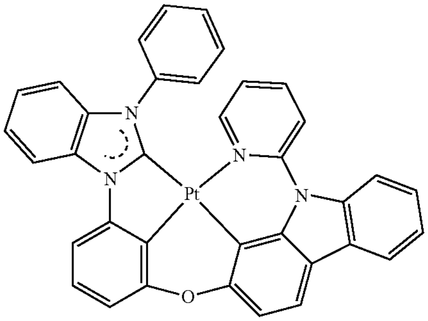
PD31
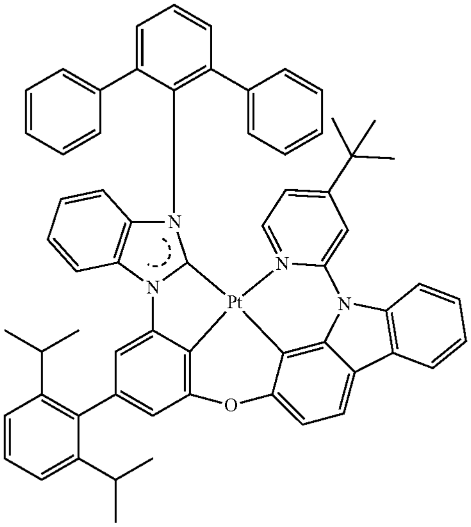

-continued
PD32
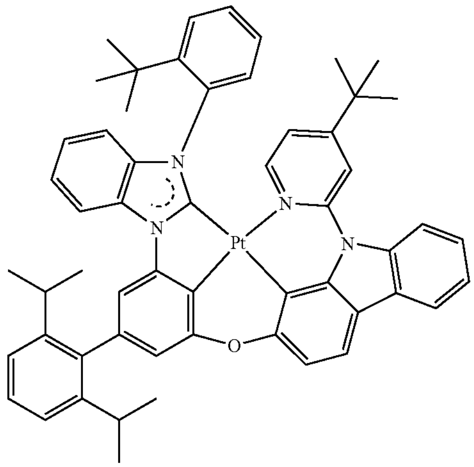
PD33
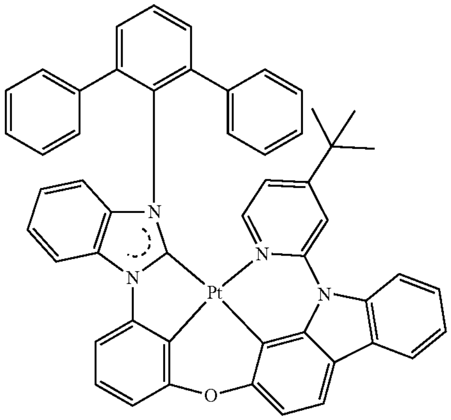
PD34
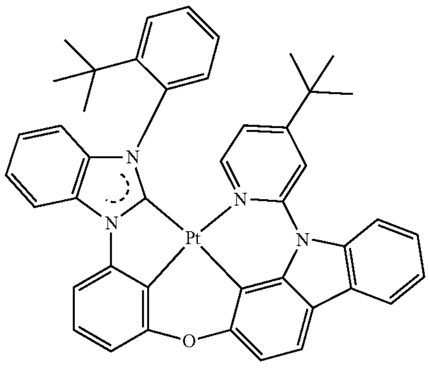
-continued
PD35
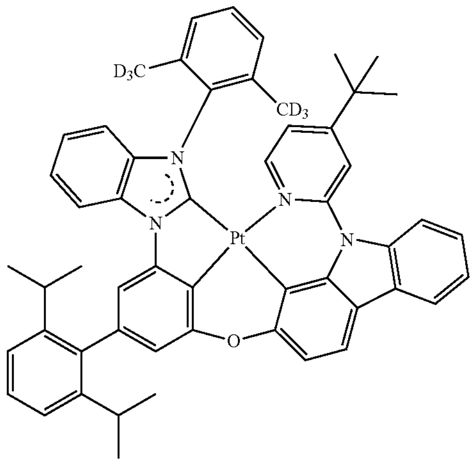
PD36
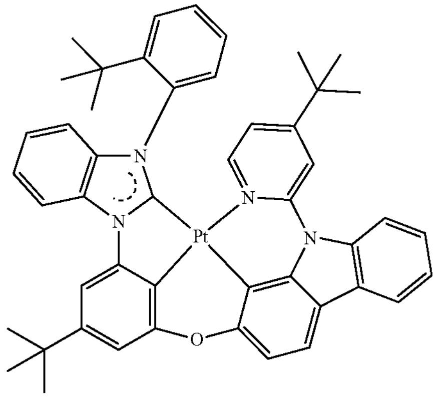
PD37
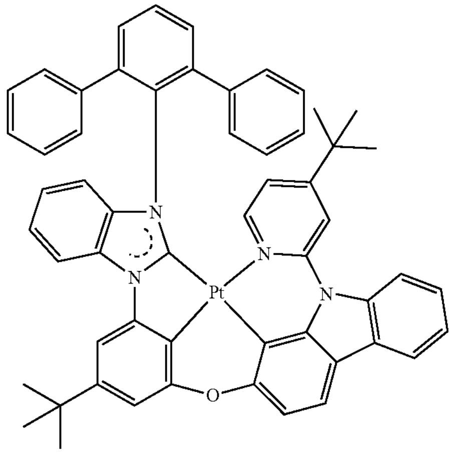

-continued

PD38

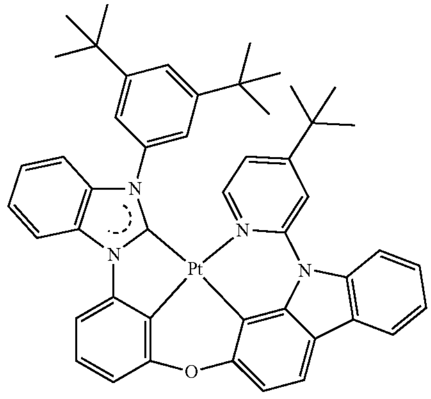

PD39

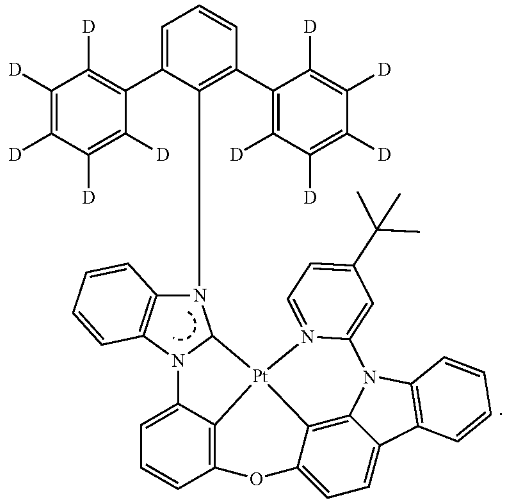

Fluorescent Dopant

The fluorescent dopant may include an amine group-containing compound, a styryl group-containing compound, or a combination thereof.

In an embodiment, the fluorescent dopant may include a compound represented by Formula 501:

Formula 501

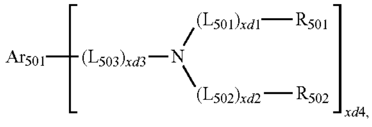

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In an embodiment, the fluorescent dopant may include: at least one of Compounds FD1 to FD36; DPVBi; DPAVBi; or one or more combinations thereof:

FD1

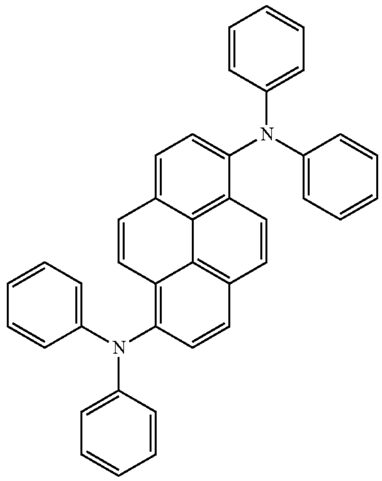

FD2

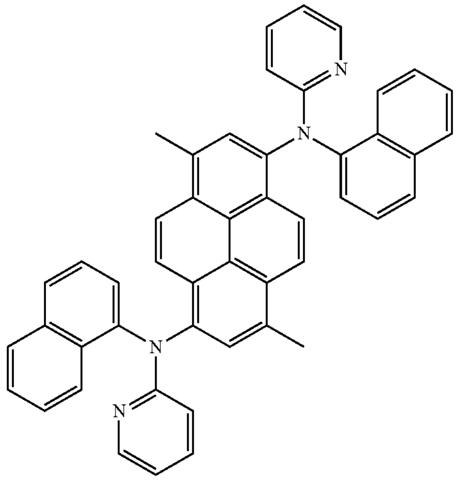

FD3

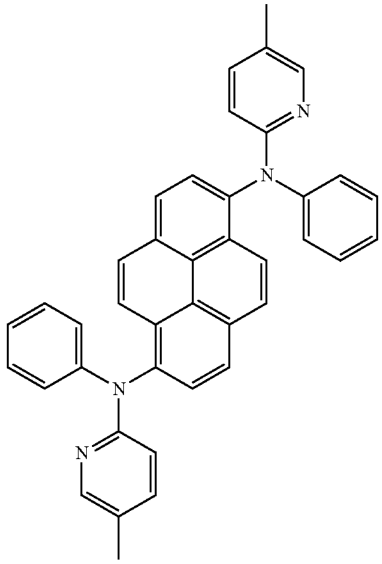

-continued
FD4
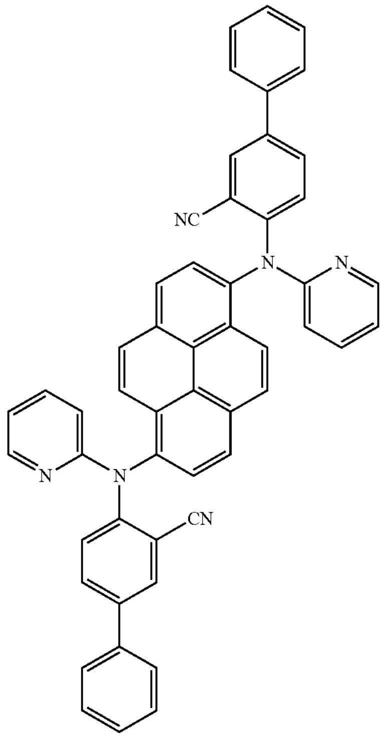
FD5
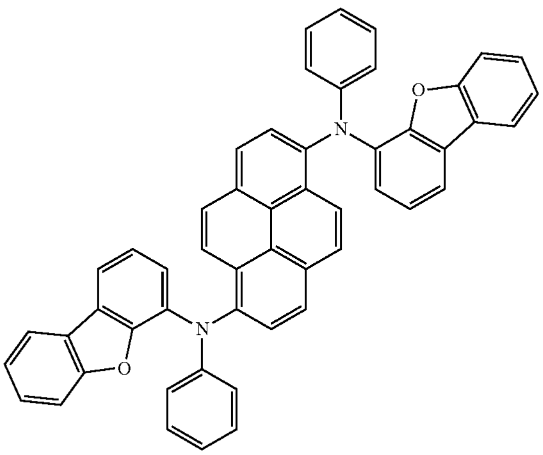
-continued
FD6
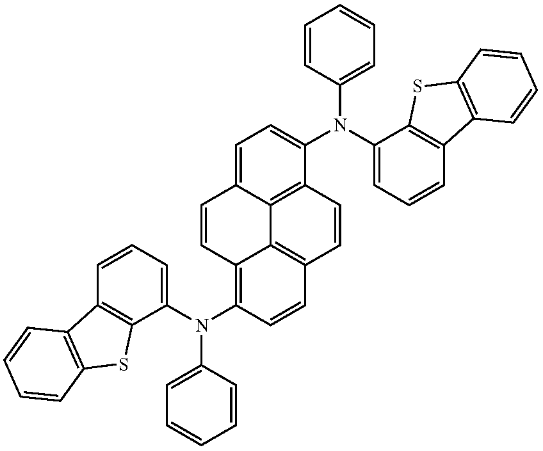
FD7
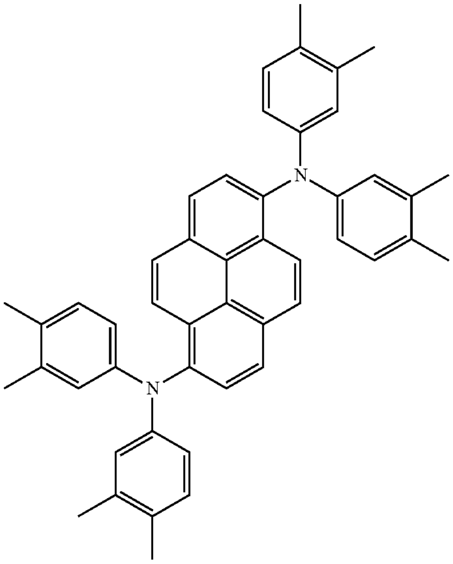
FD8
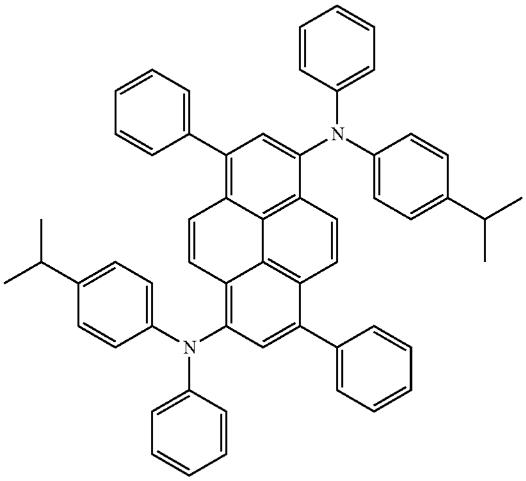

-continued
FD9
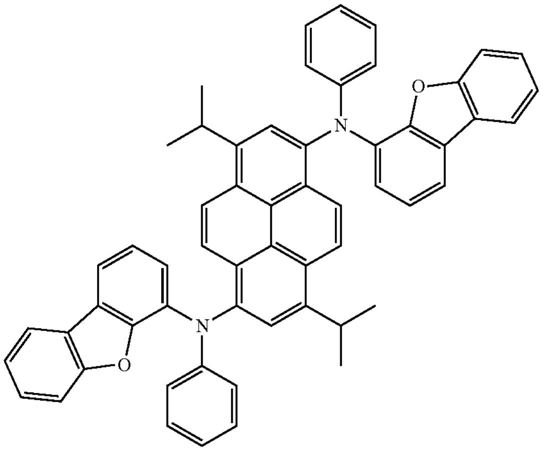
FD10
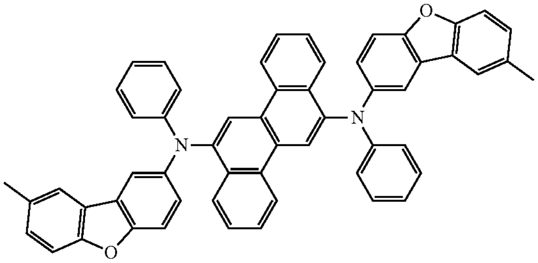
FD11
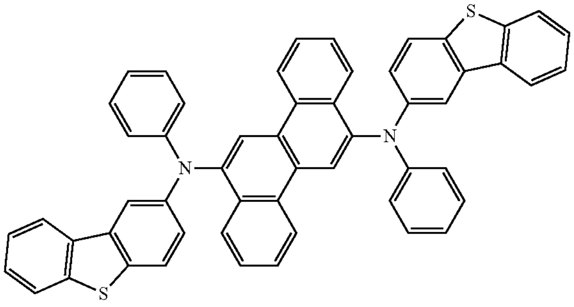
FD12
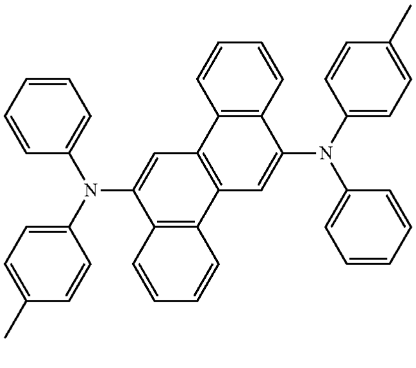
-continued
FD13
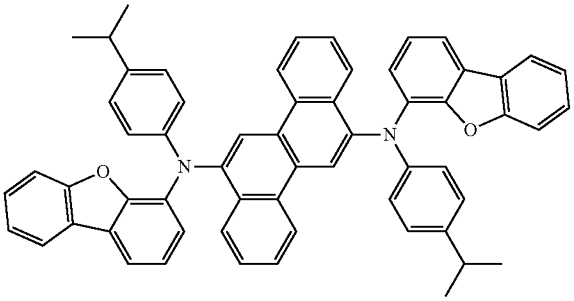
FD14
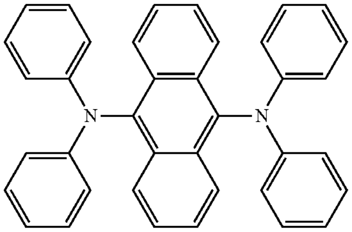
FD15
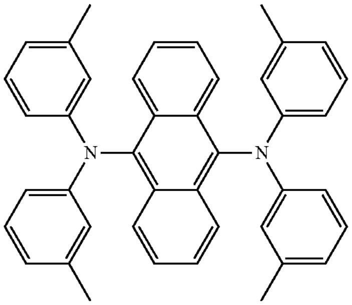
FD16
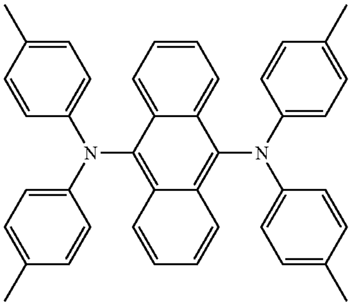
FD17
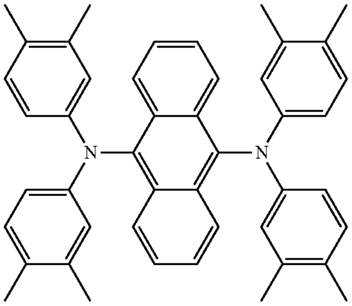

-continued
FD18
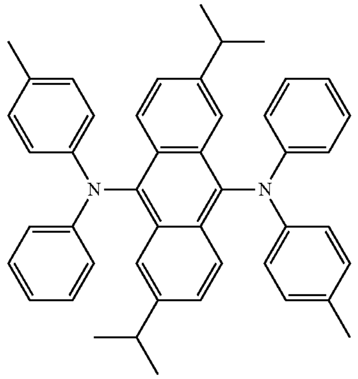
FD19
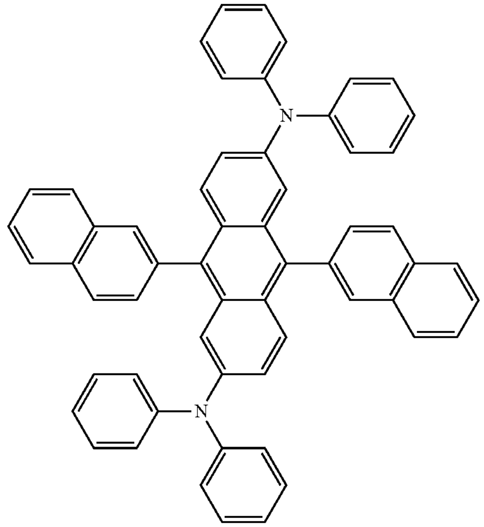
FD20
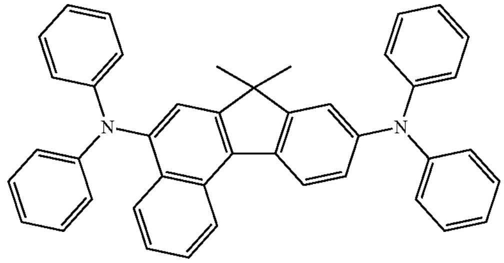
FD21
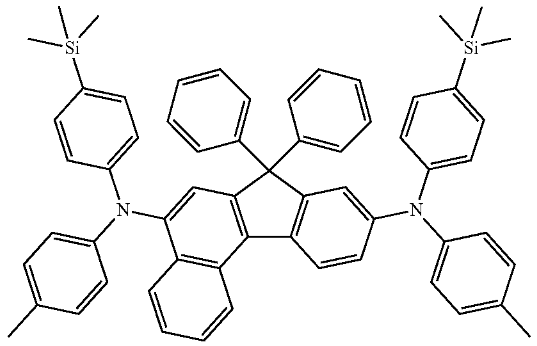
-continued
FD22
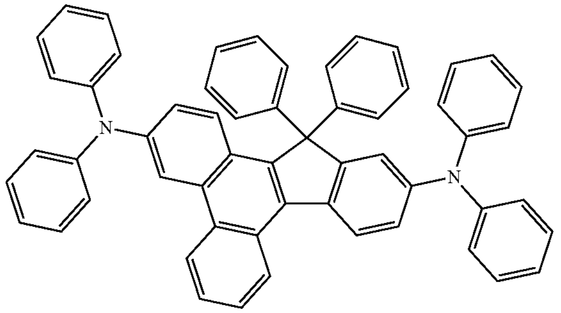
FD23
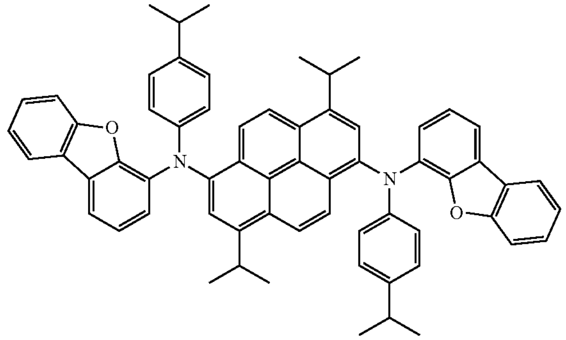
FD24
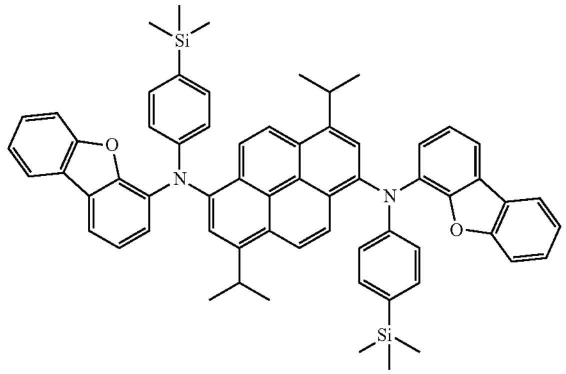
FD25
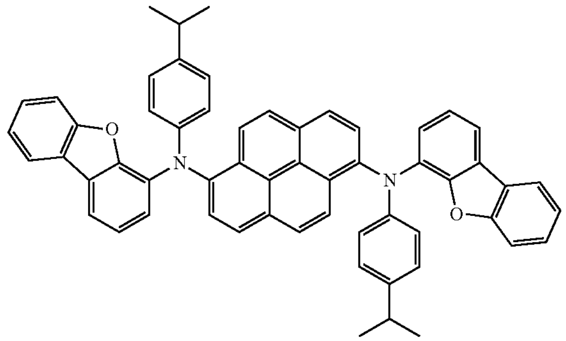

-continued
FD26
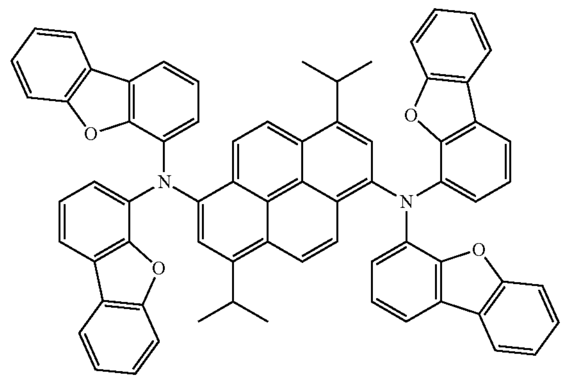
FD27
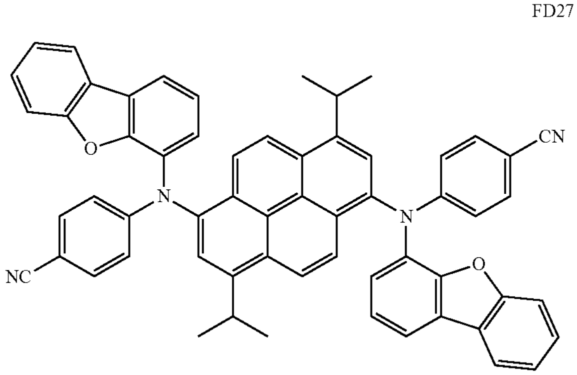
FD28
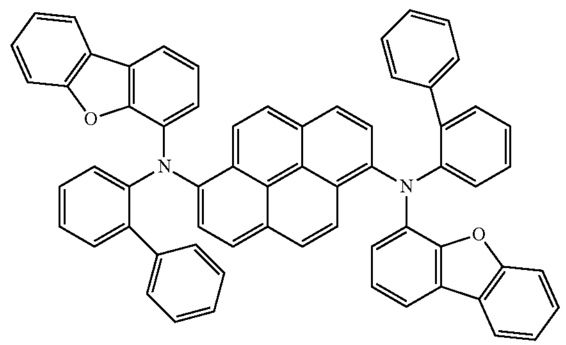
FD29
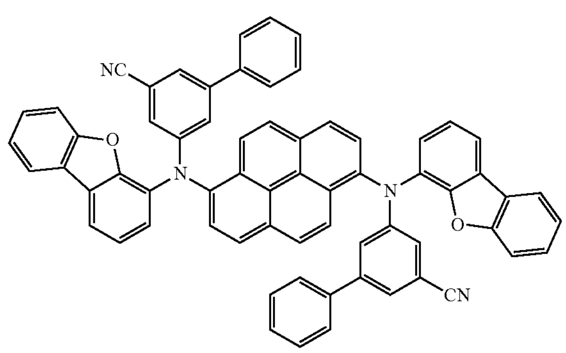
-continued
FD30
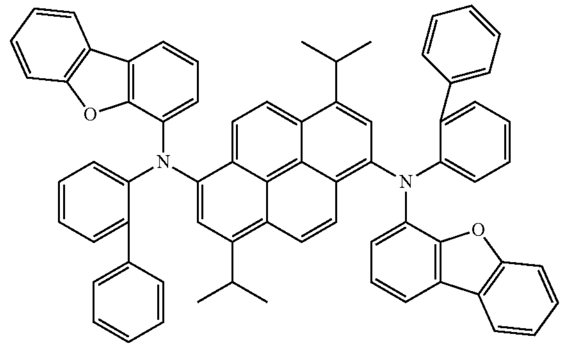
FD31
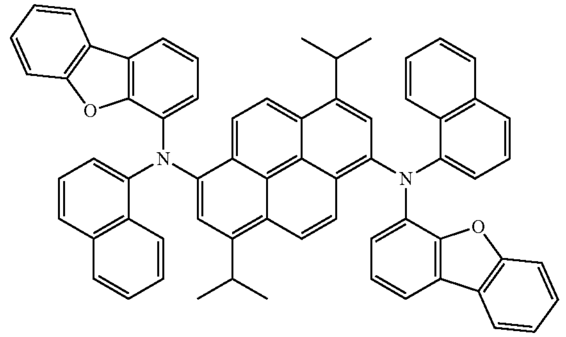
FD32
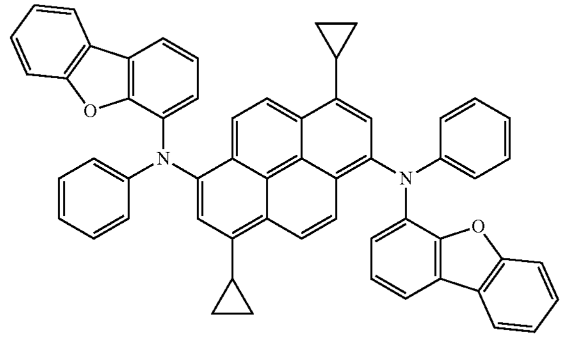
FD33
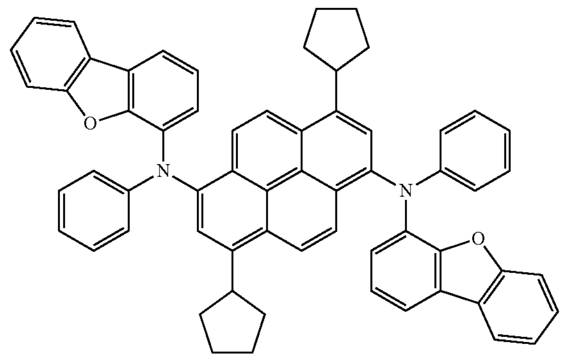

-continued

FD34

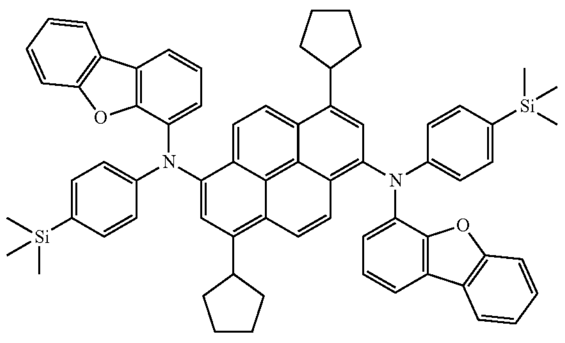

FD35

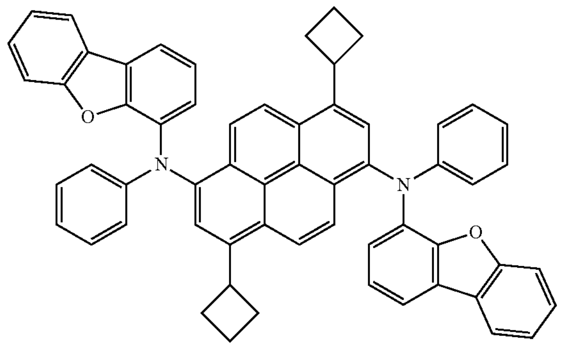

FD36

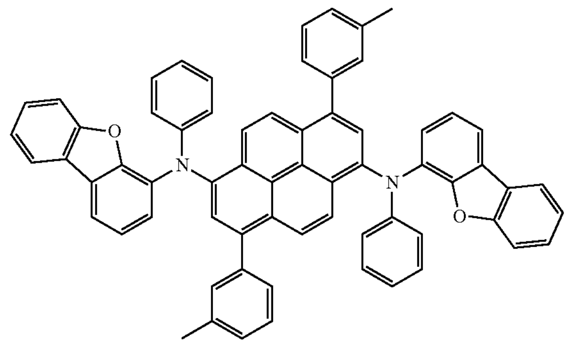

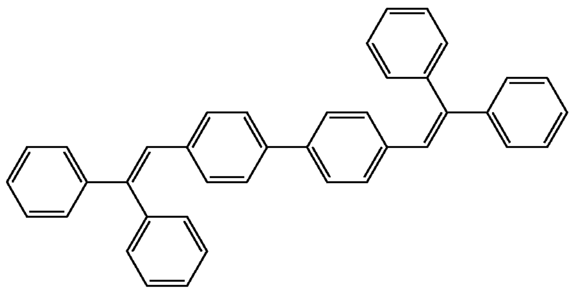

DPVBi

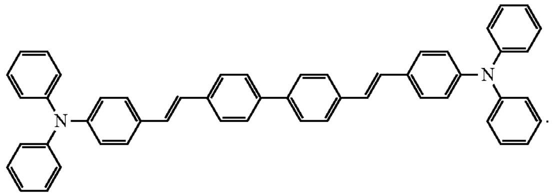

DPAVBi

Delayed Fluorescence Material

The emission layer may include a delayed fluorescence material.

In the present disclosure, the delayed fluorescence material may be selected from compounds capable of emitting delayed fluorescence based on a delayed fluorescence emission mechanism.

The delayed fluorescence material included in the emission layer may act as a host or a dopant depending on the type or kind of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved (increased).

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following Compounds DF1 to DF9:

DF1

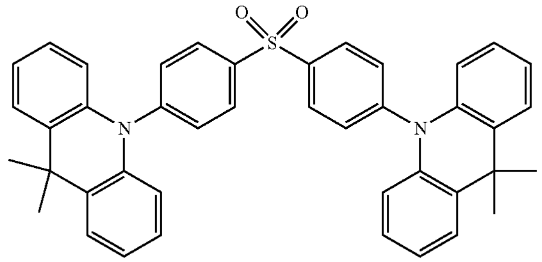

(DMAC-DPS)

DF2

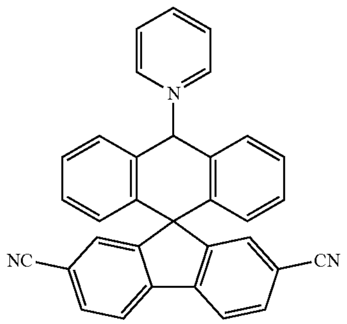

(ACRFLCN)

-continued

DF3

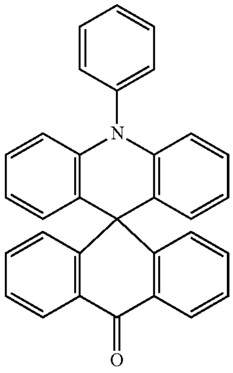

(ACRSA)

DF4

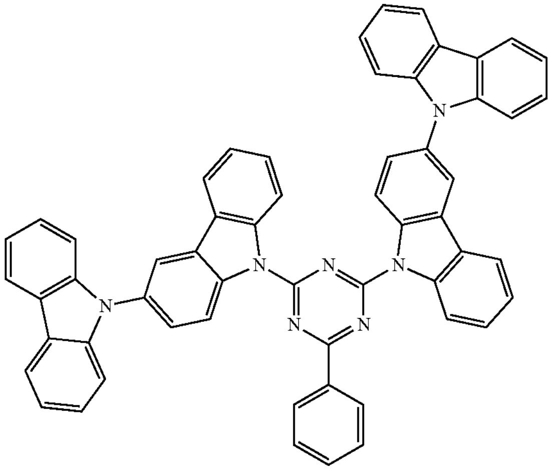

(CC2TA)

DF5

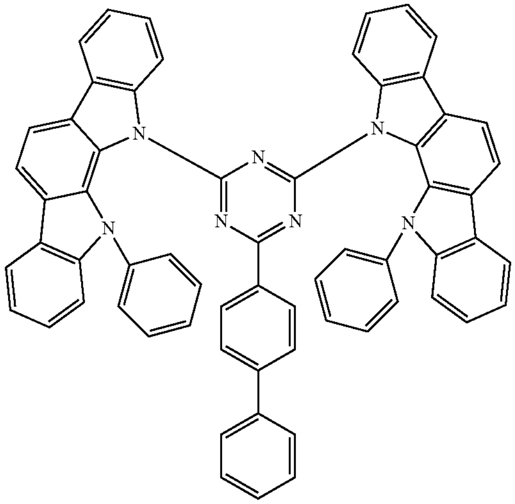

(PIC-TRZ)

-continued

DF6

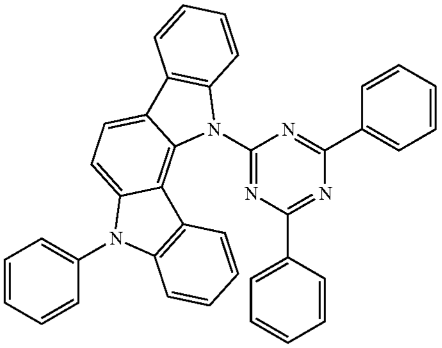

(PIC-TRZ2)

DF7

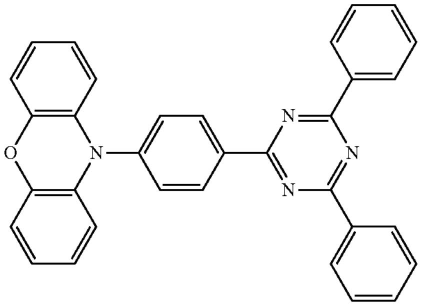

(PXZ-TRZ)

DF8

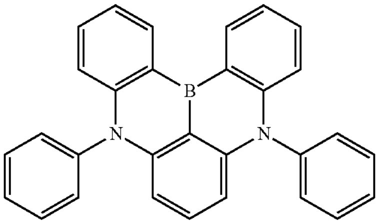

(DABNA-1)

DF9

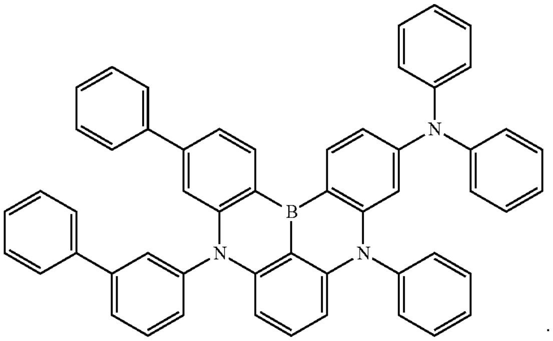

(DABNA-2)

.

Quantum Dot

The emission layer may include a quantum dot.

In the present disclosure, a quantum dot refers to a crystal of a semiconductor compound, and may include any material capable of emitting light of one or more suitable emission wavelengths according to the size of the crystal.

A diameter of the quantum dot (e.g., an average diameter of quantum dots) may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles may be controlled or selected through a process which is more easily performed than vapor deposition methods, such as metal organic chemical vapor deposition (MOCVD) and/or molecular beam epitaxy (MBE), and which requires lower costs.

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or one or more combinations thereof.

Examples of the Group II-VI semiconductor compound may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or one or more combinations thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or one or more combinations thereof. In an embodiment, the Group III-V semiconductor compound may further include Group II elements. Examples of the Group III-V semiconductor compound further including Group II elements may include InZnP, InGaZnP, InAlZnP, and/or the like.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or one or more combinations thereof.

Examples of the Group semiconductor compound may include: a ternary compound, such as AgInS, $AgInS_2$, CuInS, $CuInS_2$, $CuGaO_2$, $AgGaO_2$, or $AgAlO_2$; or one or more combinations thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or one or more combinations thereof.

The Group IV element or compound may include: a single element compound, such as Si or Ge; a binary compound, such as SiC or SiGe; or one or more combinations thereof.

Each element included in a multi-element compound such as the binary compound, ternary compound and quaternary compound, may exist in a particle with a substantially uniform concentration or non-uniform concentration.

In an embodiment, the quantum dot may have a single structure or a dual core-shell structure. In the case of the quantum dot having a single structure, the concentration of each element included in the corresponding quantum dot is substantially uniform. In an embodiment, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The element presented in the interface between the core and the shell of the quantum dot may have a concentration gradient that decreases toward the center of the quantum dot.

Examples of the shell of the quantum dot may be an oxide of metal, metalloid, or non-metal, a semiconductor compound, or one or more combinations thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or one or more combinations thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or one or more combinations thereof. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

A full width at half maximum (FWHM) of an emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle can be improved (increased).

In some embodiments, the quantum dot may be a substantially spherical particle, a pyramidal particle, a multi-arm particle, a cubic nanoparticle, a nanotube particle, a nanowire particle, a nanofiber particle, or a nanoplate particle.

Because the energy band gap can be adjusted by controlling the size of the quantum dot, light having one or more suitable wavelength bands can be obtained from the quantum dot emission layer. Therefore, by utilizing quantum dots of different sizes, a light-emitting device that emits light of one or more suitable wavelengths may be implemented. In an embodiment, the size of the quantum dot may be selected to emit red, green and/or blue light. In some embodiments, the size of the quantum dot may be configured to emit white light by combining light of one or more suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or one or more combinations thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

Formula 601

$$[Ar_{601}]_{xe11}-[(L_{601})_{xe1}-R_{601}]_{xe21}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

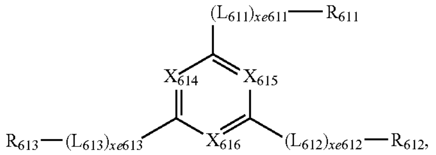

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are respectively the same as described in connection with $L_{601}$, xe611 to xe613 are respectively the same as described in connection with xe1, $R_{611}$ to $R_{613}$ are respectively the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or one or more combinations thereof:

ET1

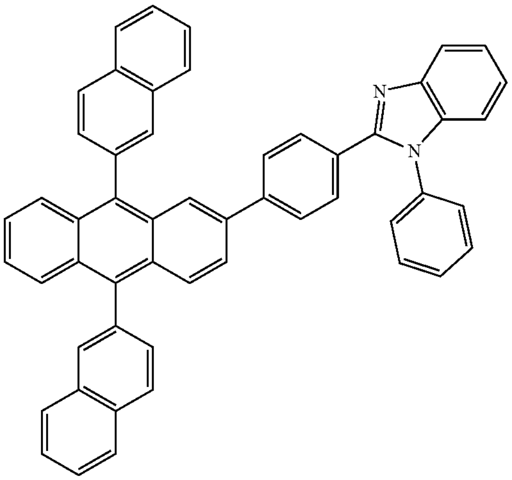

ET2

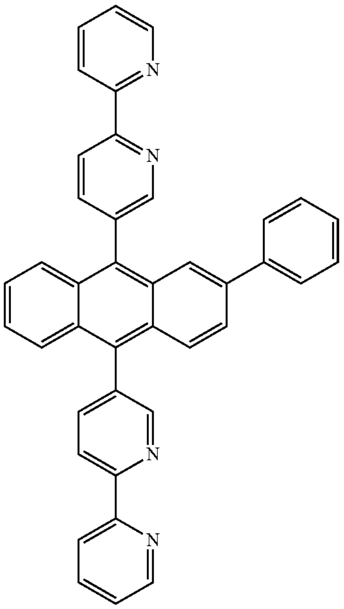

ET3
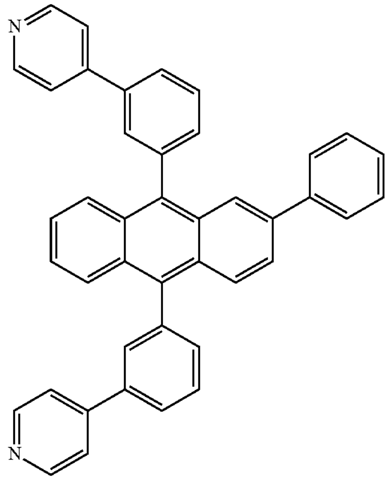
ET4
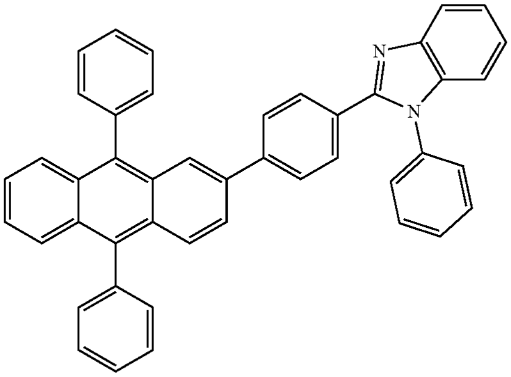
ET5
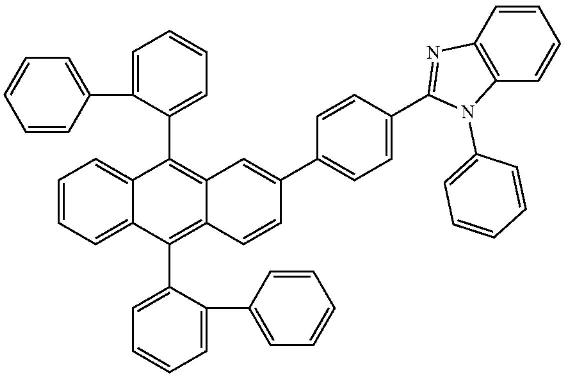
ET6
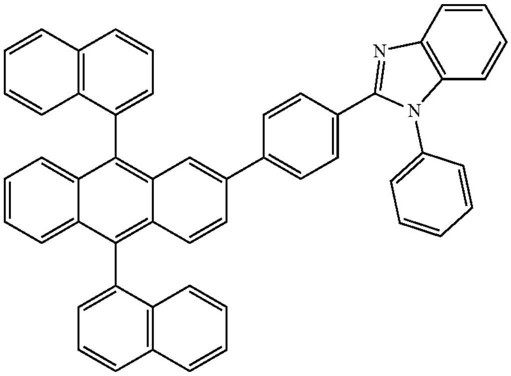
ET7
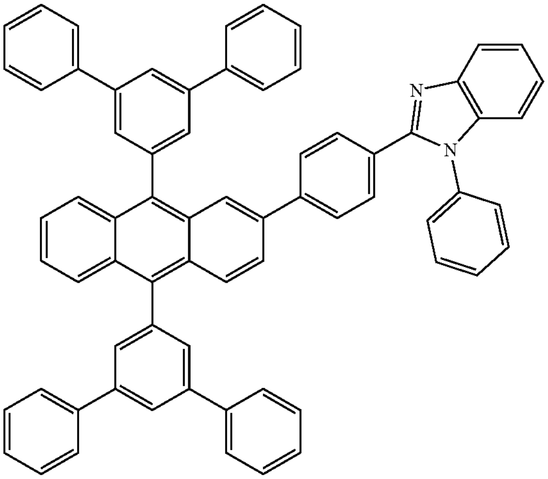
ET8
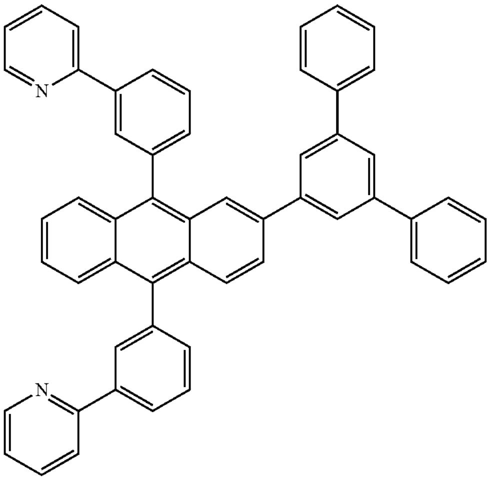

-continued
ET9
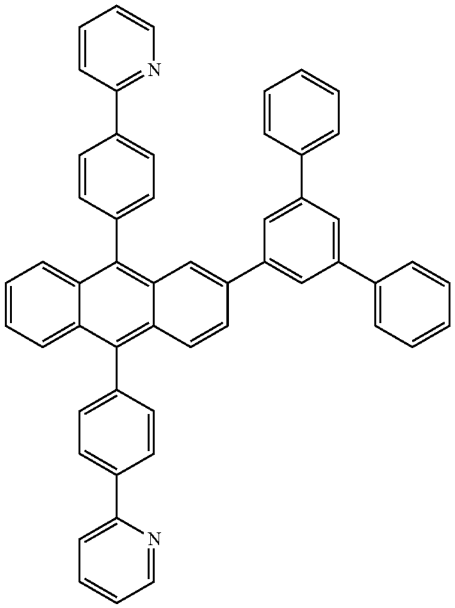
ET10
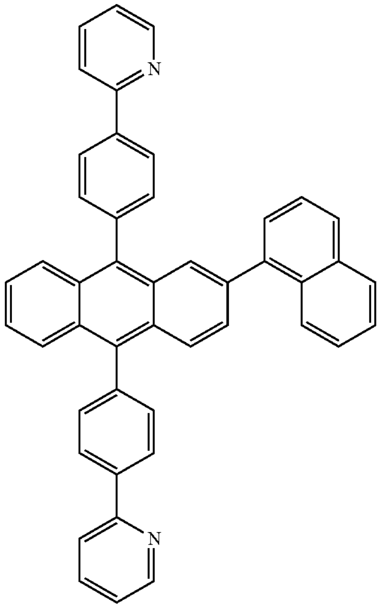
-continued
ET11
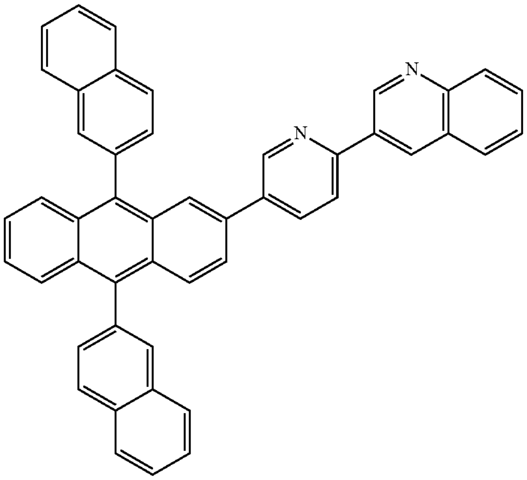
ET12
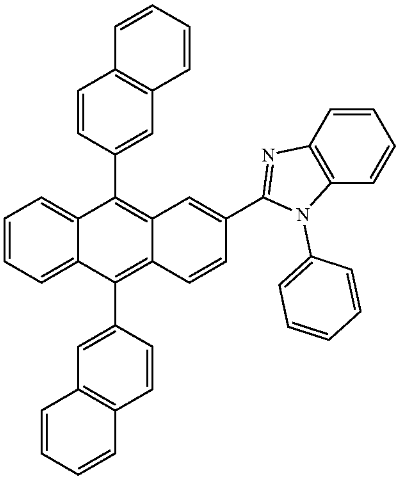
ET13
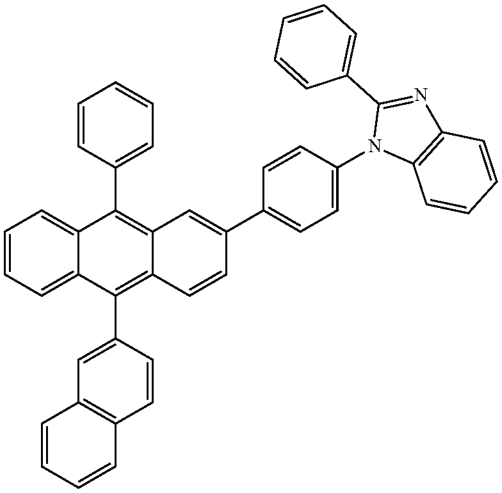

-continued
ET14
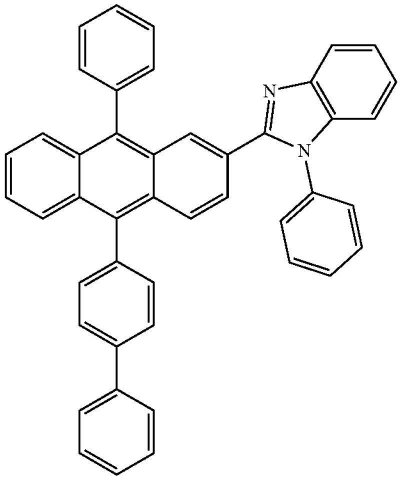
ET15
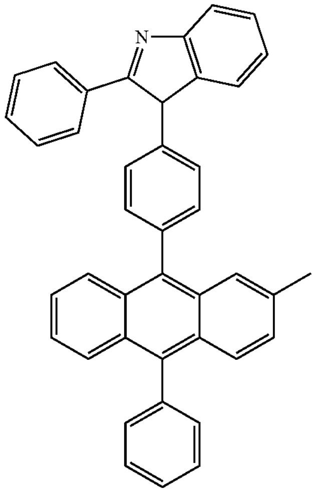
ET16
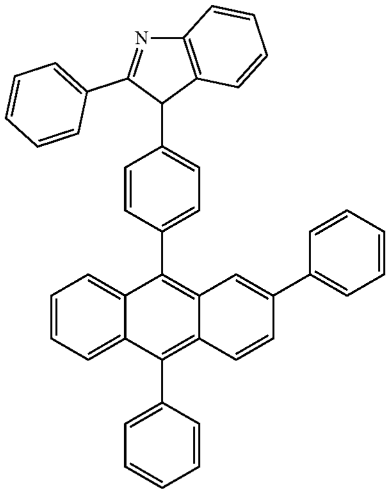
-continued
ET17
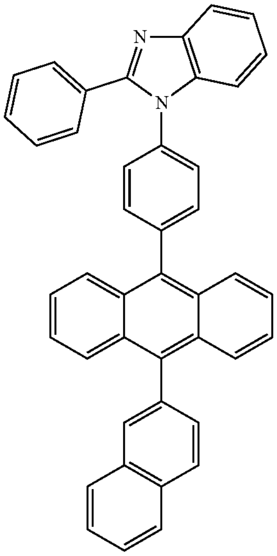
ET18
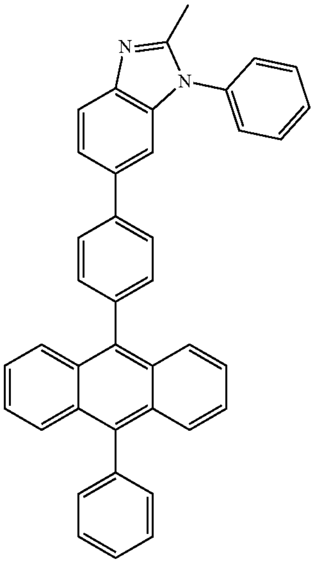
ET19
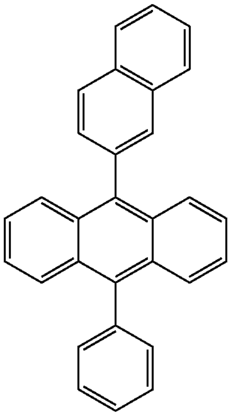

-continued
ET20
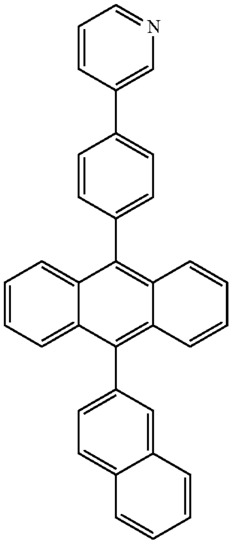
ET21
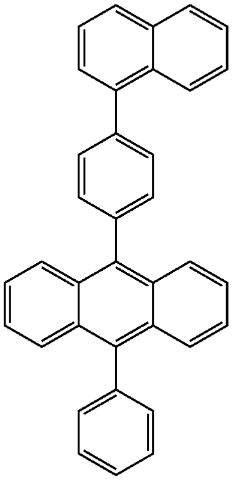
ET22
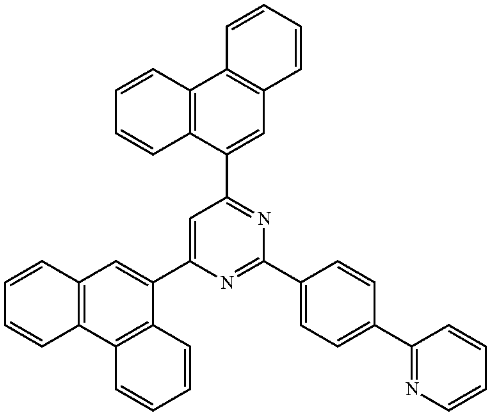
-continued
ET23
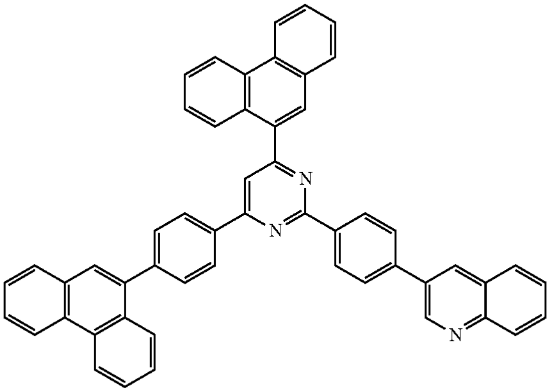
ET24
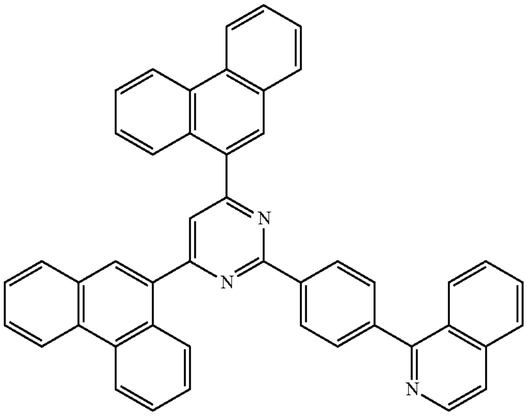
ET25
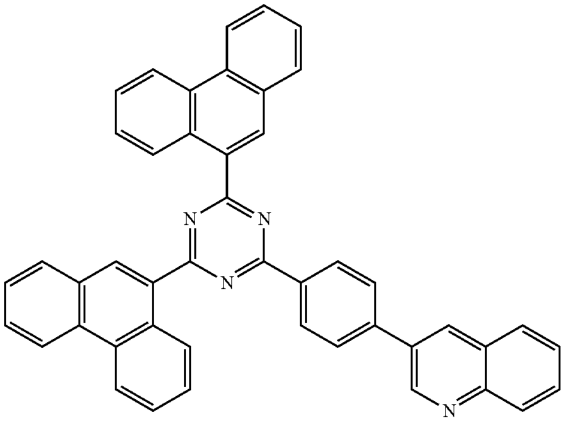

ET26
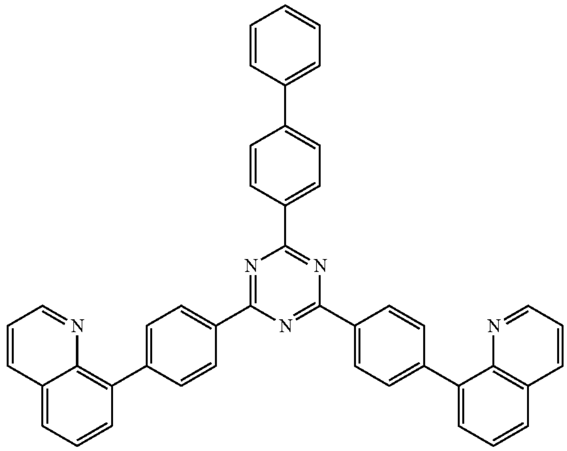
ET27
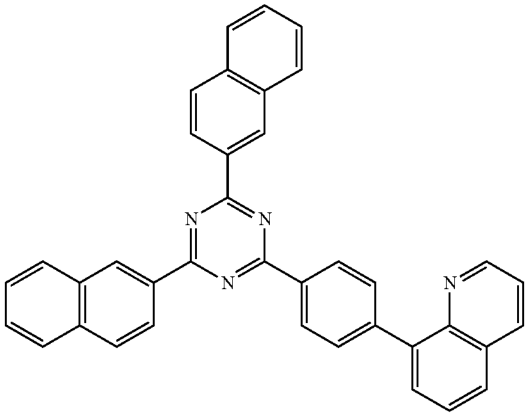
ET28
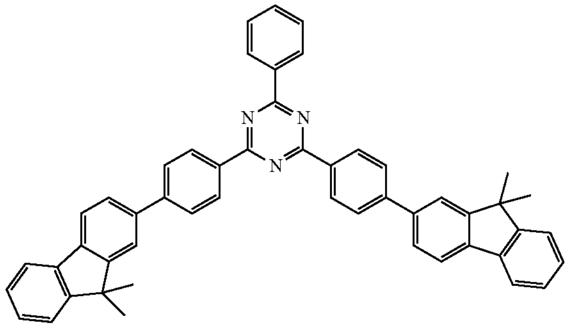
ET29
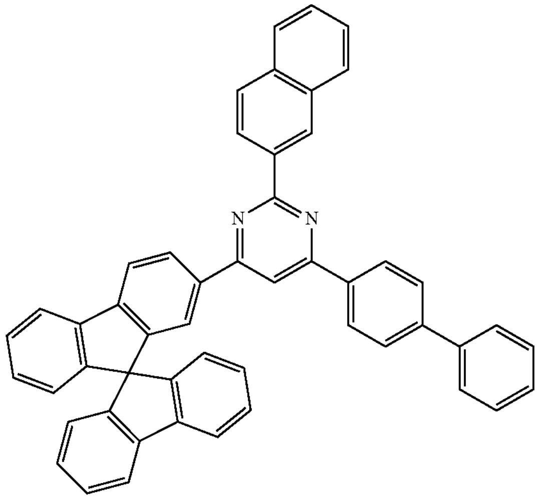
ET30
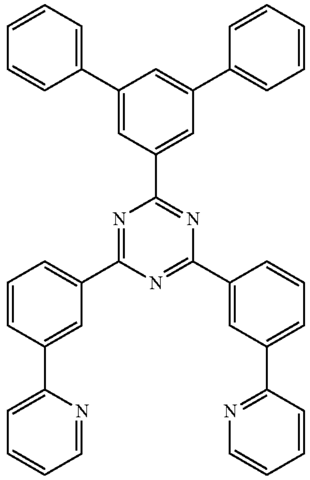
ET31
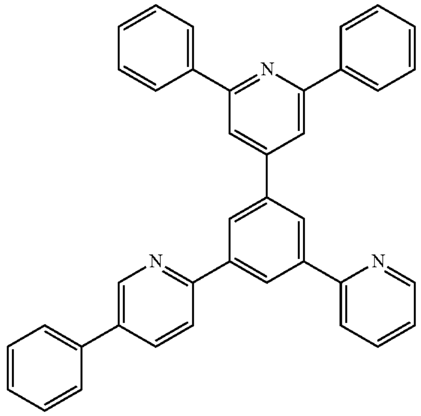

-continued
ET32
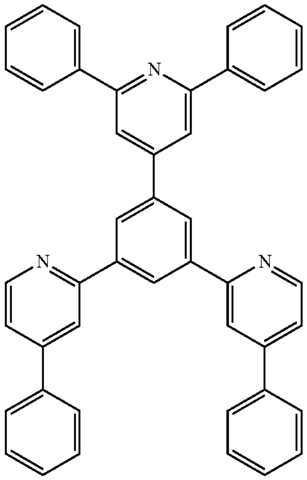
ET33
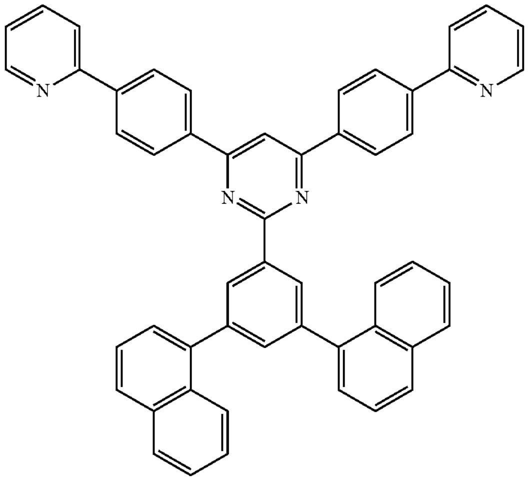
ET34
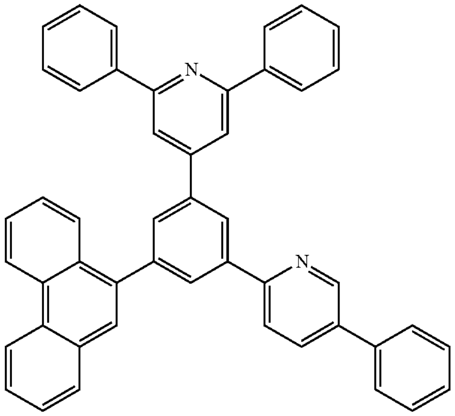
-continued
ET35
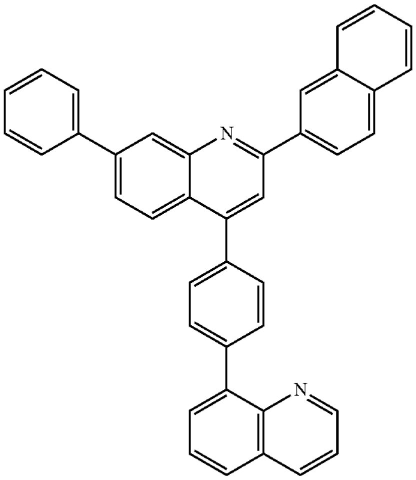
ET36
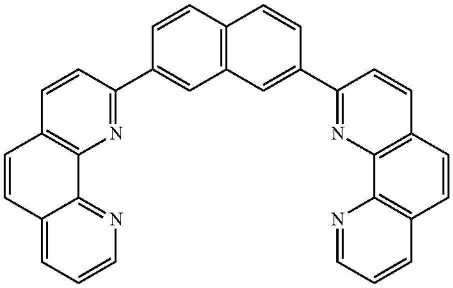
ET37
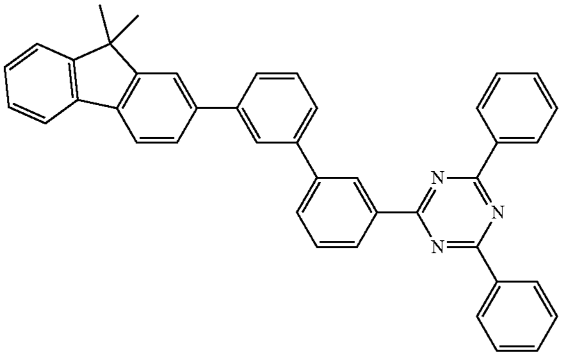
ET38
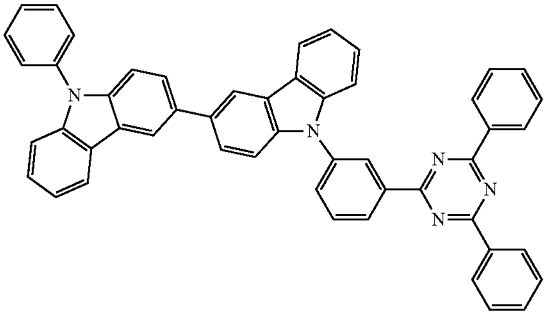

-continued
ET39
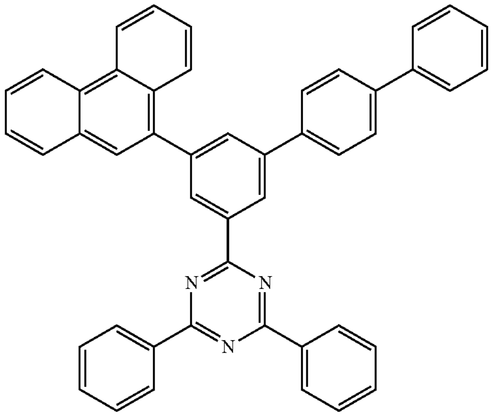
ET40
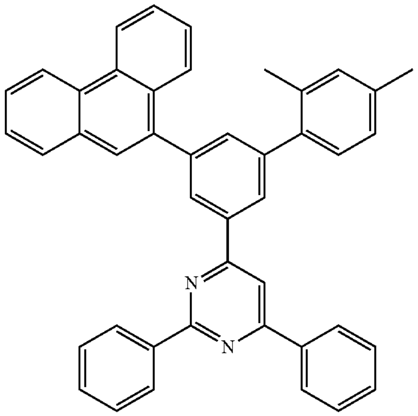
ET41
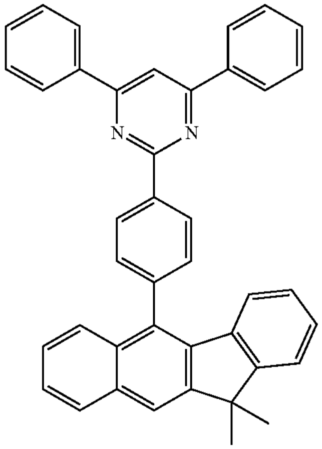
-continued
ET42
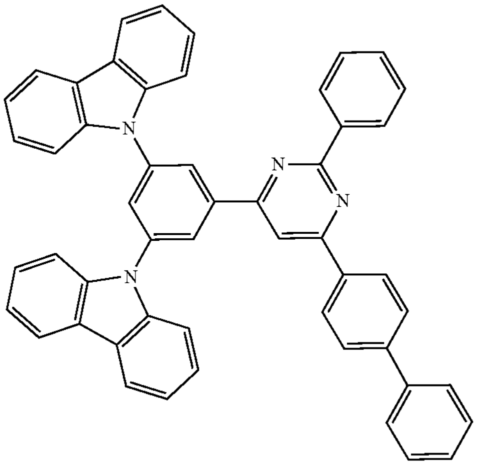
ET43
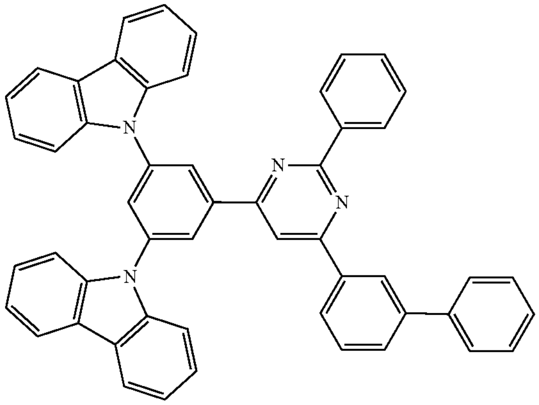
ET44
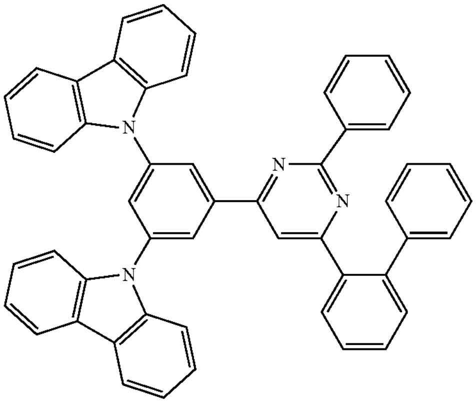
ET45
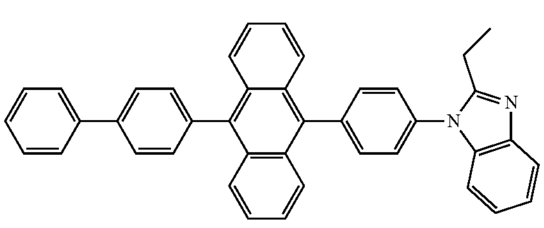

-continued

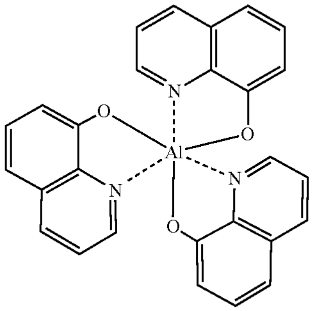

Alq3

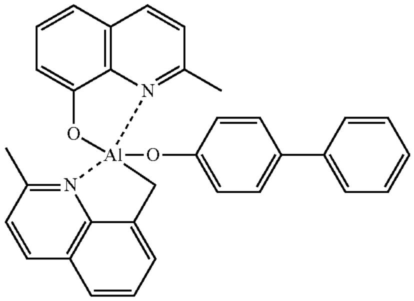

BAlq

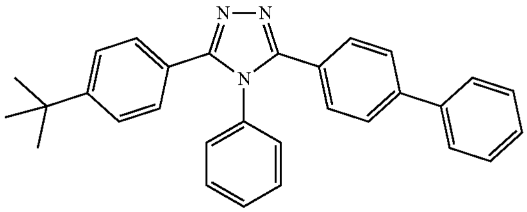

TAZ

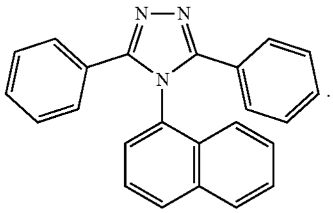

NTAZ

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or one or more combinations thereof, the thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thickness of the buffer layer, the hole blocking layer, the electron control layer, the electron transport layer, and/or the electron transport region are within these ranges, satisfactory (suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion.

A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or one or more combinations thereof.

In an embodiment, the metal-containing material may include a Li complex. The Li complex may include, for example, Compound ET-D1 (LiQ) or ET-D2:

ET-D1

ET-D2

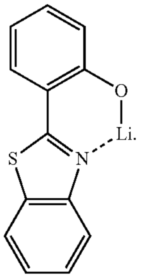

The electron transport region may include an electron injection layer that facilitates the injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof.

The alkali metal may include Li, Na, K, Rb, Cs, or one or more combinations thereof. The alkaline earth metal may include Mg, Ca, Sr, Ba, or one or more combinations thereof. The rare earth metal may include Sc, Y, Ce, Tb, Yb, Gd, or one or more combinations thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or one or more combinations thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or one or more combinations thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or one or more combinations thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or one or more combinations thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or one or more combinations thereof. In an embodiment, the electron injection layer may be a KI:Yb co-deposited layer, an RbI:Yb co-deposited layer, and/or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or one or more combinations thereof may be substantially homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, satisfactory (suitable) electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or one or more combinations thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In more detail, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved (increased).

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or one or more combinations thereof. The carbocyclic compound, the heterocyclic compound, and the amine group-containing compound may be optionally substituted with a substituent containing O, N, S, Se, Si, F, Cl, Br, I, or one or more combinations thereof. In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or a combination thereof.

In an embodiment, at least one of the first capping layer or the second capping layer may each independently include at least one of Compounds HT28 to HT33, at least one of Compounds CP1 to CP6, β-NPB, or one or more combinations thereof:

CP1

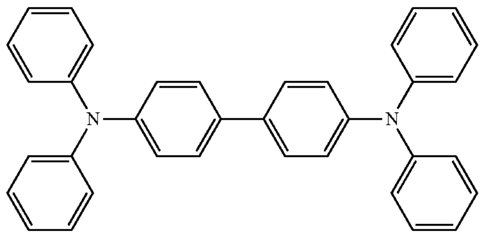

CP2

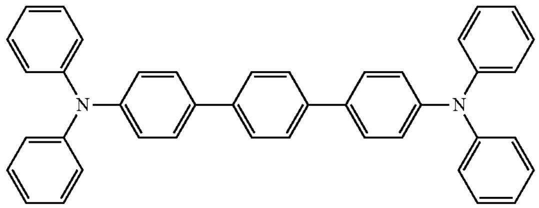

CP3

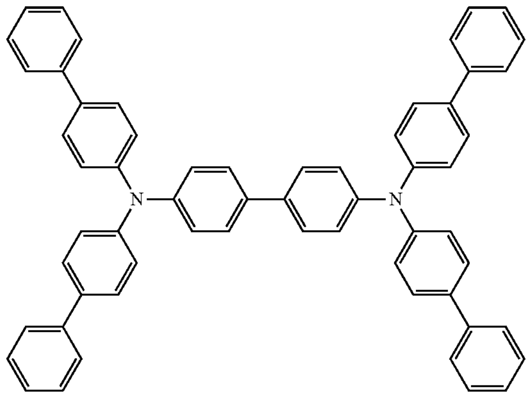

CP4

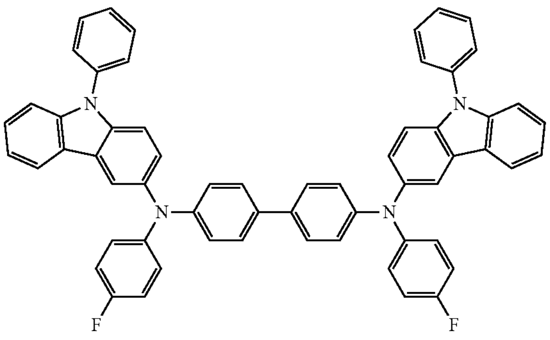

-continued

CP5

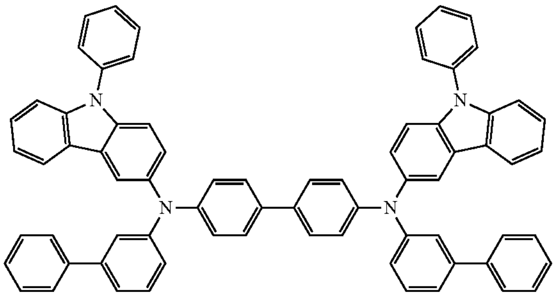

CP6

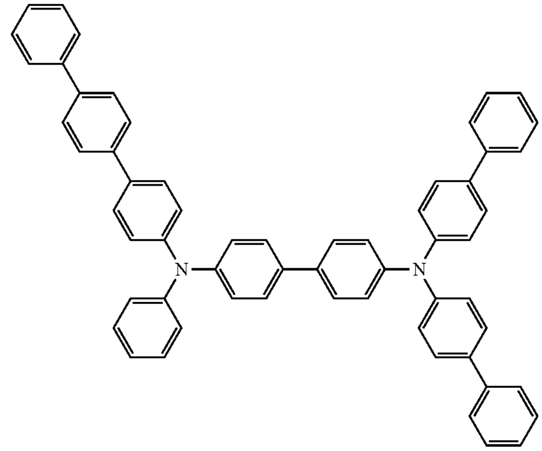

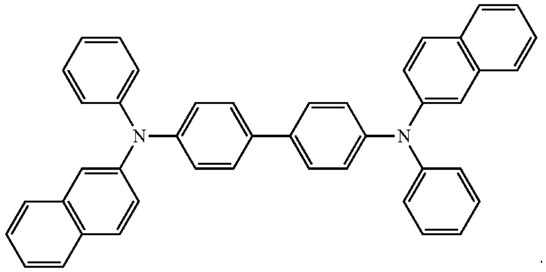

β-NPB

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In more detail, the first area may include a red quantum dot, the second area may include a green quantum dot, and the third area may not include (e.g., may exclude) a quantum dot. The quantum dot is the same as described in the present disclosure. The first area, the second area, and/or the third area may each further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein one of the source electrode or the drain electrode may be electrically connected to a corresponding one of the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while concurrently (e.g., simultaneously) preventing or reducing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

One or more suitable functional layers may be additionally located on the sealing portion, in addition to the color filter and/or the color conversion layer, according to the intended use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to one or more suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Figure 2:
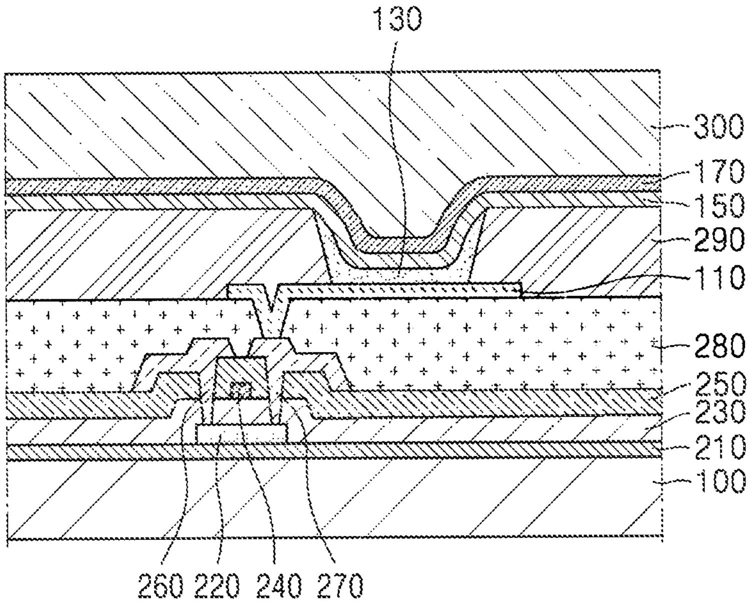
FIG. 2 shows a cross-sectional view of a structure of an electronic apparatus according to an embodiment.
Figure 3:
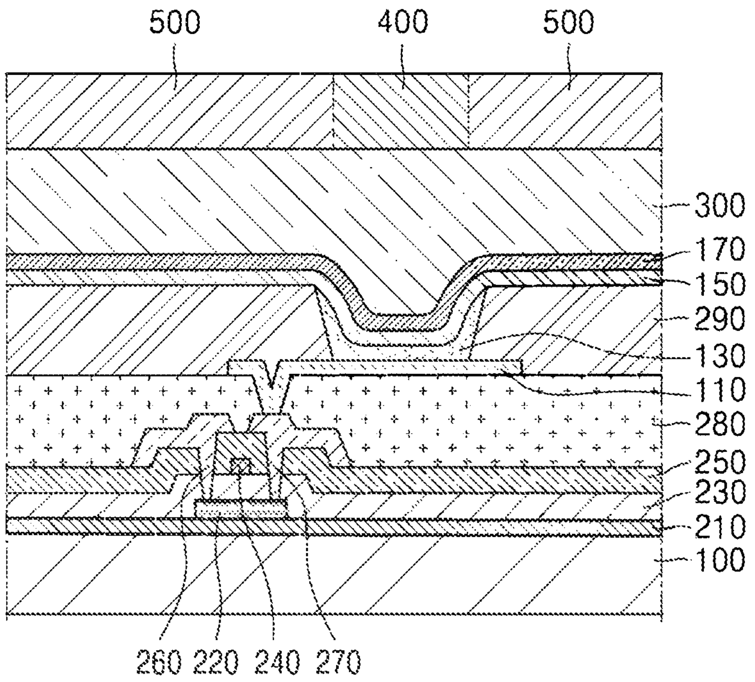
FIG. 3 shows a cross-sectional view of a structure an electronic apparatus according to another embodiment.

Description of FIGS. 2 and 3

FIG. 2 is a cross-sectional view of a light-emitting apparatus according to an embodiment of the disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a substantially flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, and/or an oxide semiconductor, and may include a source region, a drain region and/or a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide and/or polyacrylic organic film. At least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen (e.g., reduce the amount of moisture and/or oxygen). The encapsulation portion 300 may include: an inorganic film including silicon nitride (SiNx), silicon oxide (SiOx), indium tin oxide, indium zinc oxide, or one or more combinations thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or one or more combinations thereof; or a combination of the inorganic film and the organic film.

FIG. 3 is a cross-sectional view of a light-emitting apparatus according to an embodiment of the disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be at least one of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and/or laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein refers to a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and/or a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and/or a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and/or an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and/or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and/or a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof include a cyclopentenyl group, a cyclohexenyl group, and/or a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, a fluorenyl group, a spiro-bifluorenyl group, and/or a benzofluorenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, an azafluorenyl group, a carbazolyl group, an azacarbazolyl group, an indeno carbazolyl group, an indolocarbazolyl group, a benzofurocarbazolyl group, a benzothienocarbazolyl group, a benzosilolocarbazolyl group, a benzoindolocarbazolyl group, and/or a benzocarbazolyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group include an indenyl group, an indenophenanthrenyl group, and/or an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a dibenzosilolyl group, a dibenzothiophenyl group, a dibenzofuranyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, a benzonaphthofuranyl group, a benzonaphthothiophenyl group, a benzonaphthosilolyl group, a benzofurodibenzofuranyl group, a benzofurodibenzothiophenyl group, and/or a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to -$A_{106}A_{107}$ (where $A_{106}$ may be a $C_{59}$ alkylene group, and $A_{107}$ may be a $C_1$-$C_{69}$ heteroaryl group).

$R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or one or more combinations thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ utilized herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof; a $C_7$-$C_{60}$ aryl alkyl group; or a $C_2$-$C_{60}$ heteroaryl alkyl group.

The term "hetero atom" as utilized herein refers to any atom other than a carbon atom. Examples of the heteroatom include O, S, N, P, Si, B, Ge, Se, or one or more combinations thereof.

The term "the third-row transition metal" utilized herein includes hafnium (Hf), tantalum (Ta), tungsten (W), rhenium (Re), osmium (Os), iridium (Ir), platinum (Pt), gold (Au), and/or the like.

"Ph" as used herein refers to a phenyl group, "Me" as used herein refers to a methyl group, "Et" as used herein refers to an ethyl group, "tert-Bu" or "But" as used herein refers to a tert-butyl group, and "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, organometallic compounds according to embodiments and light-emitting devices according to embodiments will be described in more detail with reference to the following synthesis examples and examples. The wording "B was used instead of A" used in describing Synthesis Examples means that an identical molar equivalent of B was used in place of A.

EXAMPLES

Synthesis Example 1: Synthesis of Compound BD01

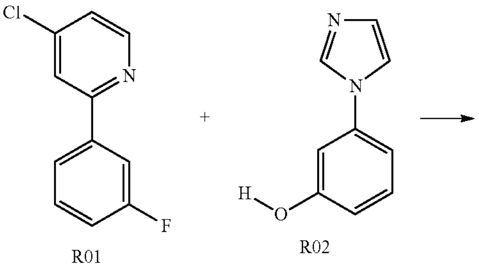

R01 R02

-continued

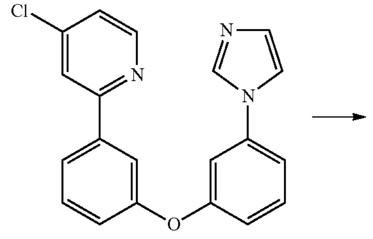

1-1

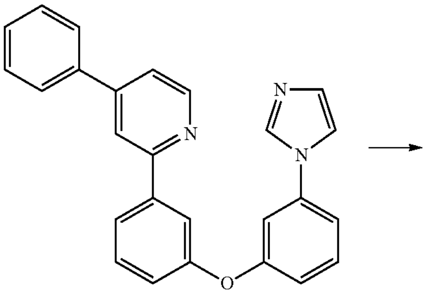

1-2

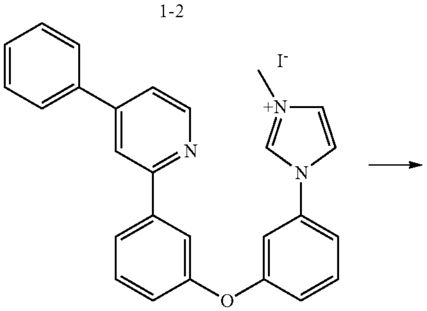

1-3

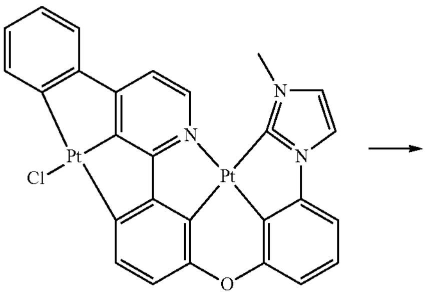

1-4

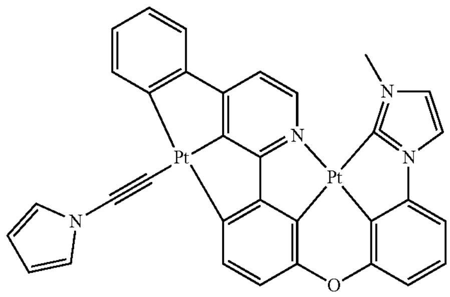

BD01

1) Synthesis of Intermediate 1-1

10.5 g (31 mmol) of Intermediate R01, 10.1 g (31 mmol) of Intermediate R02, and 13.2 g (62 mmol) of potassium phosphate tribasic were placed in a reaction vessel and suspended in 310 mL of dimethylsulfoxide. The mixture was heated and stirred at 160° C. for 24 hours. After completion of the reaction, the reactant was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 9.5 g (25 mmol) of Intermediate 1-1.

2) Synthesis of Intermediate 1-2

9.5 g (25 mmol) of Intermediate 1-1, 2.8 g (27.5 mmol) of phenylboronic acid, 540 mg (2.5 mmol) of palladium acetate, 1.2 g (5.0 mmol) of triphenylphosphine, and 31.8 g (130 mmol) of potassium carbonate were placed in a reaction vessel and suspended in 430 mL of 1,4-dioxane and 150 mL of water. The reaction temperature was raised to 110° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 9.1 g (21 mmol) of Intermediate 1-2.

3) Synthesis of Intermediate 1-3

9.1 g (21 mmol) of Intermediate 1-2 and iodomethane (excess) were placed in a reaction vessel and suspended in dichloromethane (200 mL). The reaction temperature was raised to 40° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 11.2 g (20 mmol) of Intermediate 1-3.

4) Synthesis of Intermediate 1-4

11.2 g (20 mmol) of Intermediate 1-3, 18.5 g (48.5 mmol) of dichloro(1,5-cyclooctadiene)platinum, and 3.6 g (48.5 mmol) of sodium acetate were suspended in 450 mL of dioxane. The reaction mixture was heated and stirred at 110° C. for 72 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.4 g (7 mmol) of Intermediate 1-4.

5) Synthesis of Compound BD01

2.4 g (7 mmol) of Intermediate 1-4, 0.7 g (14.0 mmol) of 1-ethynyl-1H-pyrrole, and 0.4 g (14 mmol) of triethylamine were suspended in 100 mL of dioxane. The reaction mixture was heated and stirred at 120° C. for 24 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.0 g (6 mmol) of Compound BD01.

Synthesis Example 2: Synthesis of Compound BD17

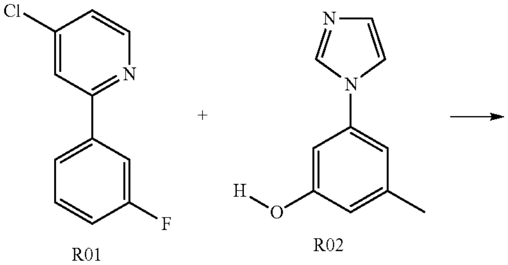

R01 R02

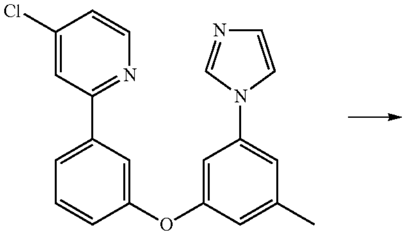

17-1

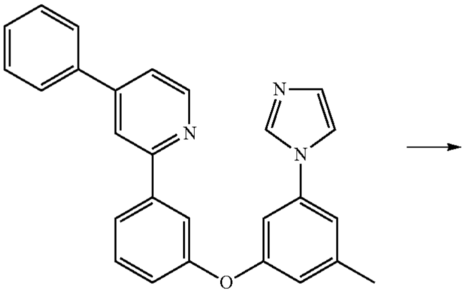

17-2

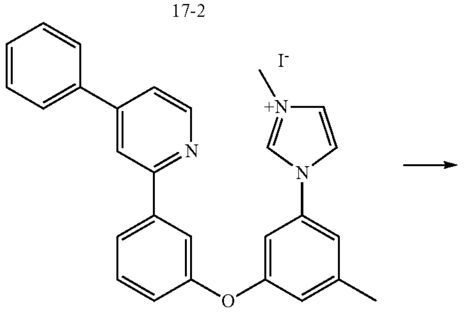

17-3

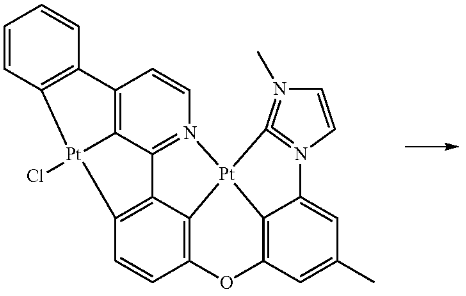

17-4

-continued

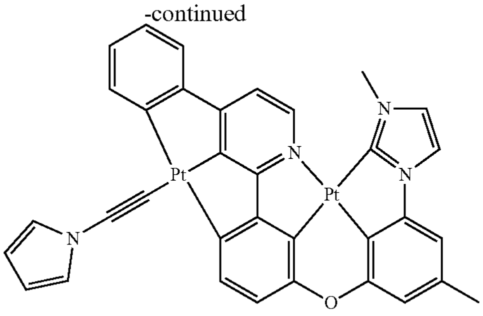

BD17

1) Synthesis of Intermediate 17-1

10.5 g (31 mmol) of Intermediate R01, 12.3 g (31 mmol) of Intermediate R02, and 13.2 g (62 mmol) of potassium phosphate tribasic were placed in a reaction vessel and suspended in 310 mL of dimethylsulfoxide. The mixture was heated and stirred at 160° C. for 24 hours. After completion of the reaction, the reactant was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 9.8 g (25 mmol) of Intermediate 17-1.

2) Synthesis of Intermediate 17-2

9.8 g (25 mmol) of Intermediate 17-1, 2.8 g (27.5 mmol) of phenylboronic acid, 540 mg (2.5 mmol) of palladium acetate, 1.2 g (5.0 mmol) of triphenylphosphine, and 31.8 g (130 mmol) of potassium carbonate were placed in a reaction vessel and suspended in 430 mL of 1,4-dioxane and 150 mL of water. The reaction temperature was raised to 110° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 9.3 g (21 mmol) of Intermediate 17-2.

3) Synthesis of Intermediate 17-3

9.3 g (21 mmol) of Intermediate 17-2 and Iodomethane (excess) were placed in a reaction vessel and suspended in dichloromethane (200 mL). The reaction temperature was raised to 40° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 11.8 g (20 mmol) of Intermediate 17-3.

4) Synthesis of Intermediate 17-4

11.8 g (20 mmol) of Intermediate 17-3, 18.5 g (48.5 mmol) of dichloro(1,5-cyclooctadiene)platinum, and 3.6 g (48.5 mmol) of sodium acetate were suspended in 450 mL of dioxane. The reaction mixture was heated and stirred at 110° C. for 72 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.4 g (7 mmol) of Intermediate 17-4.

5) Synthesis of Compound BD17

2.4 g (7 mmol) of Intermediate 17-4, 0.7 g (14.0 mmol) of 1-ethynyl-1H-pyrrole, and 0.4 g (14 mmol) of triethylamine were suspended in 100 mL of dioxane. The reaction mixture was heated and stirred at 120° C. for 24 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 1.8 g (6 mmol) of Compound BD17.

Synthesis Example 3: Synthesis of Compound BD33

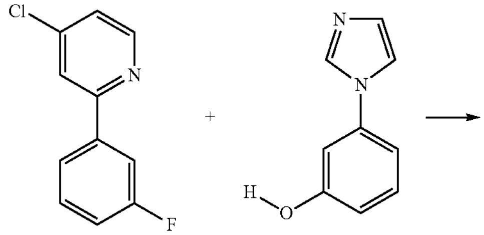

R01 R02

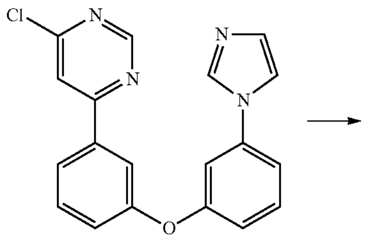

33-1

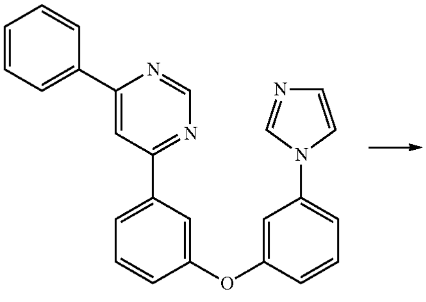

33-2

-continued

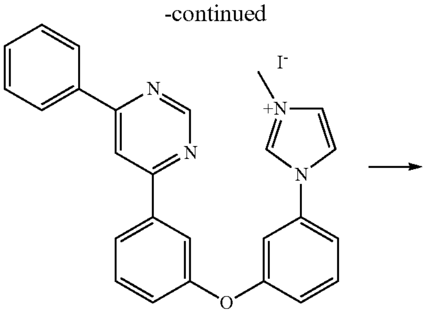

33-3

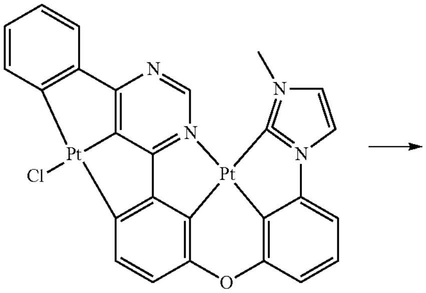

33-4

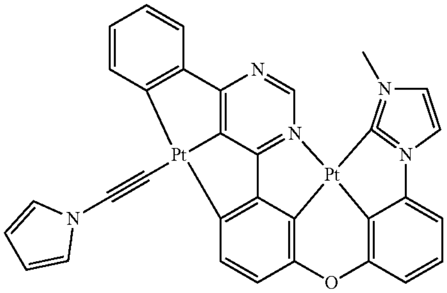

BD31

1) Synthesis of Intermediate 33-1

10.9 g (31 mmol) of Intermediate R01, 10.1 g (31 mmol) of $R_{02}$, and 13.2 g (62 mmol) of potassium phosphate tribasic were placed in a reaction vessel and suspended in 310 mL of dimethylsulfoxide. The mixture was heated and stirred at 160° C. for 24 hours. After completion of the reaction, the reactant was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 9.6 g (24 mmol) of Intermediate 33-1.

2) Synthesis of Intermediate 33-2

9.6 g (24 mmol) of Intermediate 33-1, 2.8 g (27.5 mmol) of phenylboronic acid, 540 mg (2.5 mmol) of palladium acetate, 1.2 g (5.0 mmol) of triphenylphosphine, and 31.8 g (130 mmol) of potassium carbonate were placed in a reaction vessel and suspended in 430 mL of 1,4-dioxane and 150 mL of water. The reaction temperature was raised to 110° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 9.1 g (21 mmol) of Intermediate 33-2.

3) Synthesis of Intermediate 33-3

9.1 g (21 mmol) of Intermediate 33-2 and Iodomethane (excess) were placed in a reaction vessel and suspended in dichloromethane (200 mL). The reaction temperature was raised to 40° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 11.2 g (20 mmol) of Intermediate 33-3.

4) Synthesis of Intermediate 33-4

11.2 g (20 mmol) of Intermediate 33-3, 18.5 g (48.5 mmol) of dichloro(1,5-cyclooctadiene)platinum, and 3.6 g (48.5 mmol) of sodium acetate were suspended in 450 mL of dioxane. The reaction mixture was heated and stirred at 110° C. for 72 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.4 g (7 mmol) of Intermediate 33-4.

5) Synthesis of Compound BD33

2.4 g (7 mmol) of Intermediate 33-4, 0.7 g (14.0 mmol) of 1-ethynyl-1H-pyrrole, and 0.4 g (14 mmol) of triethylamine were suspended in 100 mL of dioxane. The reaction mixture was heated and stirred at 120° C.° C. for 24 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.0 g (6 mmol) of Compound [BD33].

Synthesis Example 4: Synthesis of Compound BD41

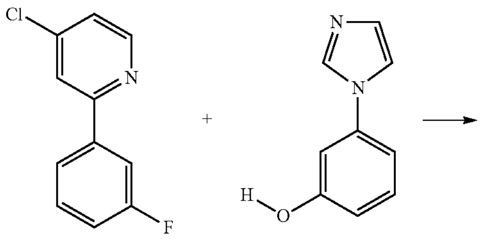

R01 R02

-continued

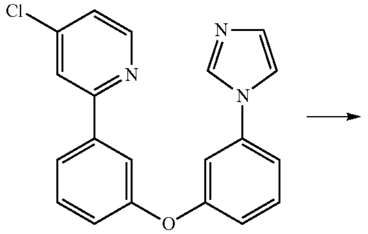

41-1

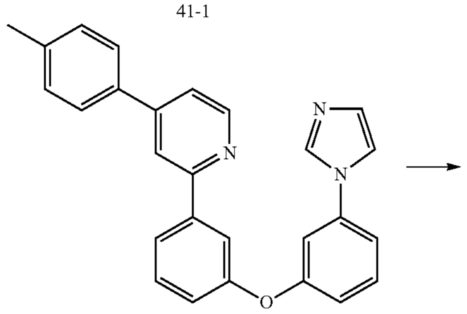

41-2

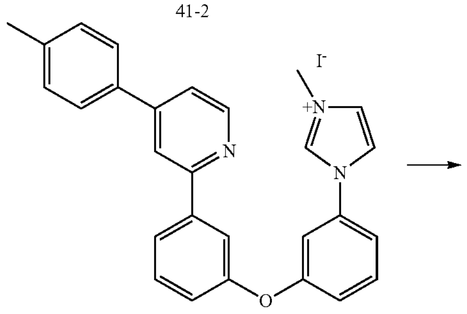

41-3

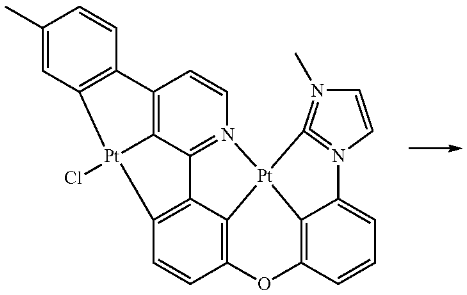

41-4

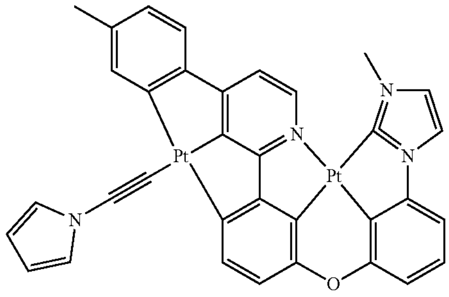

BD41

1) Synthesis of Intermediate 41-1

10.5 g (31 mmol) of Intermediate R01, 10.1 g (31 mmol) of Intermediate R02, and 13.2 g (62 mmol) of potassium phosphate tribasic were placed in a reaction vessel and suspended in 310 mL of dimethylsulfoxide. The mixture was heated and stirred at 160° C. for 24 hours. After completion of the reaction, the reactant was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 9.5 g (25 mmol) of Intermediate 41-1.

2) Synthesis of Intermediate 41-2

9.5 g (25 mmol) of Intermediate 41-1, 2.8 g (27.5 mmol) of tolylboronic acid, 540 mg (2.5 mmol) of palladium acetate, 1.2 g (5.0 mmol) of triphenylphosphine, and 31.8 g (130 mmol) of potassium carbonate were placed in a reaction vessel and suspended in 430 mL of 1,4-dioxane and 150 mL of water. The reaction temperature was raised to 110° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 9.1 g (21 mmol) of Intermediate 41-2.

3) Synthesis of Intermediate 41-3

9.1 g (21 mmol) of Intermediate 41-2 and Iodomethane (excess) were placed in a reaction vessel and suspended in dichloromethane (200 mL). The reaction temperature was raised to 40° C., and the solution was stirred for 24 hours. After completion of the reaction, the reactant was cooled to room temperature, and an organic layer was extracted with ethyl acetate. The extracted organic layer was washed with a saturated aqueous sodium chloride solution and dried by utilizing sodium sulfate. The dried product was separated utilizing column chromatography to obtain 11.2 g (20 mmol) of Intermediate 41-3.

4) Synthesis of Intermediate 41-4

11.2 g (20 mmol) of Intermediate 41-3, 18.5 g (48.5 mmol) of dichloro(1,5-cyclooctadiene)platinum, and 3.6 g (48.5 mmol) of sodium acetate were suspended in 450 mL of dioxane. The reaction mixture was heated and stirred at 110° C. for 72 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.4 g (7 mmol) of Intermediate 41-4.

5) Synthesis of Compound BD41

2.4 g (7 mmol) of Intermediate 41-4, 0.7 g (14.0 mmol) of 1-ethynyl-1H-pyrrole, and 0.4 g (14 mmol) of triethylamine were suspended in 100 mL of dioxane. The reaction mixture was heated and stirred at 120° C. for 24 hours. After completion of the reaction, the reaction mixture was cooled to room temperature and an organic layer was extracted with ethyl acetate. The extracted organic layer was washed with a saturated aqueous sodium chloride solution and dried by utilizing sodium sulfate. The dried product was separated utilizing column chromatography to obtain 2.0 g (6 mmol) of Compound BD41.

TABLE 1

| Compound | H NMR (δ) | MS/FAB(Calc.) |
|---|---|---|
| BD01 | 1.41 (s, 3H), 2.31 (d, 2H), 2.57 (m, 2H), 4.51 (d, 2H), 6.99 (d, 2H), 7.12-7.32 (m, 4H), 7.38-7.65 (m, 5H) | 878.10 |
| BD17 | 1.42 (s, 3H), 1.45 (s, 3H), 2.31 (d, 2H), 2.57 (m, 2H), 4.51 (d, 2H), 6.99 (d, 2H), 7.12-7.32 (m, 3H), 7.38-7.65 (m, 5H) | 892.11 |
| BD33 | 1.41 (s, 3H), 2.33 (d, 2H), 2.56 (m, 2H), 4.51 (d, 2H), 7.02 (d, 2H), 7.10-7.32 (m, 3H), 7.38-7.65 (m, 5H) | 879.02 |
| BD41 | 1.41 (s, 3H), 1.56 (s, 3H), 2.33 (d, 2H), 2.56 (m, 2H), 4.50 (d, 2H), 7.01 (d, 2H), 7.12-7.32 (m, 3H), 7.38-7.65 (m, 5H) | 892.12 |

Evaluation Example 1

LUMO and HOMO values of compounds of Synthesis Examples were measured utilizing methods described in Table 2, and by utilizing the DFT method of the Gaussian 09 program (with the structure optimization at the level of B3LYP, 6-311G(d,p)), $T_1$, dipole, and MLCT values of Compounds of Synthesis Examples were calculated. The results are shown in Table 3.

TABLE 2

| | |
|---|---|
| HOMO energy level evaluation method | By utilizing cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By utilizing cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |

TABLE 3

| Compound No. | HOMO (eV) | LUMO (eV) | $T_1$ (nm) | Dipole (debye) | $^3$MLCT (%) |
|---|---|---|---|---|---|
| BD01 | −4.87 | −1.55 | 457 | 7.82 | 14.35 |
| BD17 | −4.92 | −1.56 | 458 | 7.88 | 14.51 |
| BD33 | −4.95 | −1.56 | 460 | 7.92 | 14.33 |
| BD41 | −4.89 | −1.58 | 457 | 7.91 | 14.52 |

Example 1

As an anode, an ITO-deposited substrate was cut to a size of 50 mm×50 mm×0.7 mm, sonicated with isopropyl alcohol and pure water each for 5 minutes, and then cleaned by irradiation of ultraviolet rays and exposure of ozone thereto for 30 minutes. Then, the substrate was provided to a vacuum deposition apparatus.

Compound 2-TNATA was vacuum-deposited on the ITO substrate to form a hole injection layer having a thickness of 600 Å, and 4,4'-bis[N-(1-naphthyl)-N-phenylamino]biphenyl (hereinafter, NPB) was vacuum-deposited on the hole injection layer to form a hole transport layer having a thickness of 300 Å.

3,3-di(9H-carbazol-9-yl)biphenyl (mCBP) as a host and Compound 1 as a dopant were co-deposited on the hole transport layer at a weight ratio of 90:10 to form an emission layer having a thickness of 300 Å.

Diphenyl(4-(triphenylsilyl)phenyl)-phosphine oxide (TSPO1) was vacuum-deposited on the emission layer to form a hole blocking layer having a thickness of 50 Å, $Alq_3$ was deposited on hole blocking layer to form an electron transport layer having a thickness of 300 Å, and LiF as an alkali metal halide was deposited on the electron transport layer to form an electron injection layer having a thickness of 10 Å, and Al was vacuum-deposited thereon to form a cathode electrode having a thickness of 3,000 Å, to form an LiF/Al electrode, thereby completing manufacture of a light-emitting device.

Examples 2 to 5 and Comparative Examples 1 and 2

Light-emitting devices were manufactured in substantially the same manner as in Example 1, except that, as the dopant in the emission layer, compounds as shown in Table 4 were included.

Evaluation Example 2

A voltage was supplied so that the light-emitting devices manufactured according to Examples 1 to 5 and Comparative Examples 1 and 2 each had a current density of 50 mA/cm$^2$. Driving voltage (V), luminance (cd/m$^2$), luminescence efficiency (cd/A), emission color, and emission wavelength (nm) were each measured utilizing Keithley MU 236 and luminance meter PR650, and results thereof are shown in Table 4.

TABLE 4

| | | Dopant in emission layer | Driving voltage (V) | Current density (mA/cm$^2$) | Luminance (cd/m$^2$) | Luminescence Efficiency (cd/A) | Emission color | Emission wavelength (nm) |
|---|---|---|---|---|---|---|---|---|
| Example | 1 | BD1 | 4.63 | 50 | 4020 | 9.51 | Blue | 457 |
| | 2 | BD17 | 4.72 | 50 | 4017 | 9.37 | Blue | 458 |
| | 3 | BD33 | 4.88 | 50 | 4024 | 9.26 | Blue | 460 |
| | 4 | BD41 | 4.90 | 50 | 4021 | 9.38 | Blue | 457 |
| | 5 | BD57 | 5.01 | 50 | 4022 | 9.10 | Blue | 458 |
| Comparative | 1 | CE1 | 5.12 | 50 | 3863 | 7.73 | Blue | 465 |
| Example | 2 | CE2 | 5.01 | 50 | 2000 | 6.71 | Blue | 456 |

Structural formulae of CE1 and CE2 in Table 4 are as follows, respectively.

CE1

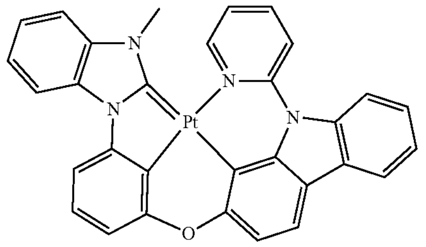

CE2

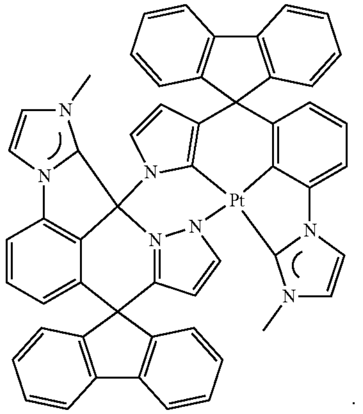

From Table 4, it may be confirmed that the light-emitting devices according to Examples were excellent or suitable in terms of the driving voltage (V), luminance (cd/m$^2$), luminescence efficiency (cd/A), and/or the like, as compared to the light-emitting devices of Comparative Examples 1 and 2.

As described above, according to the one or more embodiments, a light-emitting device having high luminescence efficiency and long lifespan and a high-quality electronic apparatus including the same may be manufactured by utilizing the organometallic compound described herein.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A light-emitting device comprising:

a first electrode;

a second electrode facing the first electrode;

an interlayer arranged between the first electrode and the second electrode and comprising an emission layer; and an organometallic compound represented by Formula 1:

Formula 1

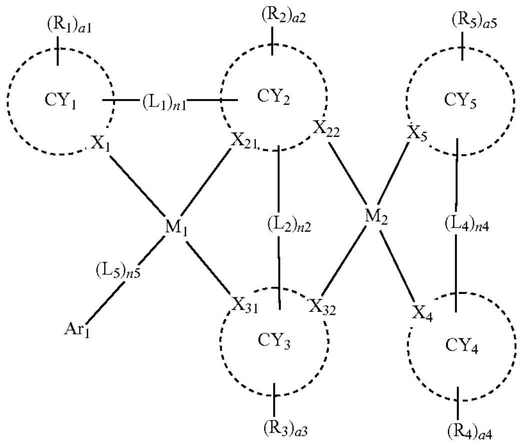

wherein $M_1$ and $M_2$ are each independently platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$ to ring $CY_5$ are each independently a $C_5$-$C_{30}$ carbocyclic group or a $C_1$-$C_{30}$ heterocyclic group, $X_1$, $X_{21}$, $X_{22}$, $X_{31}$, $X_{32}$, $X_4$, and $X_5$ are each independently C or N, $L_1$ to $L_5$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S(=O)—*', *—S(=O)$_2$—*', or *—Ge($R_{1a}$)($R_{1b}$)—*', and * and *' each indicate a binding site to a neighboring atom, n1 to n5 are each independently an integer from 1 to 5, $Ar_1$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$ to $R_5$, $R_{1a}$, and $R_{1b}$ are each independently hydrogen, deuterium, —F, —Cl, —Br, —I, a hydroxyl group, a cyano group, a nitro group, —SCN, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 to a5 are each independently an integer from 0 to 10, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, a $C_7$-$C_{60}$ aryl alkyl group, a $C_2$-$C_{60}$ heteroaryl alkyl group, or any combination thereof.

2. The light-emitting device of claim 1, wherein the first electrode is an anode, the second electrode is a cathode, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, an electron control layer, or any combination thereof.

3. The light-emitting device of claim 1, wherein the interlayer comprises a first compound represented by Formula 1 and a second compound comprising a group represented by Formula 2:

Formula 2

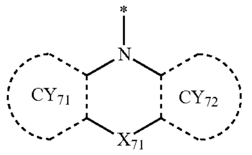

wherein, in Formula 2, ring $CY_{71}$ and ring $CY_{72}$ are each independently a π electron-rich $C_3$-$C_{60}$ cyclic group or a pyridine group, $X_{71}$ is a single bond, or a linking group comprising O, S, N, B, C, Si, or any combination thereof, and

* indicates a binding site to a neighboring atom in the second compound.

4. The light-emitting device of claim 3, wherein the second compound comprises a pyridine group, a pyrimidine group, a pyrazine group, a pyridazine group, a triazine group, or any combination thereof.

5. The light-emitting device of claim 3, wherein an amount of the first compound is 0.01 wt % to 15 wt %, based on 100 wt % of the second compound.

6. The light-emitting device of claim 1, wherein the emission layer is configured to emit light having a maximum emission wavelength of 430 nm to 480 nm.

7. An electronic apparatus comprising the light-emitting device of claim 1.

8. The electronic apparatus of claim 7, further comprising a thin-film transistor, wherein the thin-film transistor comprises a source electrode and a drain electrode, and the first electrode of the light-emitting device is electrically connected to either the source electrode or the drain electrode of the thin-film transistor.

9. The electronic apparatus of claim 7, further comprising a color filter, a color conversion layer, a touch screen layer, a polarizing layer, or any combination thereof.

10. An organometallic compound represented by Formula 1:

Formula 1

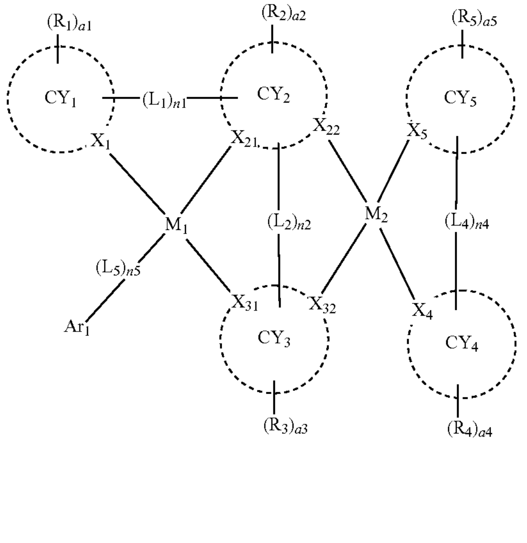

wherein $M_1$ and $M_2$ are each independently platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$ to ring $CY_5$ are each independently a $C_5$-$C_{30}$ carbocyclic group or a $C_1$-$C_{30}$ heterocyclic group, $X_1$, $X_{21}$, $X_{22}$, $X_{31}$, $X_{32}$, $X_4$, and $X_5$ are each independently C or N, $L_1$ to $L_5$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' each indicate a binding site to a neighboring atom, n1 to n5 are each independently an integer from 1 to 5, $Ar_1$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$ to $R_5$, $R_{1a}$, and $R_{1b}$ are each independently hydrogen, deuterium, —F, —Cl, —Br, —I, a hydroxyl group, a cyano group, a nitro group, —SCN, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a5 are each independently an integer from 0 to 10, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, a $C_7$-$C_{60}$ aryl alkyl group, a $C_2$-$C_{60}$ heteroaryl alkyl group, or any combination thereof.

11. The organometallic compound of claim 10, wherein $M_1$ and $M_2$ are identical to each other.

12. The organometallic compound of claim 10, wherein $M_1$ and $M_2$ are different from each other.

13. The organometallic compound of claim 10, wherein ring $CY_1$ to ring $CY_4$ are each a 6-membered ring, and ring $CY_5$ is a 5-membered ring.

14. The organometallic compound of claim 10, wherein ring $CY_1$ to ring $CY_4$ are each independently:

a benzene group, a pyridine group, a pyrimidine group, a pyrazine group, a pyridazine group, or a triazine group; or a benzene group, a pyridine group, a pyrimidine group, a pyrazine group, a pyridazine group, or a triazine group, each condensed with a benzene group, a pyridine group, a pyrimidine group, a pyrazine group, a pyridazine group, a cyclohexane group, a cyclohexene group, an adamantane group, a norbornane group, a cyclopentane group, a cyclopentene group, a pyrrole group, a pyrazole group, an imidazole group, a triazole group, an oxazole group, an isoxazole group, an oxadiazole group, a thiazole group, an isothiazole group, a thiadiazole group, or any combination thereof.

15. The organometallic compound of claim 10, wherein ring $CY_5$ is:

a pyrrole group, a pyrazole group, an imidazole group, a triazole group, an oxazole group, an isoxazole group, an oxadiazole group, a thiazole group, an isothiazole group, or a thiadiazole group; or a pyrrole group, a pyrazole group, an imidazole group, a triazole group, an oxazole group, an isoxazole group, an oxadiazole group, a thiazole group, an isothiazole group, or a thiadiazole group, each condensed with a benzene group, a pyridine group, a pyrimidine group, a pyrazine group, a pyridazine group, a cyclopentane group, a cyclopentene group, a pyrrole group, a pyrazole group, an imidazole group, a triazole group, an oxazole group, an isoxazole group, an oxadiazole group, a thiazole group, an isothiazole group, a thiadiazole group, or any combination thereof.

16. The organometallic compound of claim 10, wherein $X_5$ is C, and a bond between $X_5$ and $M_2$ is a coordinate bond.

17. The organometallic compound of claim 10, wherein $L_5$ is *—C≡C—*', and n5 is 1.

18. The organometallic compound of claim 10, wherein at least one of Conditions 1 to 5 is satisfied:
Condition 1
a group represented by
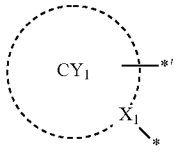
in Formula 1 is represented by one of Formulae CY1-1 to CY1-24:
CY1-1
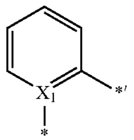
CY1-2
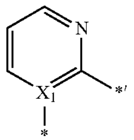
CY1-3
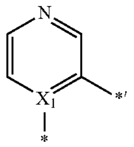
CY1-4
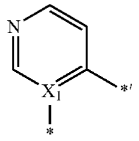
CY1-5
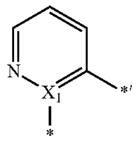
CY1-6
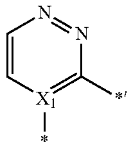
CY1-7
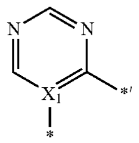
CY1-8
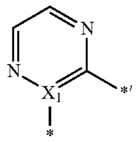
-continued
CY1-9
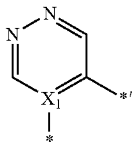
CY1-10
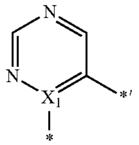
CY1-11
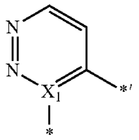
CY1-12
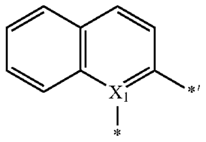
CY1-13
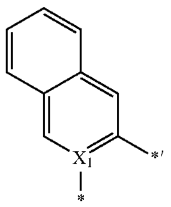
CY1-14
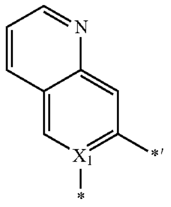
CY1-15
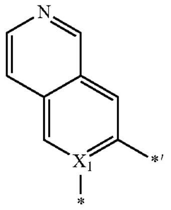
CY1-16
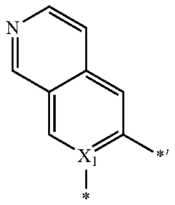

-continued
CY1-17
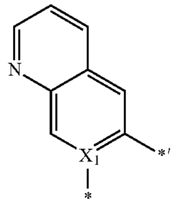
CY1-18
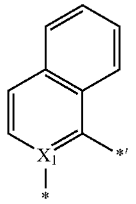
CY1-19
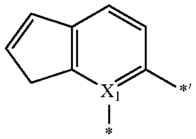
CY1-20
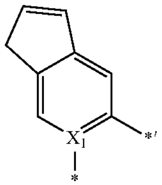
CY1-21
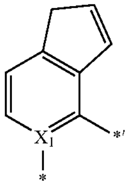
CY1-22
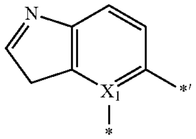
CY1-23
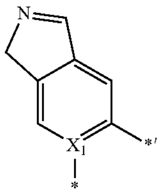
CY1-24
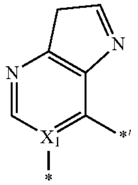
wherein, in Formulae CY1-1 to CY1-24,
$X_1$ is the same as described in Formula 1,
* is a binding site to $M_1$, and
*' is a binding site to $L_1$;
Condition 2
a group represented by
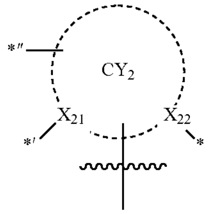
in Formula 1 is represented by one of Formulae CY2-1 to CY2-12:
CY2-1
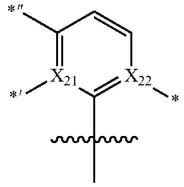
CY2-2
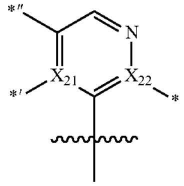
CY2-3
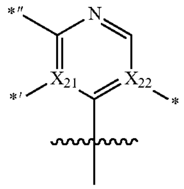
CY2-4
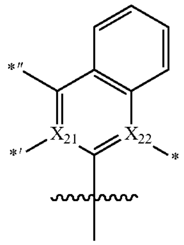
CY2-5
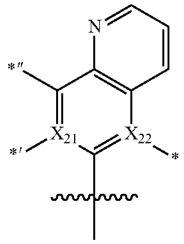

-continued

CY2-6

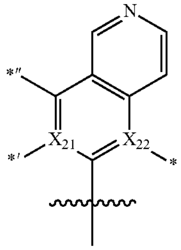

CY2-7

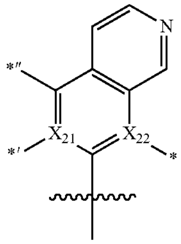

CY2-8

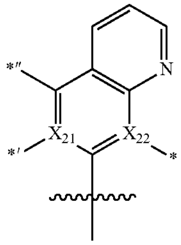

CY2-9

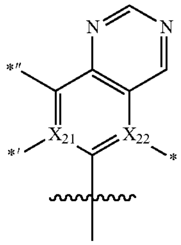

CY2-10

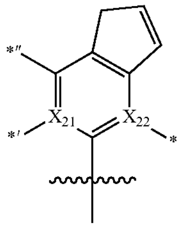

CY2-11

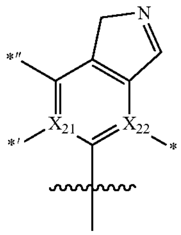

-continued

CY2-12

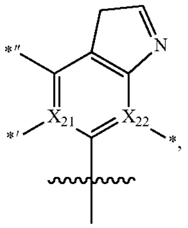

wherein, in Formulae CY2-1 to CY2-12, $X_{21}$ and $X_{22}$ are respectively the same as those described in Formula 1,

* indicates a binding site to $M_2$,

*' indicates a binding site to $M_1$,

*" indicates a binding site to $L_1$, and

∿∿∿ indicates a binding site to $L_2$;

Condition 3 a group represented by

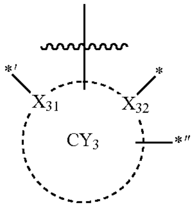

in Formula 1 is represented by one of Formulae CY3-1 to CY3-12:

CY3-1

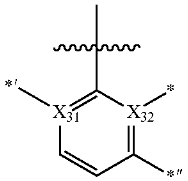

CY3-2

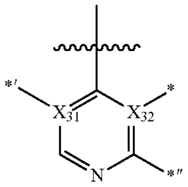

CY3-3

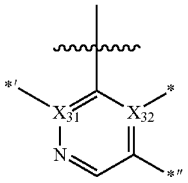

-continued

CY3-4

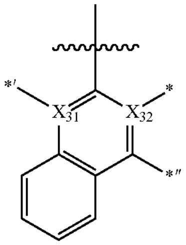

CY3-5

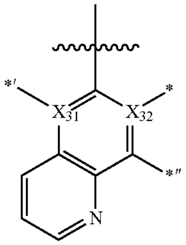

CY3-6

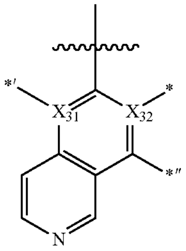

CY3-7

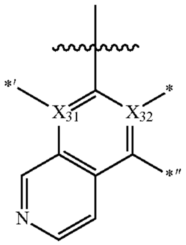

CY3-8

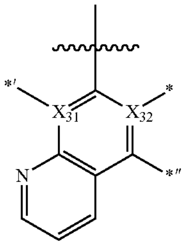

CY3-9

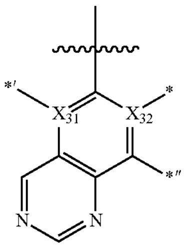

-continued

CY3-10

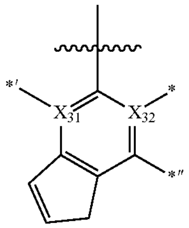

CY3-11

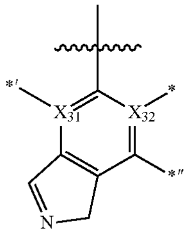

CY3-12

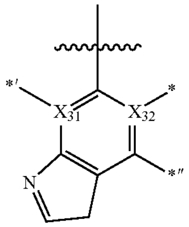

wherein, in Formulae CY3-1 to CY3-12, $X_{31}$ and $X_{32}$ are respectively the same as those described in Formula 1,

* indicates a binding site to $M_2$,

*' indicates a binding site to $M_1$,

*" indicates a binding site to $L_3$, and

∿∿∿ indicates a binding site to $L_2$;

Condition 4 a group represented by

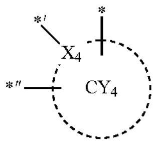

in Formula 1 is represented by one of Formulae CY4-1 to CY4-16:

CY4-1

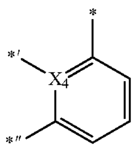

CY4-2

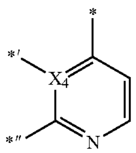

-continued
CY4-3
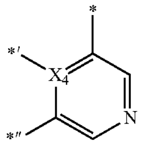
CY4-4
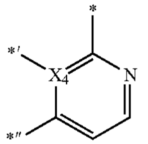
CY4-5
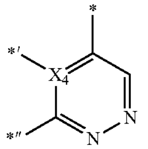
CY4-6
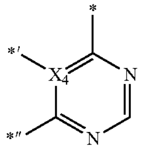
CY4-7
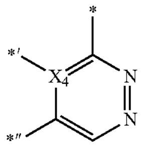
CY4-8
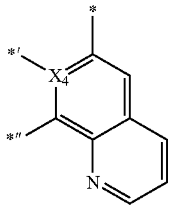
CY4-9
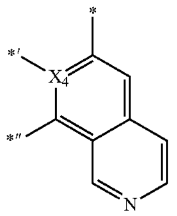
CY4-10
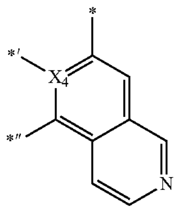
-continued
CY4-11
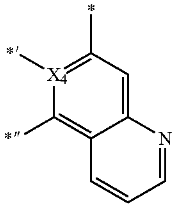
CY4-12
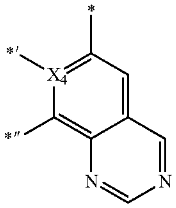
CY4-13
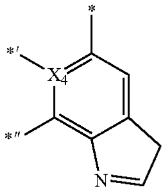
CY4-14
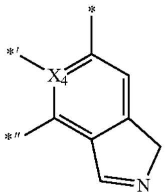
CY4-15
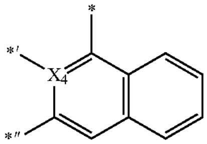
CY4-16
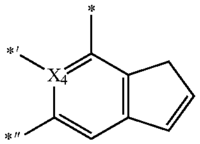
wherein, in Formulae CY4-1 to CY4-16,
$X_4$ is the same as described in Formula 1,
* indicates a binding site to $L_4$,
*' indicates a binding site to $M_2$, and
*" indicates a binding site to $L_3$; and
Condition 5
a group represented by
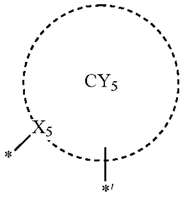

in Formula 1 is represented by one of Formulae CY5-1 to CY5-22:
CY5-1
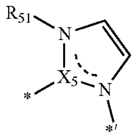
CY5-2
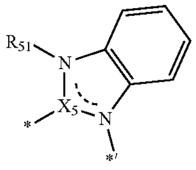
CY5-3
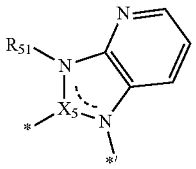
CY5-4
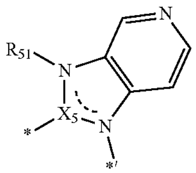
CY5-5
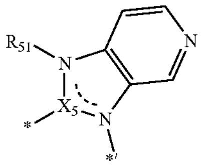
CY5-6
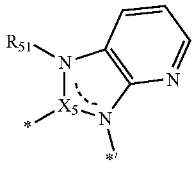
CY5-7
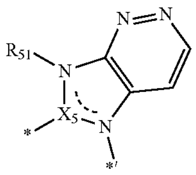
CY5-8
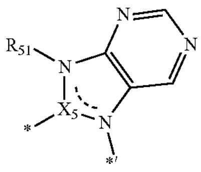
-continued
CY5-9
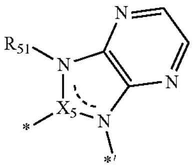
CY5-10
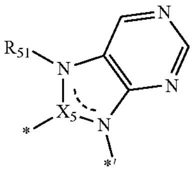
CY5-11
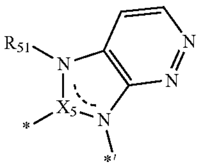
CY5-12
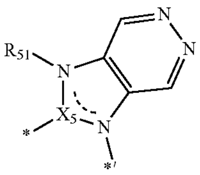
CY5-13
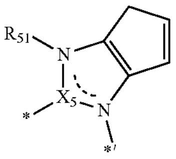
CY5-14
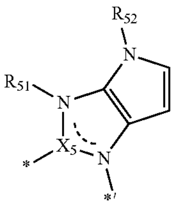
CY5-15
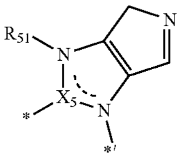
CY5-16
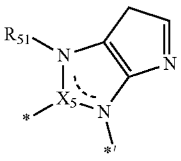
CY5-17
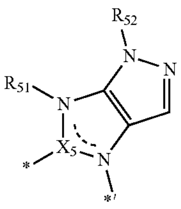

-continued

CY5-18

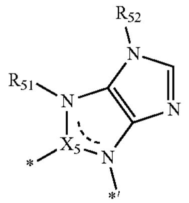

CY5-19

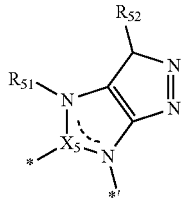

CY5-20

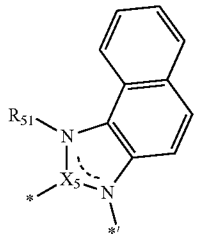

CY5-21

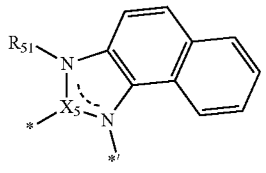

CY5-22

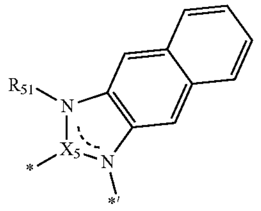

wherein, in Formulae CY5-1 to CY5-22, $X_5$ is the same as described in Formula 1, $R_{51}$ and $R_{52}$ are the same as $R_5$ described in Formula 1,

* indicates a binding site to $M_2$, and

*' indicates a binding site to $L_4$.

19. The organometallic compound of claim 10, wherein the organometallic compound is represented by Formula 1-1:

Formula 1-1

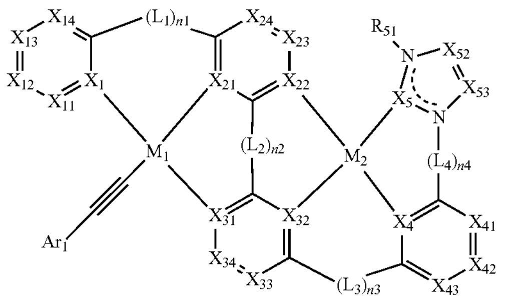

wherein, in Formula 1-1, $M_1$, $M_2$, $X_1$, $X_{21}$, $X_{22}$, $X_{31}$, $X_{32}$, $X_4$, $X_5$, $L_1$ to $L_4$, and $Ar_1$ are respectively the same as those described in Formula 1, $X_{11}$ is $C(R_{11})$ or N, $X_{12}$ is $C(R_{12})$ or N, $X_{13}$ is $C(R_{13})$ or N, and $X_{14}$ is $C(R_{14})$ or N, $R_{11}$ to $R_{14}$ are respectively the same as described in connection with $R_1$ in Formula 1, and two or more of $R_{11}$ to $R_{14}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{23}$ is $C(R_{23})$ or N, and $X_{24}$ is $C(R_{24})$ or N, $R_{23}$ and $R_{24}$ are respectively the same as described in connection with $R_2$ in Formula 1, and $R_{23}$ and $R_{24}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{33}$ is $C(R_{33})$ or N, and $X_{34}$ is $C(R_{34})$ or N, $R_{33}$ and $R_{34}$ are respectively the same as described in connection with $R_3$ in Formula 1, and $R_{33}$ and $R_{34}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{41}$ is $C(R_{41})$ or N, $X_{42}$ is $C(R_{42})$ or N, and $X_{43}$ is $C(R_{43})$ or N, $R_{41}$ to $R_{43}$ are respectively the same as described in connection with $R_4$ in Formula 1, and two or more of $R_{41}$ to $R_{43}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{52}$ is $C(R_{52})$ or N, and $X_{53}$ is $C(R_{53})$ or N, and $R_{51}$ to $R_{53}$ are respectively the same as described in connection with $R_5$ in Formula 1, and two or more of $R_{51}$ to $R_{53}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

20. The organometallic compound of claim 10, wherein a triplet metal-to-ligand charge transfer state ($^3$MLCT) value is 14% or more.

* * * * *